(12) United States Patent
Hatakeyama et al.

(10) Patent No.: US 9,017,922 B2
(45) Date of Patent: Apr. 28, 2015

(54) CHEMICALLY AMPLIFIED RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masayoshi Sagehashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/022,287

(22) Filed: Sep. 10, 2013

(65) Prior Publication Data

US 2014/0080055 A1    Mar. 20, 2014

(30) Foreign Application Priority Data

Sep. 14, 2012 (JP) ................................. 2012-202328

(51) Int. Cl.
  *G03F 7/004*   (2006.01)
  *C07C 229/00*  (2006.01)
  *G03F 7/038*   (2006.01)
  *G03F 7/039*   (2006.01)
  *G03F 7/20*    (2006.01)

(52) U.S. Cl.
  CPC .............. *G03F 7/0382* (2013.01); *G03F 7/038* (2013.01); *G03F 7/039* (2013.01); *G03F 7/0397* (2013.01); *G03F 7/20* (2013.01); *Y10S 430/128* (2013.01)

(58) Field of Classification Search
  USPC ........... 430/270.1, 927, 322, 325; 560/43, 44; 548/486
  See application file for complete search history.

(56) References Cited

U.S. PATENT DOCUMENTS

| | | |
|---|---|---|
| 6,448,420 B1 | 9/2002 | Kinsho et al. |
| 6,673,511 B1 | 1/2004 | Hatakeyama et al. |
| 6,749,988 B2 | 6/2004 | Hatakeyama et al. |
| 6,916,593 B2 | 7/2005 | Hatakeyama et al. |
| 7,537,880 B2 | 5/2009 | Harada et al. |
| 7,598,016 B2 | 10/2009 | Kobayashi et al. |
| 2006/0147836 A1* | 7/2006 | Hatakeyama et al. ..... 430/270.1 |
| 2008/0090172 A1 | 4/2008 | Hatakeyama et al. |
| 2008/0096134 A1* | 4/2008 | Sugimoto et al. .......... 430/287.1 |
| 2008/0102407 A1* | 5/2008 | Ohsawa et al. ............ 430/286.1 |
| 2008/0124656 A1* | 5/2008 | Kobayashi et al. ........ 430/286.1 |
| 2008/0153030 A1 | 6/2008 | Kobayashi et al. |
| 2009/0269969 A1* | 10/2009 | Siev et al. ..................... 439/404 |
| 2010/0008735 A1* | 1/2010 | Dudzinsky et al. ............ 407/48 |
| 2010/0183975 A1* | 7/2010 | Takahashi et al. .......... 430/270.1 |
| 2011/0053082 A1* | 3/2011 | Ichikawa et al. ........... 430/270.1 |
| 2011/0177462 A1 | 7/2011 | Hatakeyama et al. |
| 2012/0141938 A1* | 6/2012 | Hatakeyama et al. ..... 430/283.1 |

FOREIGN PATENT DOCUMENTS

| | | | |
|---|---|---|---|
| JP | 2001-194776 A | | 7/2001 |
| JP | 2002-226470 A | | 8/2002 |
| JP | 2002-363148 A | | 12/2002 |
| JP | 2005-084365 A | | 3/2005 |
| JP | 3790649 B2 | | 6/2006 |
| JP | 2006-178317 A | | 7/2006 |
| JP | 2008083234 A | * | 4/2008 |
| JP | 2011-170316 A | | 9/2011 |
| JP | 2012-137729 A | | 7/2012 |

OTHER PUBLICATIONS

Machine translation of JP 2008-083234 (no date).*
Hinsberg, William, et al., "Extendibility of Chemically Amplified Resists: Another Brick Wall?", Proceedings of SPIE, 2003, vol. 5039, pp. 1-14.
Kishikawa, Yasuhiro, et al., "Assesment of trade-off between resist resolution and sensitivity for optimization of hyper-NA immersion lithography", Proc. of SPIE, 2007, vol. 6520, pp. 65203L-1-65203L-9.
Wang, CW, et al., "Photobase generator and photo decomposable quencher for high-resolution photoresist applications", Proc. of SPIE, 2010, vol. 7639, pp. 76390W-1-76390W-15.
Owe-Yang, D.C., et al., "Double exposure for the contact layer of th 65-nm node", Proceedings of SPIE, 2005, vol. 5753, pp. 171-180.

* cited by examiner

*Primary Examiner* — Amanda C. Walke
(74) *Attorney, Agent, or Firm* — Westerman, Hattori, Daniels & Adrian, LLP

(57) ABSTRACT

A chemically amplified resist composition comprising a base polymer and an amine quencher in the form of a β-alanine, γ-aminobutyric acid, 5-aminovaleric acid, 6-aminocaproic acid, 7-aminoheptanoic acid. 8-aminooctanoic acid or 9-aminononanoic acid derivative having an unsubstituted carboxyl group has a high contrast of alkaline dissolution in rate before and after exposure and forms a pattern of good profile at a high resolution, minimal roughness and wide DOF.

13 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. §119(a) on Patent Application No. 2012-202328 filed in Japan on Sep. 14, 2012, the entire contents of which are hereby incorporated by reference.

TECHNICAL FIELD

This invention relates to a chemically amplified resist composition comprising a specific basic compound, and more particularly, to a chemically amplified positive or negative resist composition suited for use in the photolithography with KrF excimer laser, ArF excimer laser, ER or EUV radiation, and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the future generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

With respect to high-energy radiation of very short wavelength such as EB or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of in greater interest. Reduction projection exposure systems or steppers have been used since the time when the exposure light was g-line. While their demagnification factor was ⅕, a factor of ¼ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of ¼ and a MEEF of 4, the mask manufacture needs an accuracy substantially equivalent to that for equi-magnification masks.

The exposure system for mask manufacturing made a transition from the laser beam exposure system to the BB exposure system to increase the accuracy of line width. Since a further size reduction becomes possible by increasing the accelerating voltage of the electron gun in the EB exposure system, the accelerating voltage increased from 10 keV to 30 keV and reached 50 key in the current mainstream system, with a voltage of 100 keV being under investigation.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein crosslinking reaction takes place under the action of acid. Quenchers are often added to these resist compositions for the purpose of controlling the diffusion of the acid to unexposed areas to improve the contrast. The addition of quenchers is fully effective to this purpose. A number of amine quenchers were proposed as disclosed in Patent Documents 1 to 3.

As the pattern feature size is reduced, approaching to the diffraction limit of light, light contrast lowers. In the case of positive resist film, a lowering of light contrast leads to reductions of resolution and focus margin of hole and trench patterns.

For mitigating the influence of reduced resolution of resist pattern due to a lowering of light contrast, an attempt is made to enhance the dissolution contrast of resist film. One such attempt is a chemically amplified resist material utilizing an acid amplifying mechanism that a compound is decomposed with an acid to generate another acid. In general, the concentration of acid creeps up linearly with an increase of exposure dose. In the case of the acid amplifying mechanism, the concentration of acid jumps up non-linearly as the exposure dose increases. The acid amplifying system is beneficial for further enhancing the advantages of chemically amplified resist film including high contrast and high sensitivity, but worsens the drawbacks of chemically amplified resist film that environmental resistance is degraded by amine contamination and maximum resolution is reduced by an increase of acid diffusion distance. The acid amplifying system is very difficult to control when implemented in practice.

Another approach for enhanced contrast is by reducing the concentration of amine with an increasing exposure dose. This may be achieved by applying a compound which loses the function of quencher upon light exposure.

With respect to the acid labile group used in methacrylate polymers for the ArF lithography, deprotection reaction takes place when a photoacid generator capable of generating a sulfonic acid having fluorine substituted at α-position (referred to "α-fluorinated sulfonic acid") is used but not when an acid generator capable of generating a sulfonic acid not having fluorine substituted at α-position (referred to "α-non-fluorinated sulfonic acid") or carboxylic acid is used. If a sulfonium or iodonium salt capable of generating an α-fluorinated sulfonic acid is combined with a sulfonium or iodonium salt capable of generating an α-non-fluorinated sulfonic acid, the sulfonium or iodonium salt capable of generating an α-non-fluorinated sulfonic acid undergoes ion exchange with the α-fluorinated sulfonic acid. Through the ion exchange, the α-fluorinated sulfonic acid thus generated by light exposure is converted back to the sulfonium or iodonium salt while the sulfonium or iodonium salt of an α-non-fluorinated sulfonic acid or carboxylic acid functions as a quencher.

Further, the sulfonium or iodonium salt capable of generating an α-non-fluorinated sulfonic acid also functions as a photodegradable quencher since it loses the quencher function by photodegradation.

Non-Patent Document 3 points out that the addition of a photodegradable quencher expands the margin of a trench pattern although the structural formula is not illustrated.

However, it has only a little influence on performance improvement. There is a desire to have a quencher for further improving contrast.

Patent Document 4 discloses an amine quencher which reduces its basicity through a mechanism that an acid labile group is eliminated under the action of acid, and lactam is then formed. Due to the mechanism that basicity is reduced under the action of acid, acid diffusion is controlled by high basicity in the unexposed region where the amount of acid generated is minimal, whereas acid diffusion is promoted due to reduced basicity of the quencher in the overexposed region where the amount of acid generated is large. This expands the difference in acid amount between the exposed and unexposed regions, from which an improvement in contrast is expected. However, the contrast enhancing effect is low since deprotection reaction of the base polymer and deprotection reaction of the quencher and ensuing lactam-forming reaction take place simultaneously in parallel. If the deprotection reaction of the quencher is slower than the deprotection reaction of the base polymer, the contrast enhancing effect is lower. There is a desire to have a quencher capable of further contrast improvement.

CITATION LIST

Patent Document 1: JP-A 2001-194776
Patent Document 2: JP-A 2002-226470
Patent Document 3: JP-A 2002-363148
Patent Document 4: JP-A 2012-137729 (US 20120141938)
Non-Patent Document 1: SPIE Vol. 5039 p1 (2003)
Non-Patent Document 2: SPIE Vol. 6520 p65203L-1 (2007)
Non-Patent Document 3: SPIE Vol. 7639 p76390W (2010)

DISCLOSURE OF INVENTION

An object of the invention is to provide a positive or negative resist composition, typically a chemically amplified positive or negative resist composition, which exhibits a high contrast surpassing prior art positive resist compositions, and offers a wide resolution margin for hole and trench patterns in the case of positive composition, and a high resolution for isolated line patterns in the case of negative composition; and a pattern forming process using the same.

Seeking for the currently demanded high-resolution resist, the inventors have found that a chemically amplified positive or negative resist composition comprising a basic compound represented by the following formula (1) (a β-alanine, γ-aminobutyric acid, 5-aminovaleric acid, 6-aminocaproic acid, 7-aminoheptanoic acid, 8-aminooctanoic acid or 9-aminononanoic acid derivative) as amine quencher and an acid generator exhibits a high contrast, a high resolution and rectangularity of a pattern as developed, and offers a high resolution and a wide focus margin for hole and trench patterns in the case of positive composition, and a high resolution for isolated line patterns in the case of negative composition.

While JP-A 2012-137729 cited above discloses a β-alanine, γ-aminobutyric acid or 5-aminovaleric acid derivative having an acid labile group-substituted carboxyl group, the inventors have found that a basic compound of formula (1) (a β-alanine, γ-aminobutyric acid, 5-aminovaleric acid, 6-aminocaproic acid, 7-aminoheptanoic acid, 8-aminooctanoic acid or 9-aminononanoic acid derivative) is fully effective for suppressing acid diffusion and improving contrast in a chemically amplified resist composition to which an acid generator is added.

The chemically amplified positive or negative resist composition has many advantages including a high dissolution contrast of resist film, and a wide resolution margin for hole and trench patterns in the case of positive composition, and a high resolution for isolated line patterns in the case of negative composition. Owing to these advantages, the composition is readily applicable in the industry and very useful as the VLSI-forming resist material and mask pattern-forming material.

In one aspect, the invention provides a chemically amplified resist composition comprising a base polymer and a basic compound of the general formula (1).

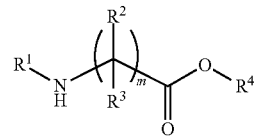

(1)

Herein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkynyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O=N moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring; $R^4$ is hydrogen or a straight, branched or cyclic $C_4$-$C_{10}$ alkyl group to form a primary or secondary ester group, the alkyl group being optionally substituted with fluorine; and m is an integer of 2 to 8.

In a preferred embodiment, the base polymer comprises recurring units (a1) derived from (meth)acrylate, styrenecarboxylic acid or vinylnaphthalenecarboxylic acid having an acid labile group substituted thereon, or recurring units (a2) derived from hydroxystyrene having an acid labile group substituted thereon, as represented by the general formula (2).

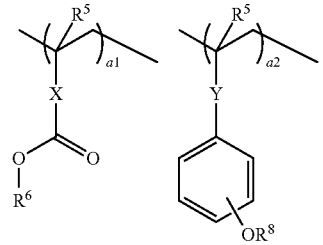

(2)

Herein $R^5$ and $R^7$ are each independently hydrogen or methyl. X is a single bond, a $C_1$-$C_{12}$ linking group having an ester moiety and/or lactone ring, phenylene group or naphthylene group, Y is a single bond or ester group, and $R^6$ and $R^8$ are each independently an acid labile group. The resist composition further comprises an organic solvent and is a chemically amplified positive resist composition.

The resist composition may further comprise a dissolution inhibitor.

In another embodiment, the resist composition further comprises an organic solvent and is a chemically amplified negative resist composition. Often, the resist composition further comprises a crosslinker.

In either embodiment, the resist composition may further comprise an acid generator.

In a more preferred embodiment, the base polymer has further copolymerized therein recurring units of at least one type selected from sulfonium salt units (f1) to (f3), as represented by the general formula (3).

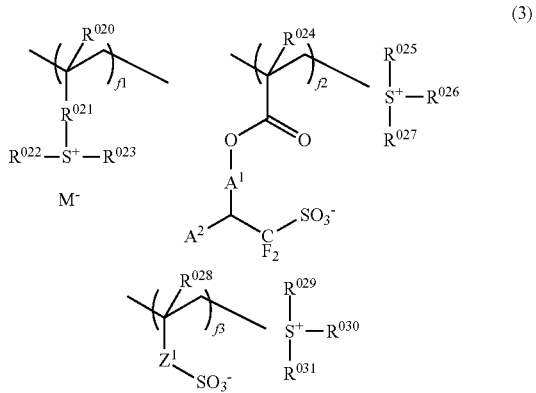

Herein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, $M^-$ is a non-nucleophilic counter ion, subscripts f1, f2 and f3 are numbers in the range: 0≤f1≤0.3, 0≤f2≤0.3, 0≤f3≤0.3, and 0<f1+f2+f3≤0.3.

In either embodiment, the resist composition may further comprise a surfactant.

In another aspect, the invention provides a process for forming a pattern comprising the steps of applying the resist composition defined above onto a substrate, baking to form a resist film, exposing the resist film to high-energy radiation, and developing the exposed film with a developer.

Typically, the high-energy radiation is ArF excimer laser radiation of 193 nm wavelength, KrF excimer laser radiation of 248 nm wavelength, EB or EUV of 3 to 15 nm wavelength.

The chemically amplified positive or negative resist compositions are used not only in the lithography for semiconductor circuit formation, but also in the formation of mask circuit patterns, micro-machine and thin-film magnetic head circuits.

ADVANTAGEOUS EFFECTS OF INVENTIONS

The resist compositions have many advantages including a high contrast of alkaline dissolution rate before and after exposure, a high resolution, a good pattern profile after exposure, minimized roughness, and a wide focus margin (DOF) and exposure margin. There are provided positive or negative resist compositions, especially chemically amplified positive or negative resist compositions which are very useful as the fine pattern-forming resist material for the fabrication of VLSI and photomasks, and the pattern-forming resist material in the KrF excimer laser, ArF excimer laser, EB and EUV lithography.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation ($C_n$-$C_m$) means a group containing from n to m carbon atoms per group. The term "(meth)acrylate" refers collectively to acrylate and methacrylate.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator
EB: electron beam
EUV: extreme ultraviolet
LWR: line width roughness
LER: line edge roughness
DOF: depth of focus The basic compound according to the present invention is a β-alanine, γ-aminobutyric acid, 5-aminovaleric acid, 6-aminocaproic acid, 7-aminoheptanoic acid, 8-aminooctanoic acid or 9-aminononanoic acid derivative represented by the general formula (1).

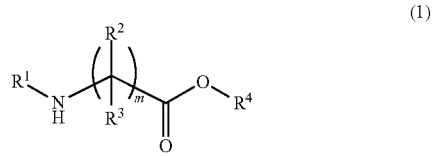

Herein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkynyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O—N= moiety, or $R^1$ may be an acid labile group. R is hydrogen, mercapto, hydroxyl or $C_1$-$C_3$ alkyl, or may bond with the nitrogen atom in formula (1) to form a ring. $R^2$ and $R^3$ each are hydrogen, a straight or branched $C_1$-$C_4$ alkyl group or $C_2$-$C_4$ alkenyl group, or $R^2$ and $R^3$ may bond together to form a ring. $R^4$ is hydrogen or a straight, branched or cyclic $C_4$-$C_{10}$ alkyl group to form a primary or secondary ester group, the alkyl group being optionally substituted with fluorine; and m is an integer of 2 to 8.

As pointed out above, the contrast enhancing effect of a photodegradable base (PDB) or quencher has been reported. As the quencher in the exposed region is decreased, the concentration of acid in the exposed region is relatively increased, whereby the contrast is improved. In this case, however, acid diffusion in the exposed region is increased at the same time, leaving concerns about concomitant drops of LWR and critical dimension uniformity (CDU) of hole patterns.

Gamma-aminobutyric acid (GABA) is one of neurotransmitters. It is recently expected that the addition of GABA to food is effective for reducing blood pressure elevation (hypertension) and preventing obesity.

As illustrated by the reaction schemes below, the β-alanine, γ-aminobutyric acid or 5-aminovaleric acid derivative having an unsubstituted carboxyl group undergoes intramolecular dehydrating condensation reaction in the presence of an acid, to form a lactam, for example, the 5-aminovaleric acid forming δ-lactam. Due to the presence of an electron-attractive carbonyl group adjacent the nitrogen atom, the lactam is extremely low basic and has a low quencher function. This suggests that the β-alanine, γ-aminobutyric acid or 5-aminovaleric acid derivative has a sufficient basicity to function as a quencher in a region where less acid is generated due to a low exposure dose, but loses the basicity due to lactam formation in a region where more acid is generated, indicating a relatively increased concentration of active acid. This leads to an improved contrast in the more acid generated region, improving the resolution, exposure margin and DOF margin for trench and hole patterns, the LWR of lines, and the CD uniformity of holes. The effect of improved contrast in the more acid generated region is the same as achieved by the addition of an acid amplifier. The addition of an acid amplifier, however, leads to an abrupt increase of acid diffusion to degrade resolution and sometimes makes it difficult to control acid diffusion. In contrast, the use of the amine compound according to the invention ensures to fully control acid diffusion in the exposed region although its basicity is reduced by acid, because the base is not fully consumed. On the other hand, PDB has the advantage that contrast is improved because the quencher in the exposed region is consumed via photodegradation, but the drawback that acid diffusion in the exposed region is uncontrollable. The resist composition having the inventive amine compound added thereto has the advantages of a high contrast and fully controlled acid diffusion.

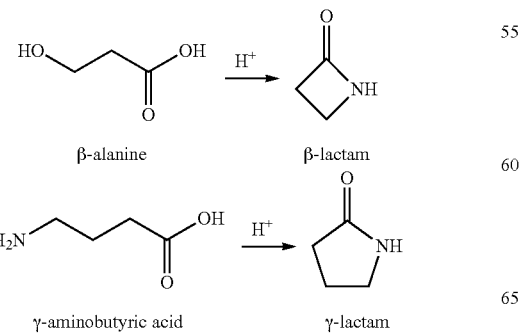

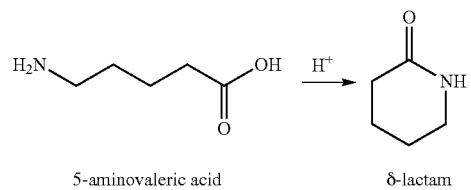

Examples of $R^2$, $R^3$ and m in formula (1) are illustrated below by the overall structure of the compound of formula (1). Herein $R^1$ and $R^4$ are as defined above, and D stands for deuterium.

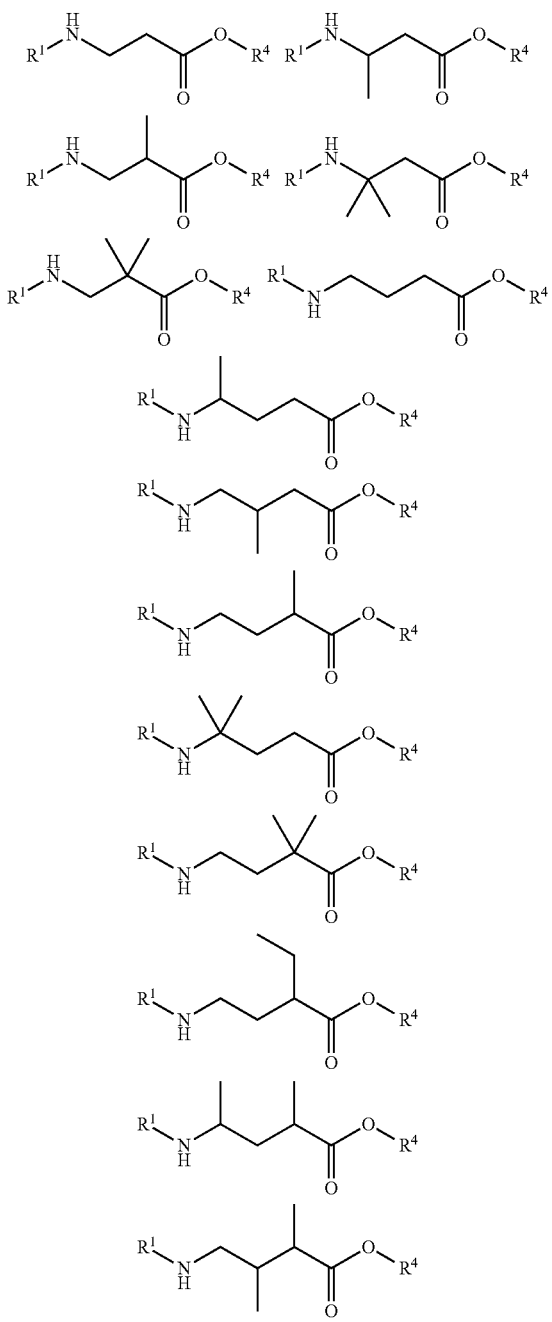

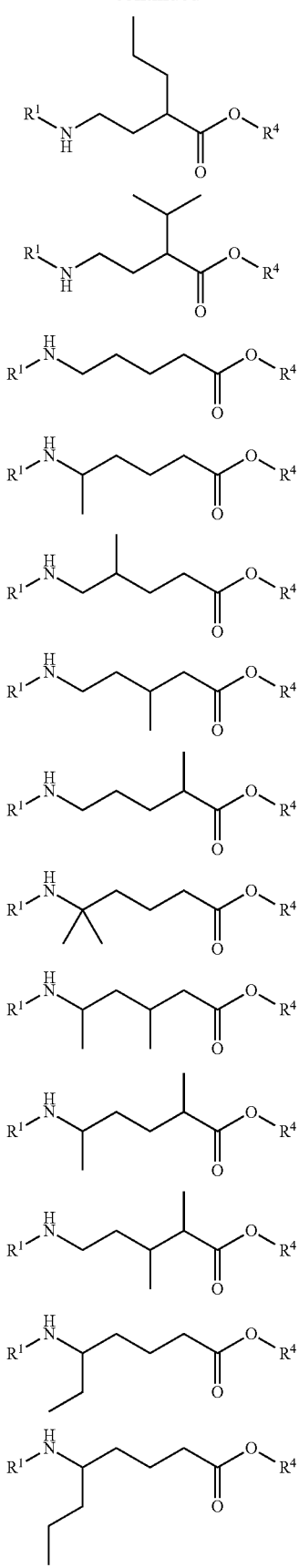
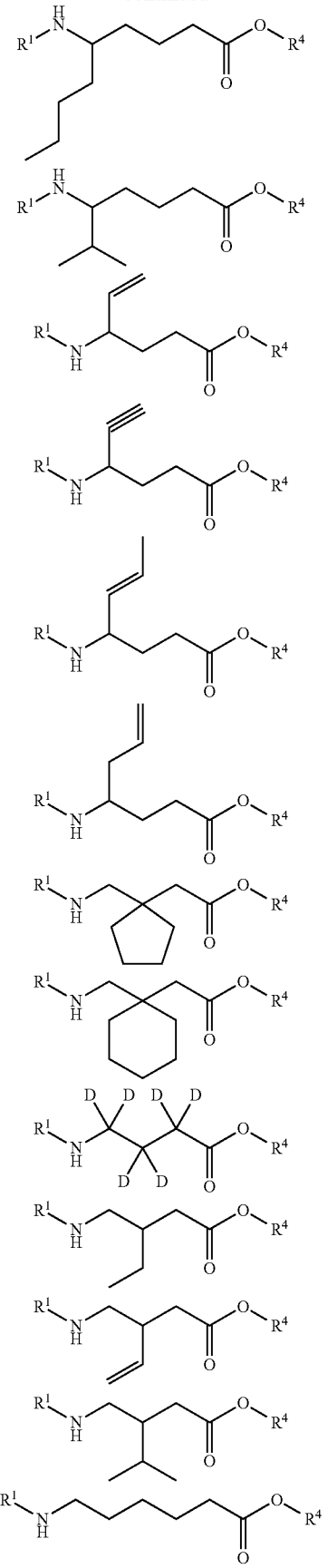

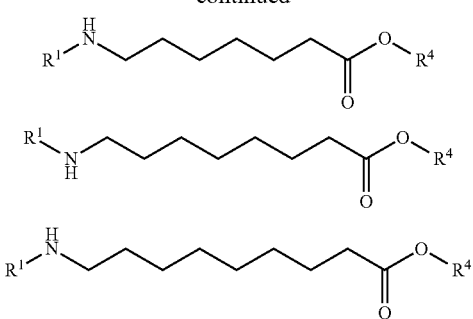
Examples of $R^1$ in formula (1) are illustrated below by the overall structure of the compound of formula (1). Herein $R^2$, $R^3$, $R^4$, and m are as defined above.
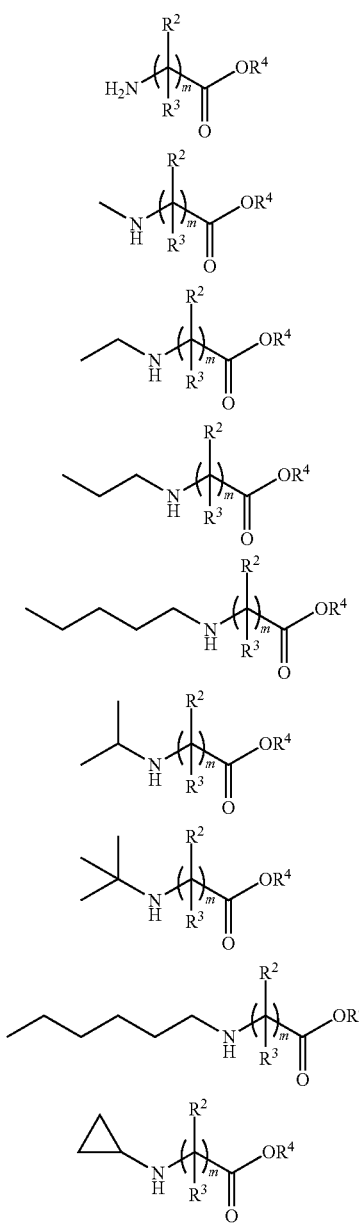
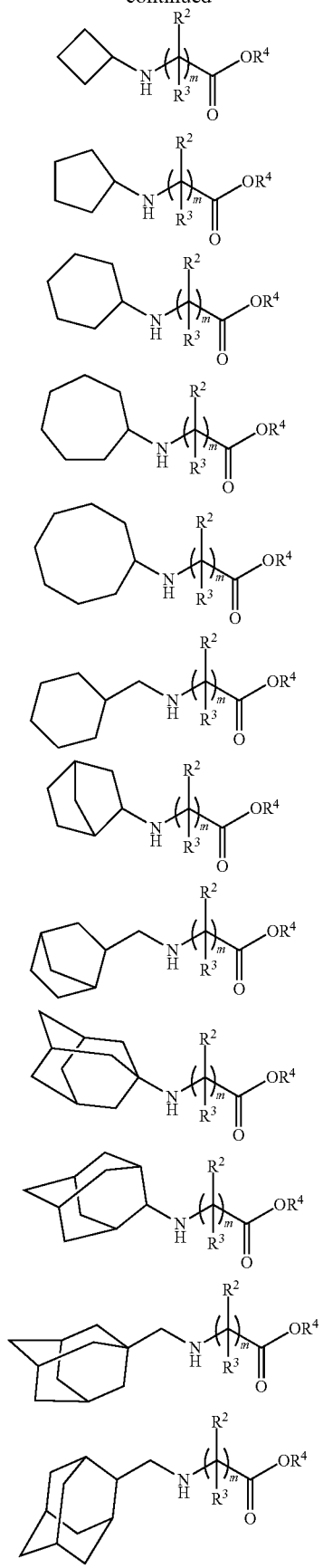

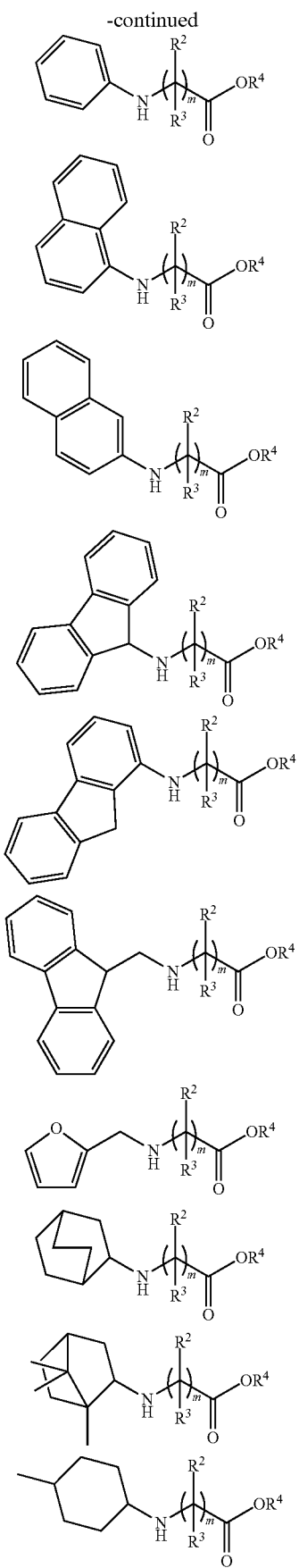

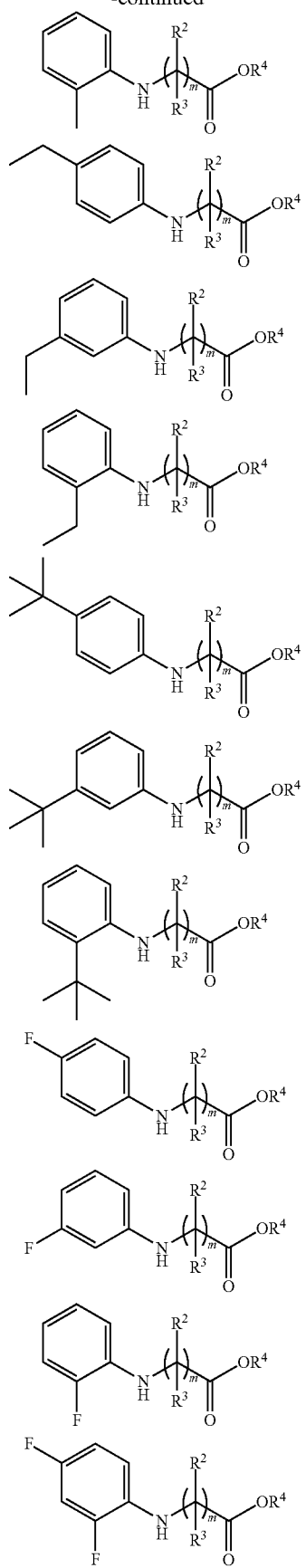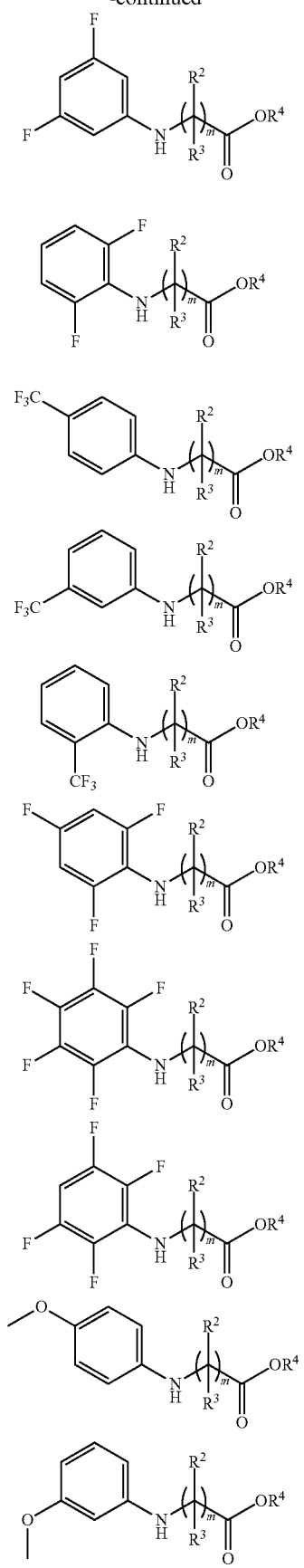

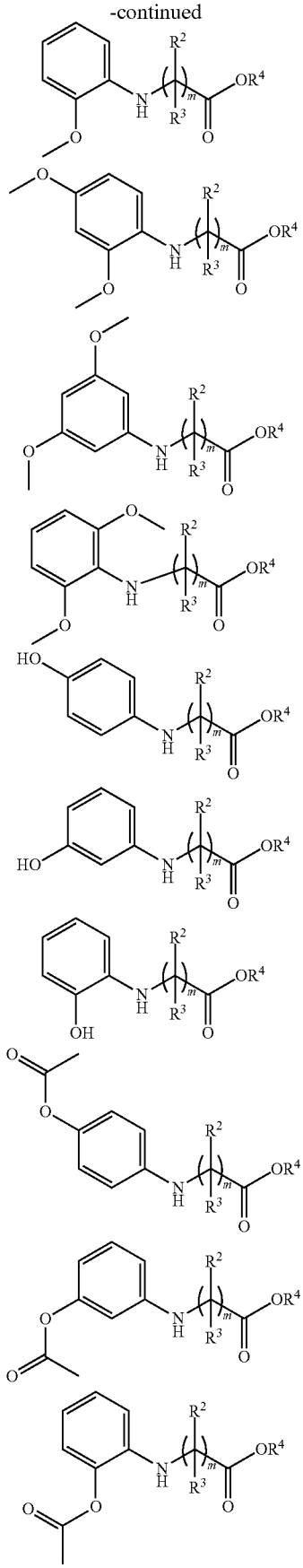
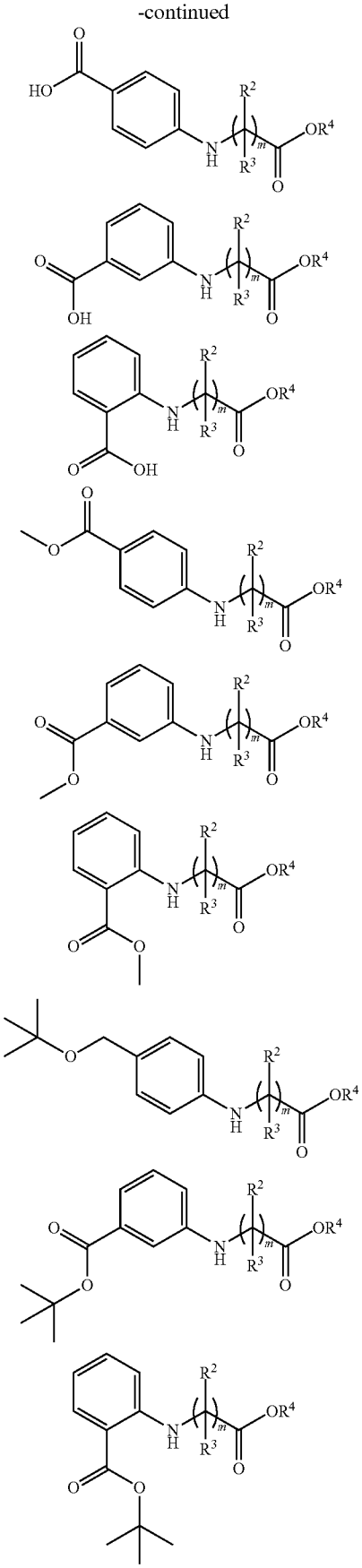

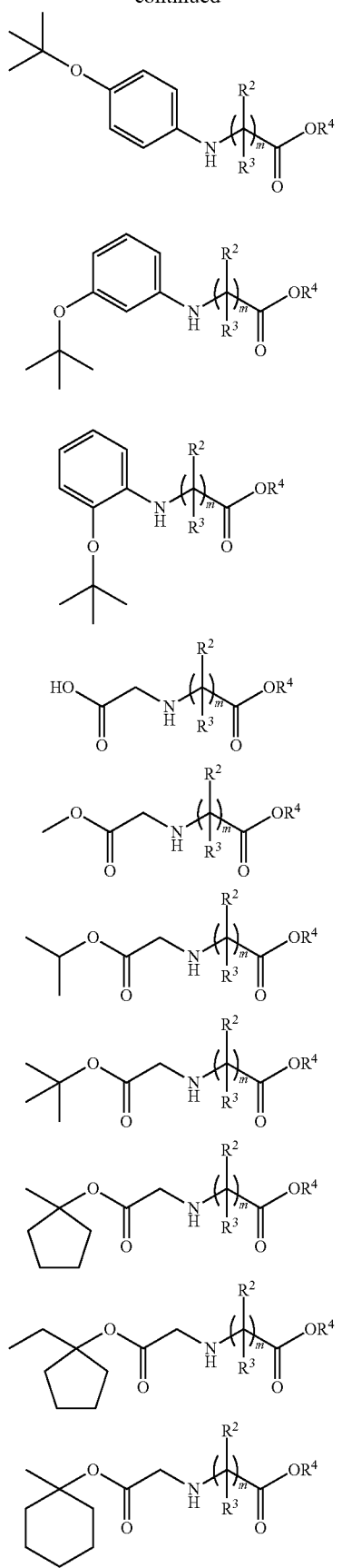
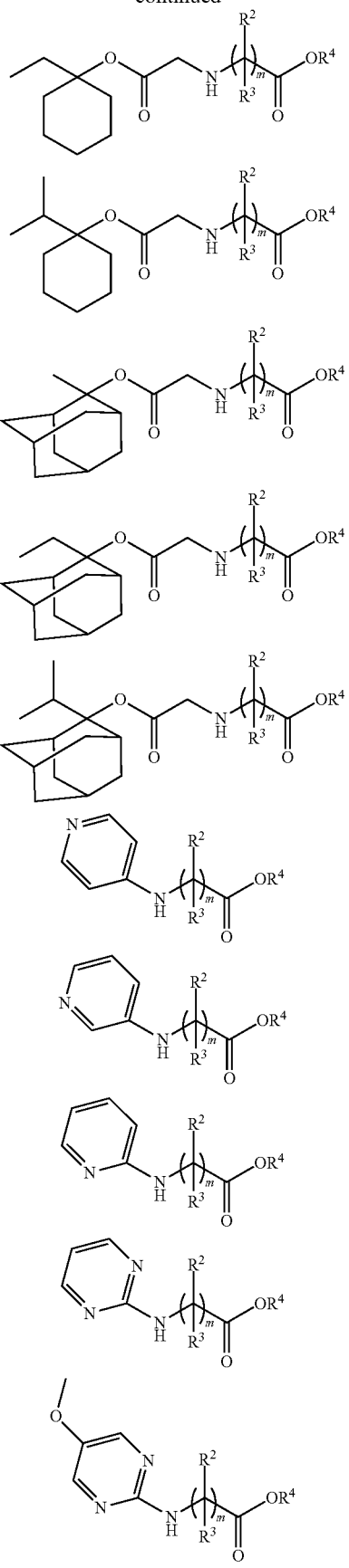

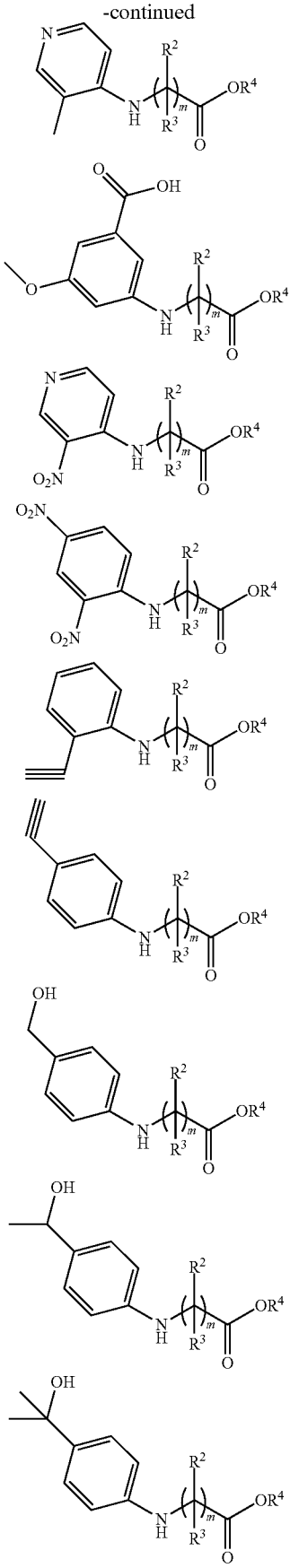
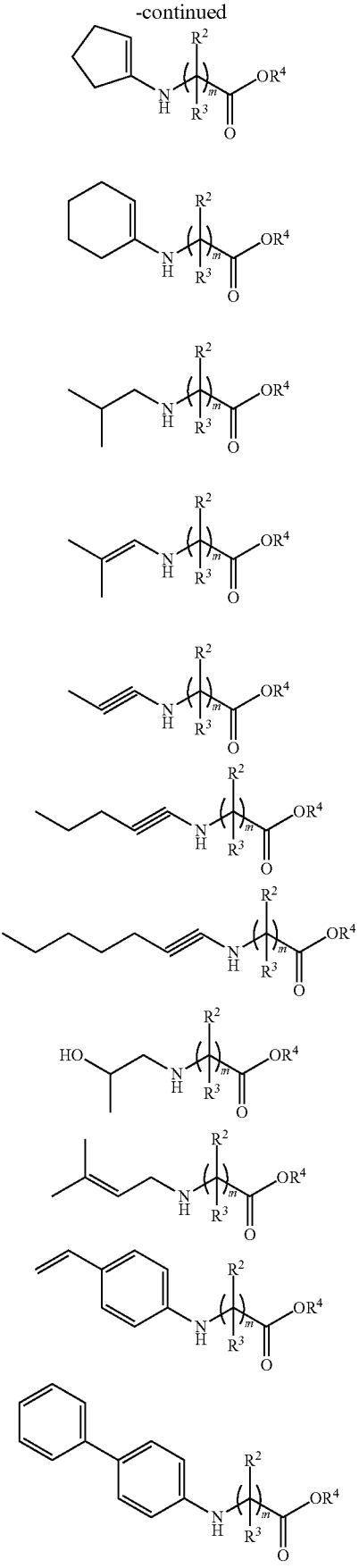

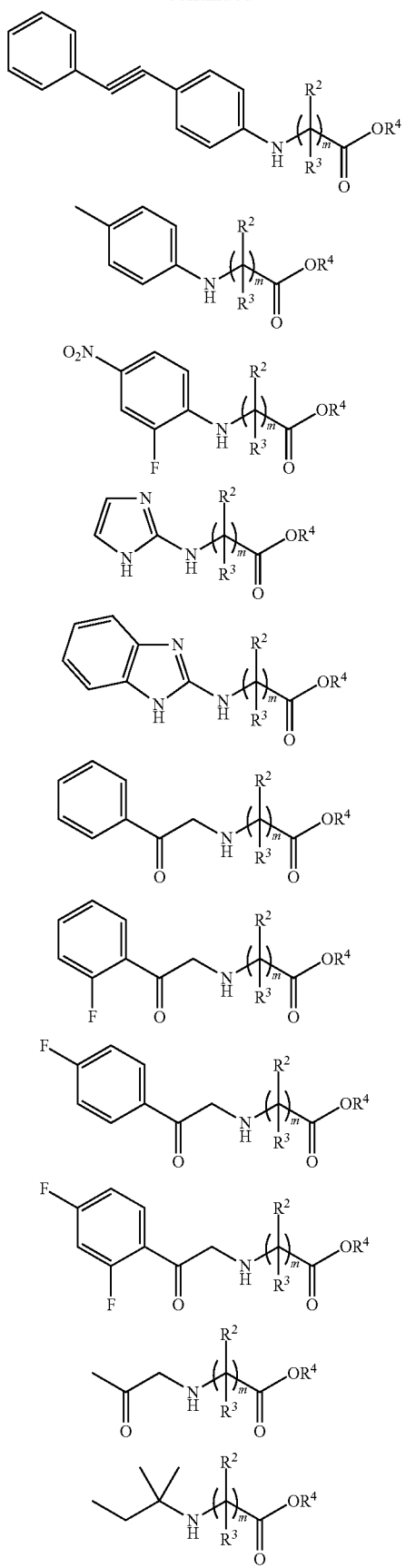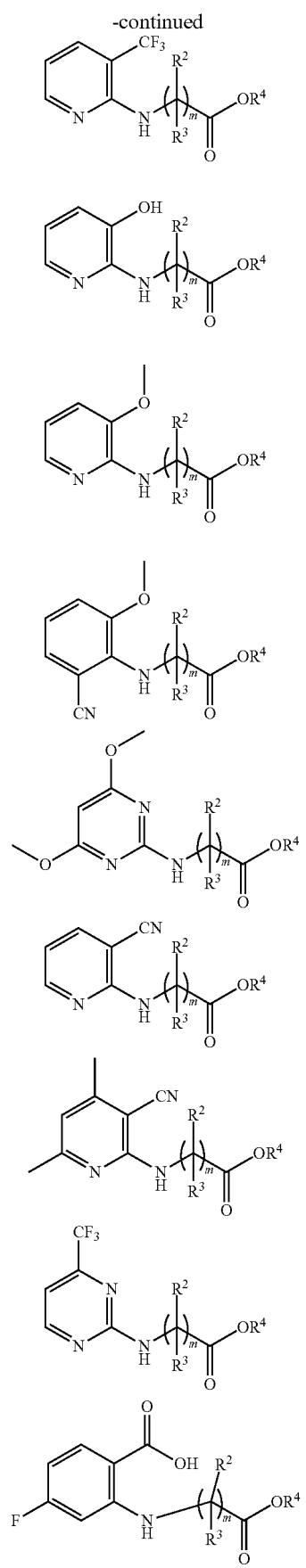

-continued
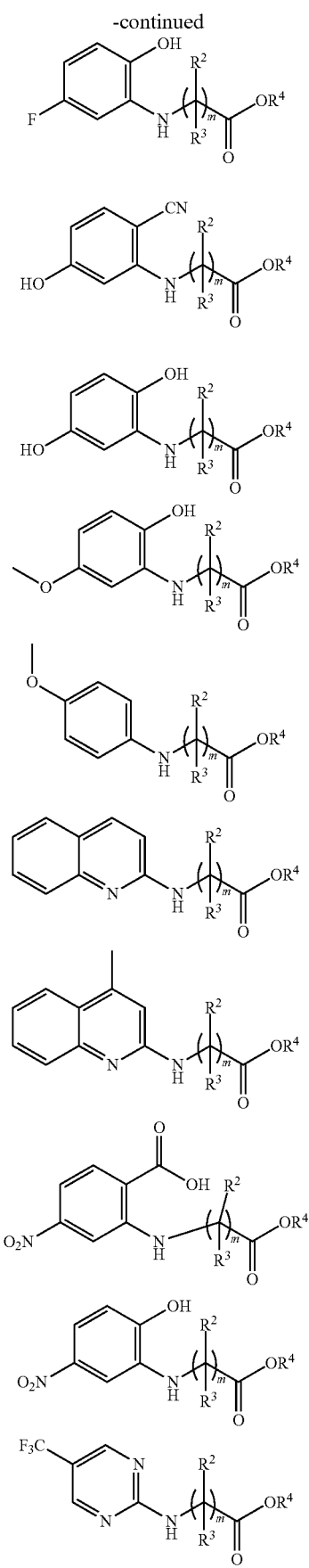
-continued
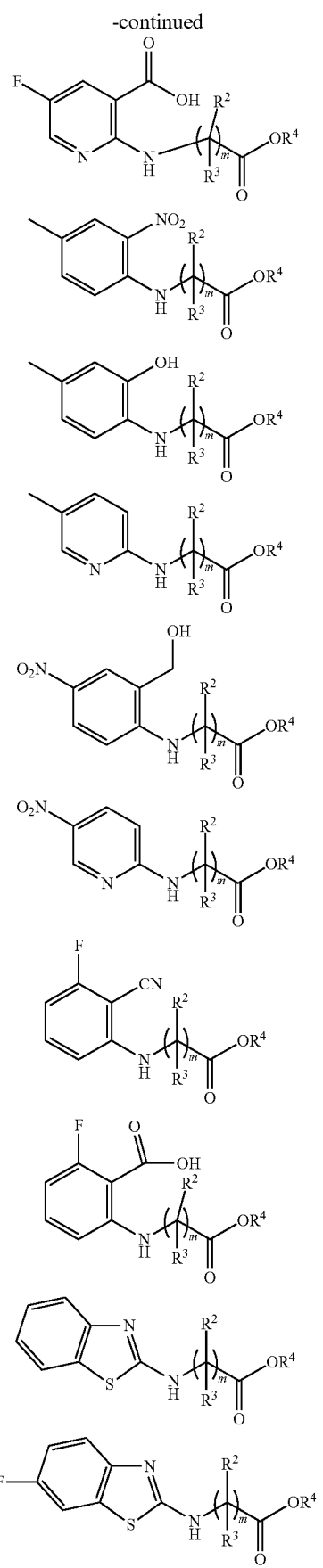

-continued
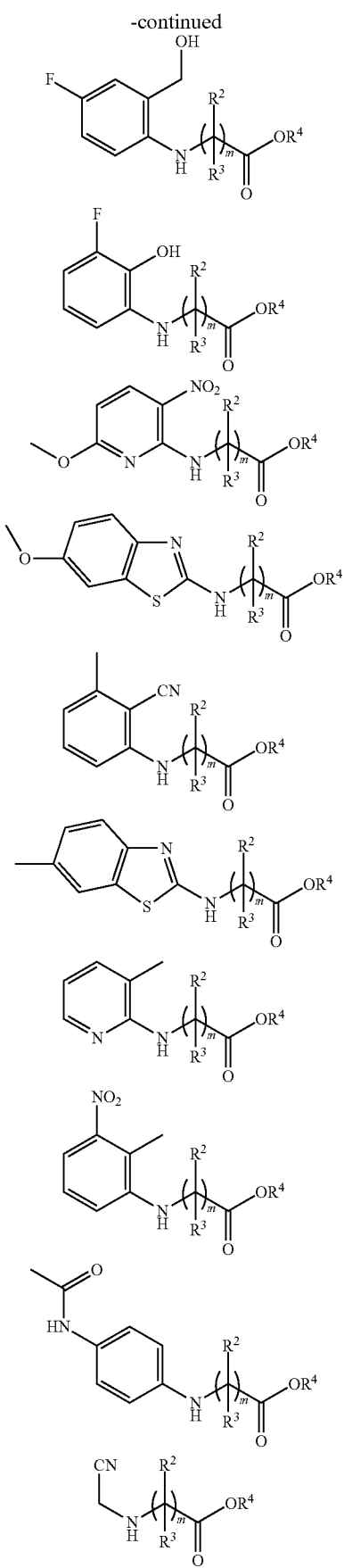
-continued
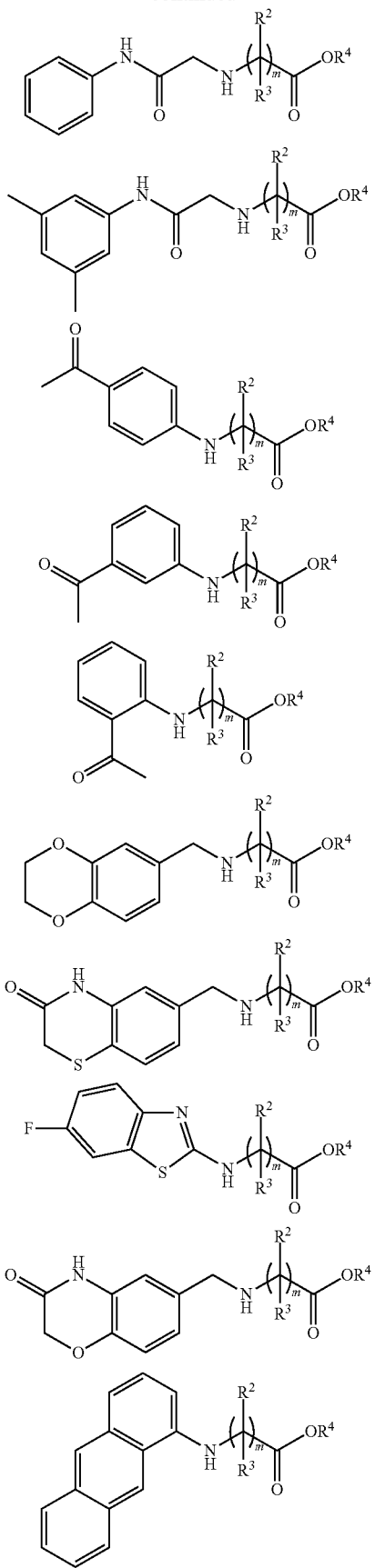

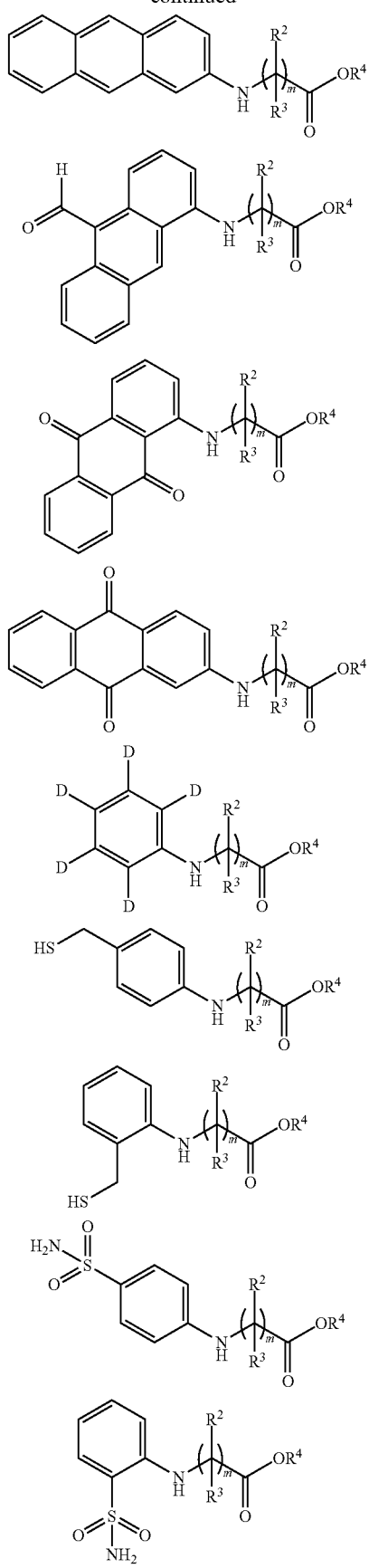
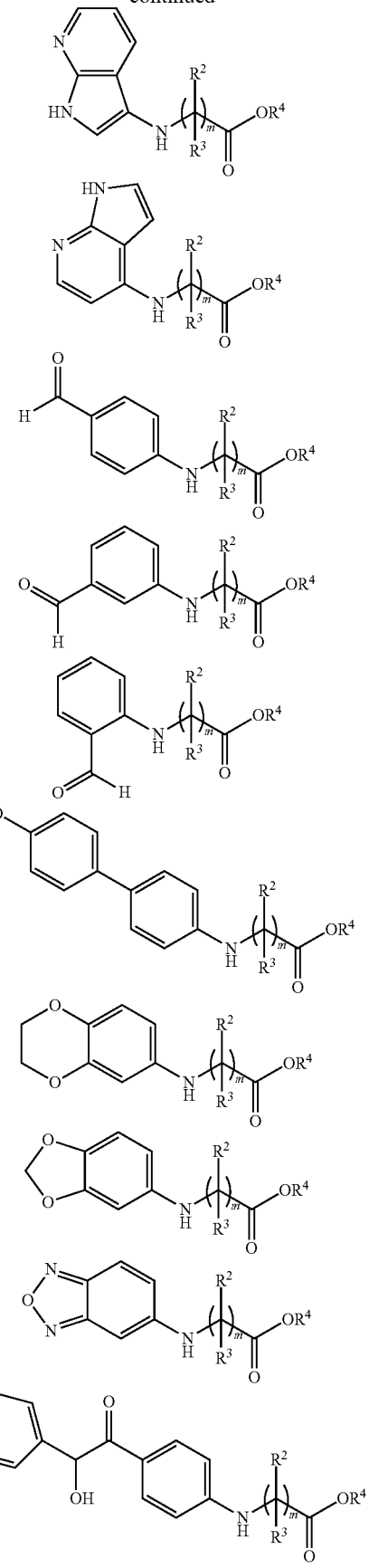

-continued
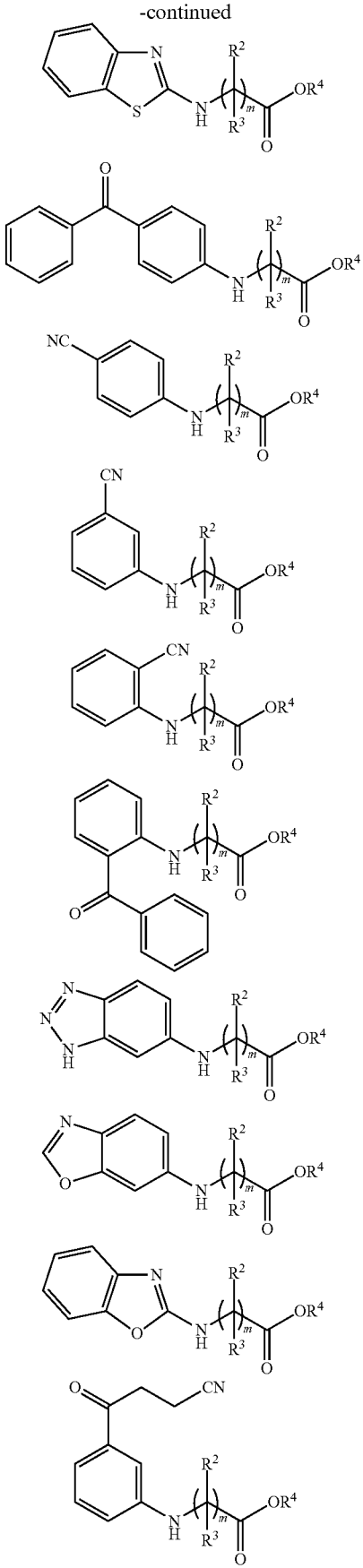
-continued
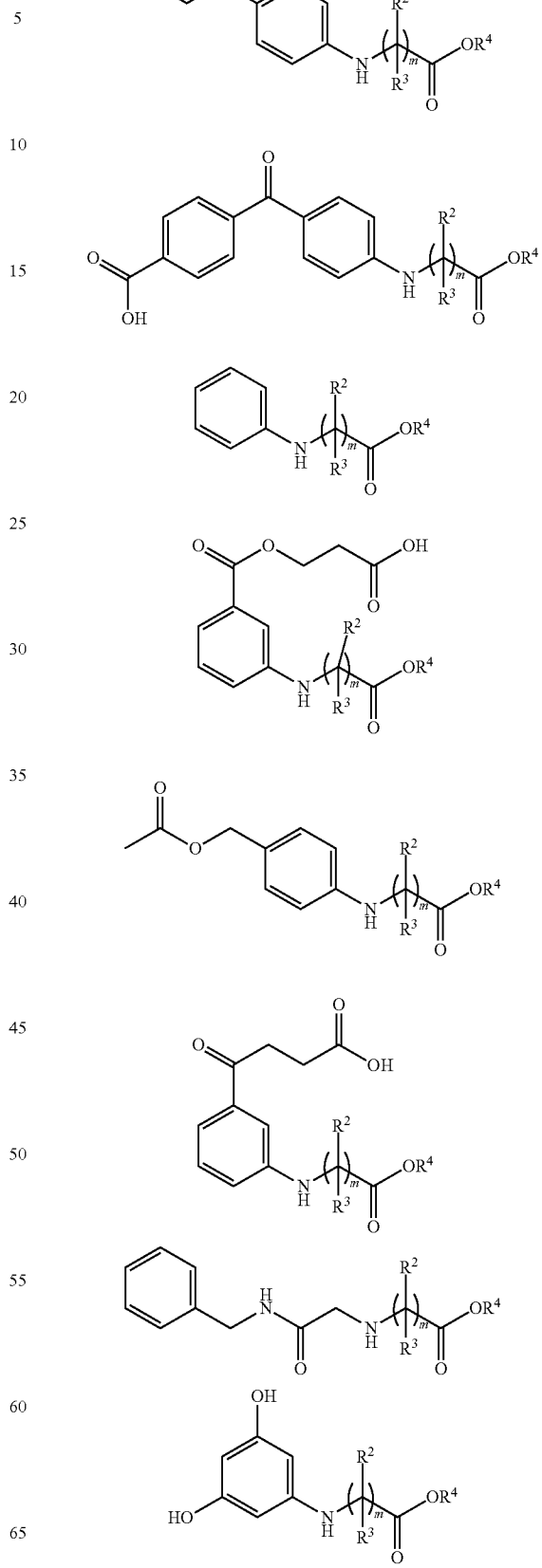

33
-continued
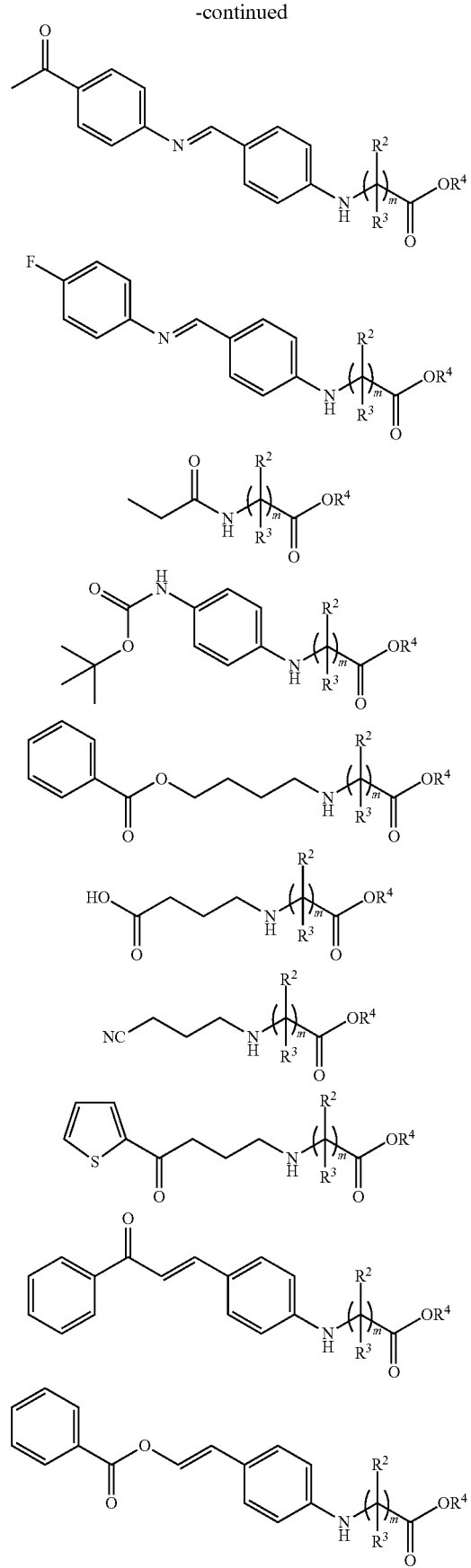
34
-continued
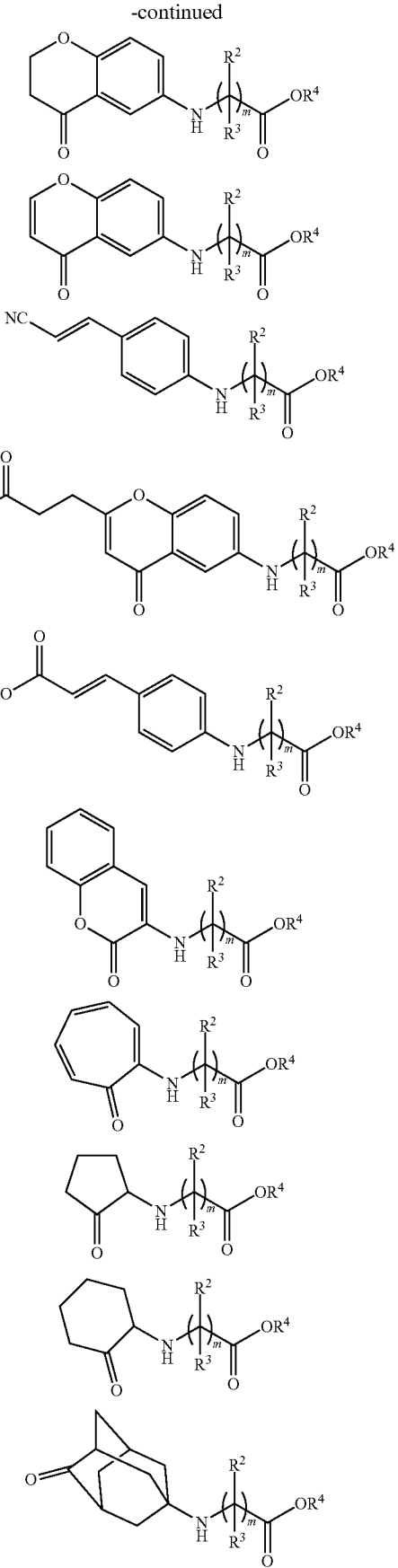

-continued
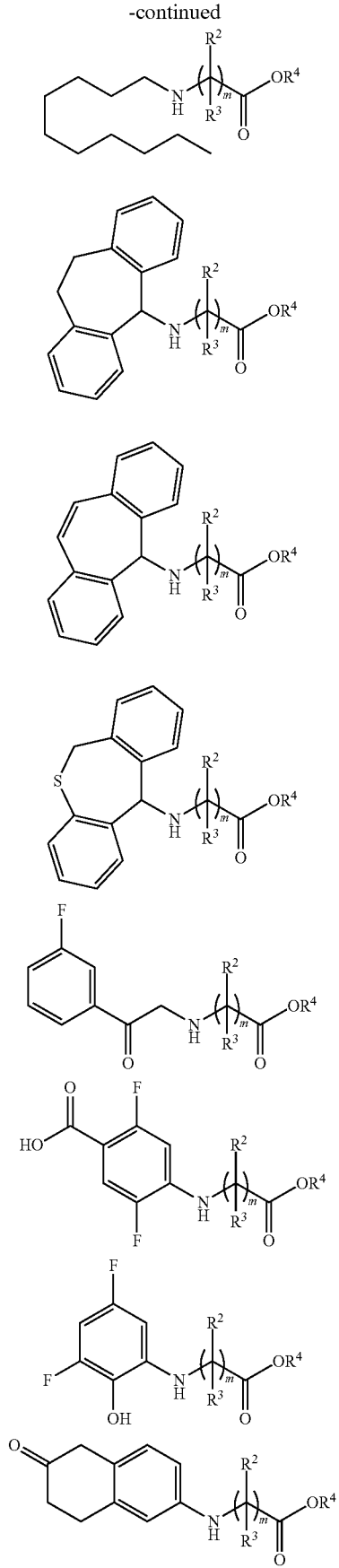
-continued
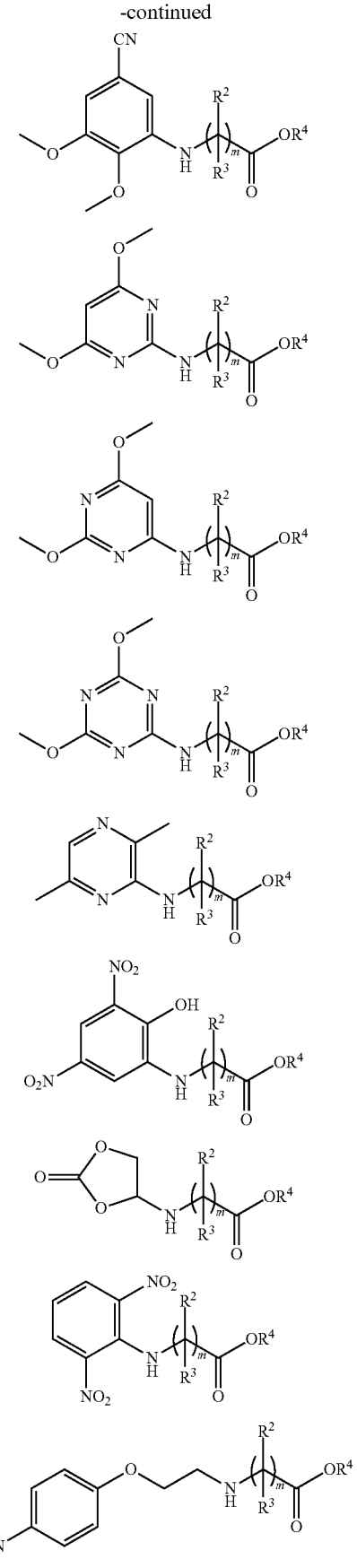

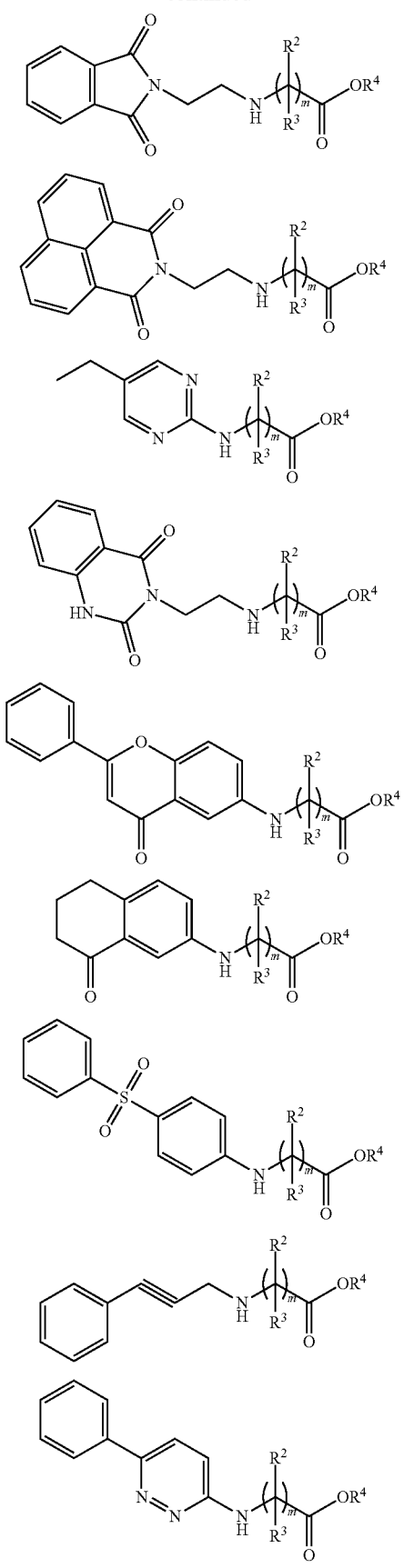
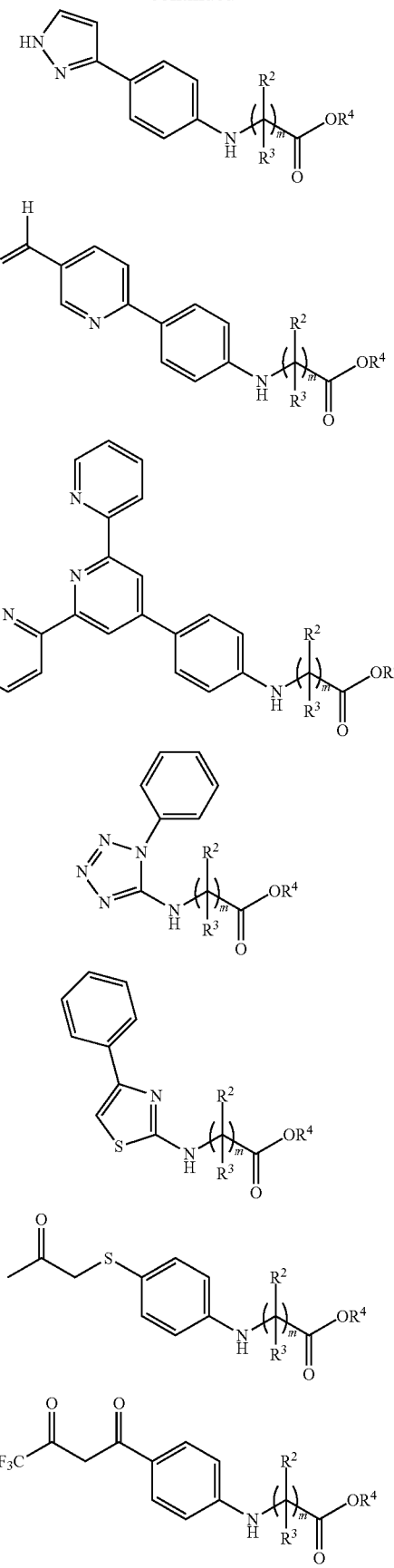

-continued
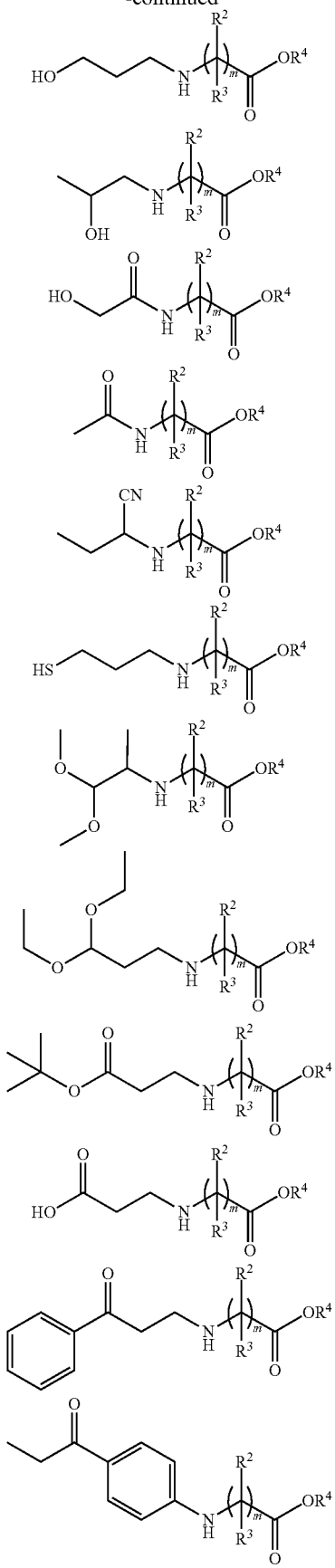
-continued
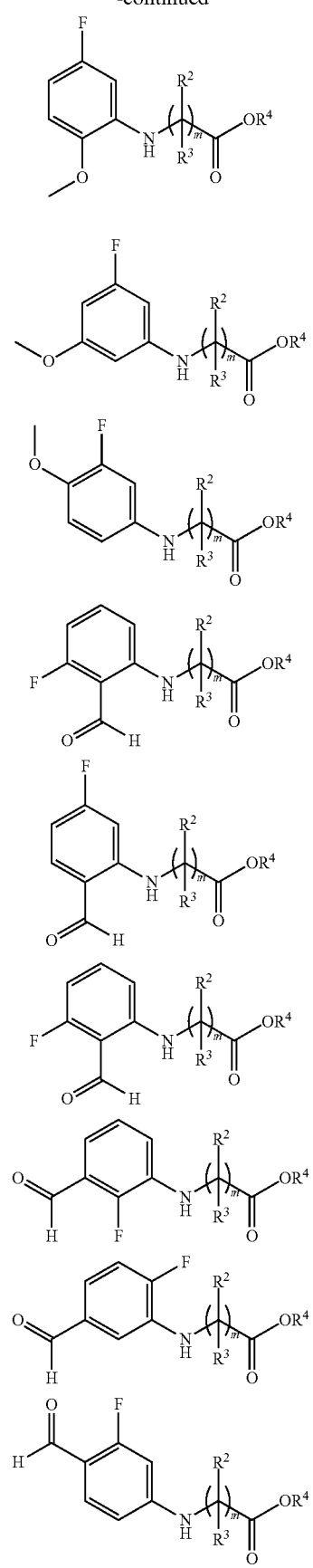

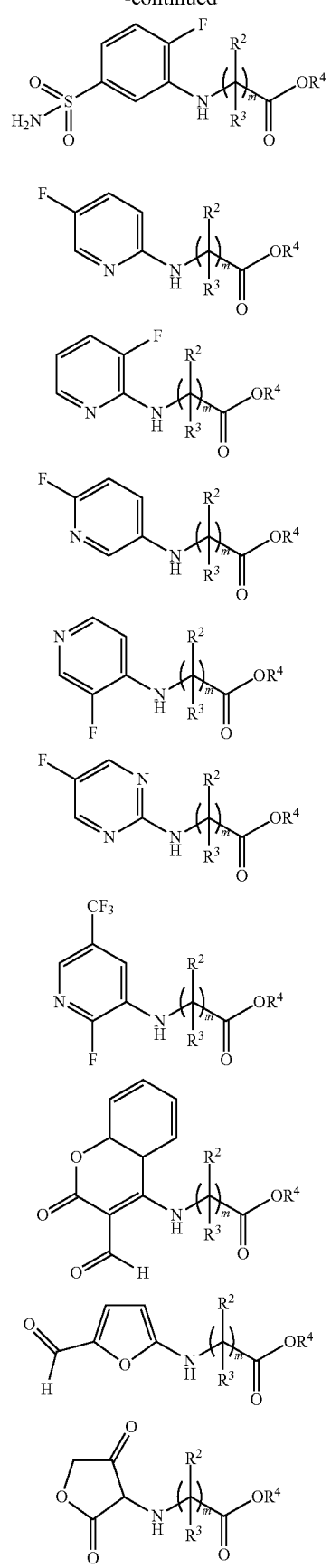
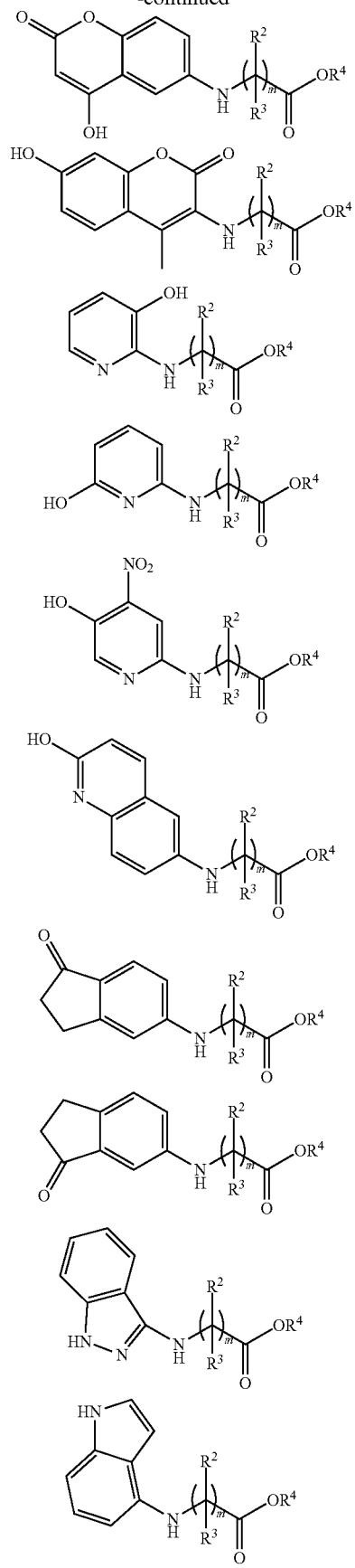

-continued
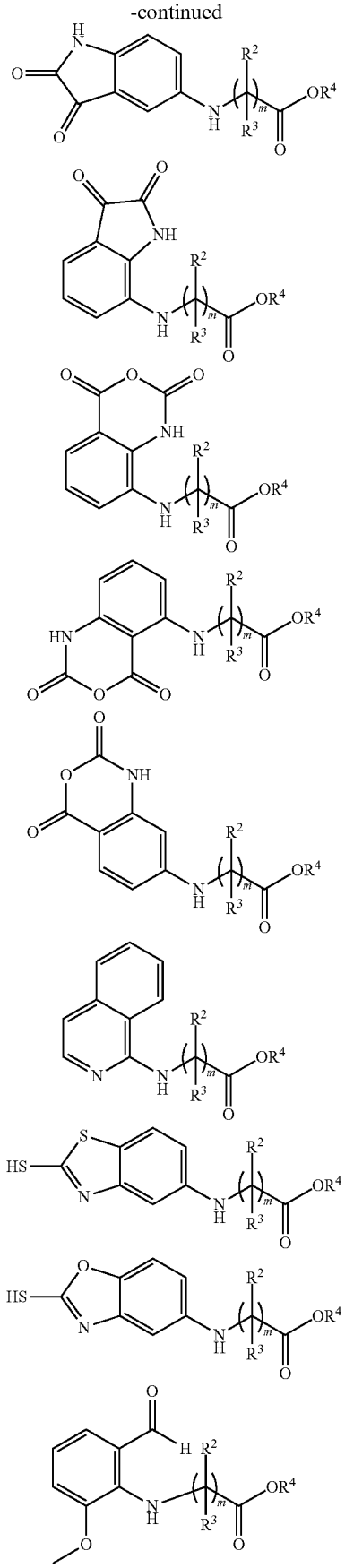
-continued
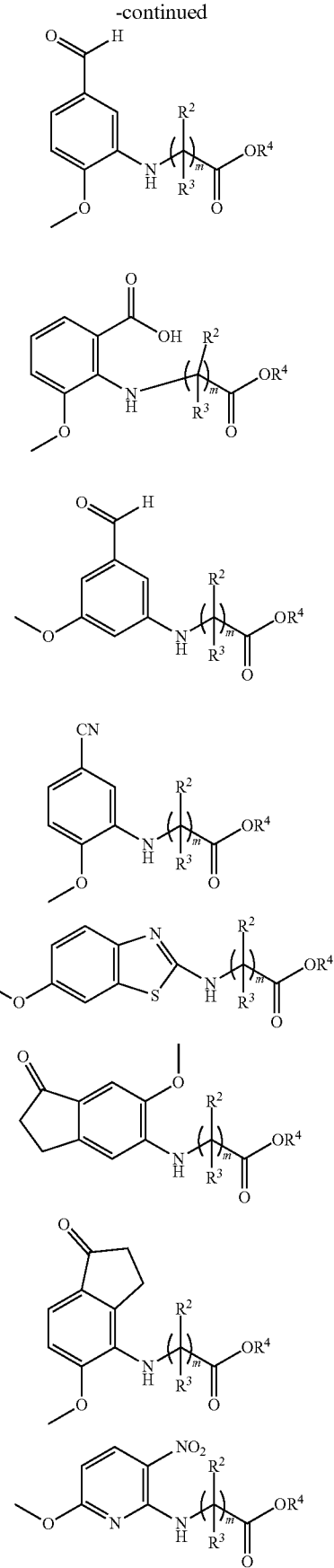

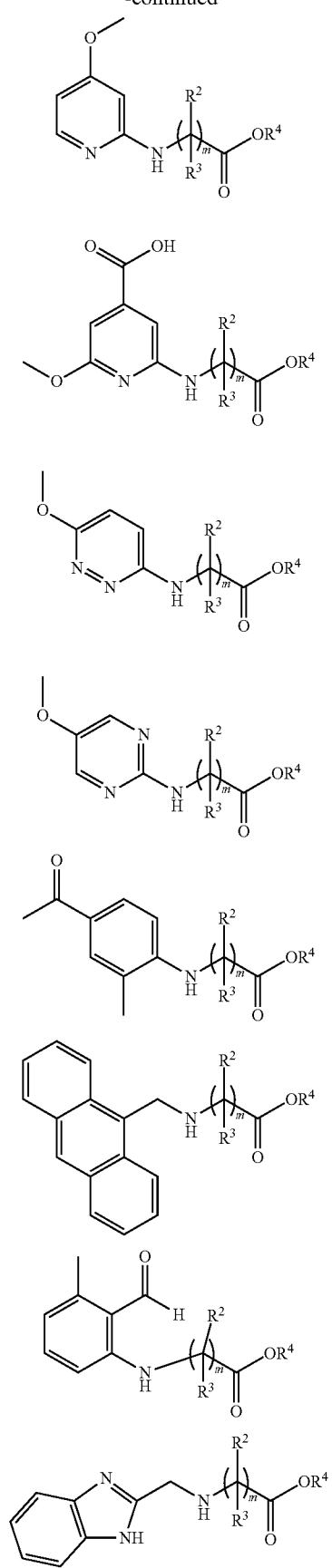
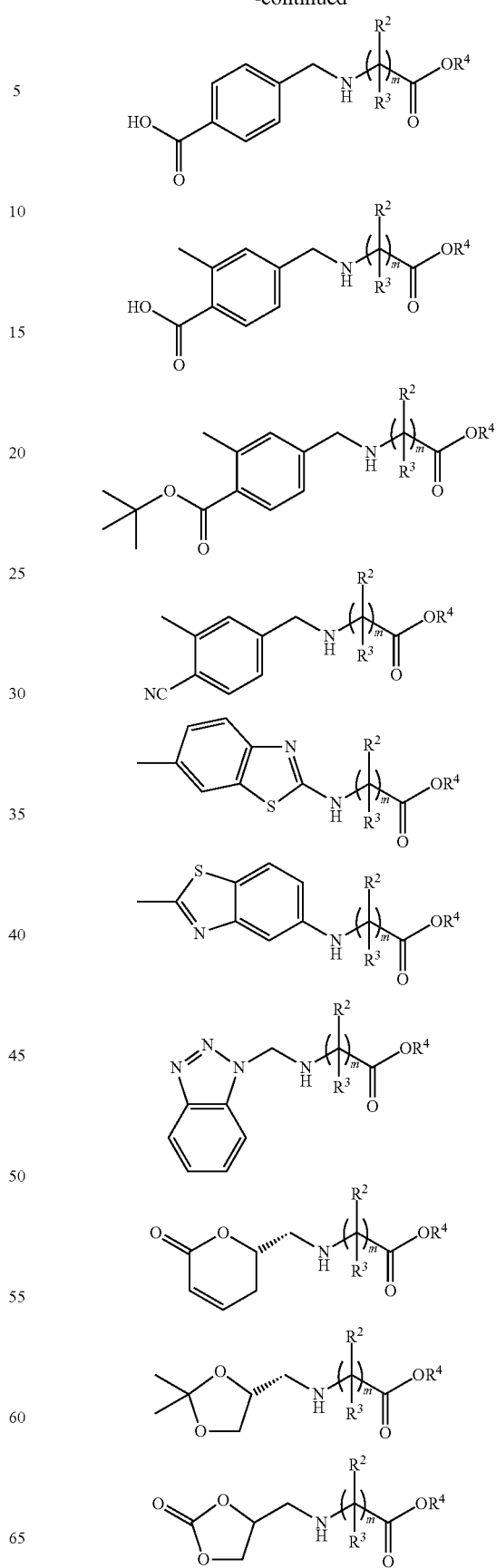

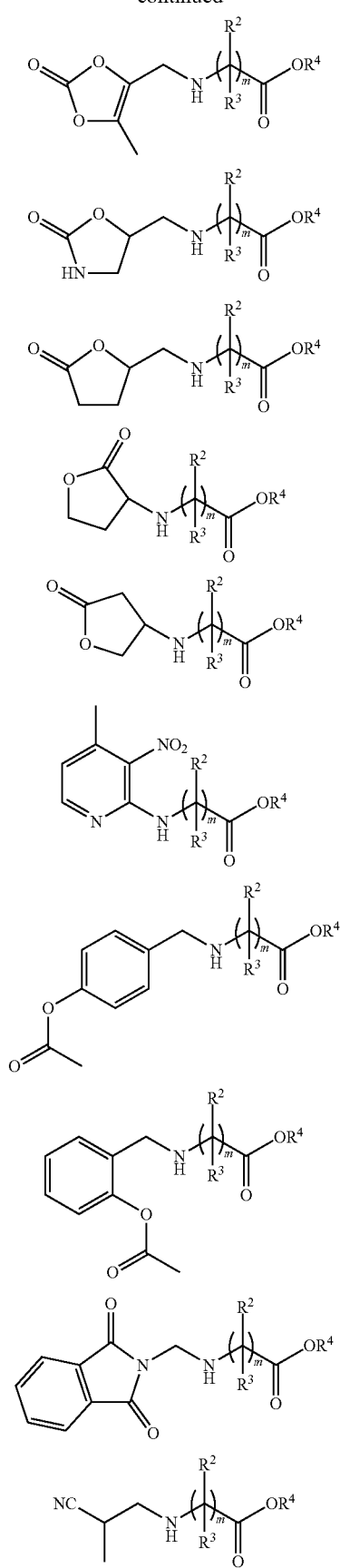
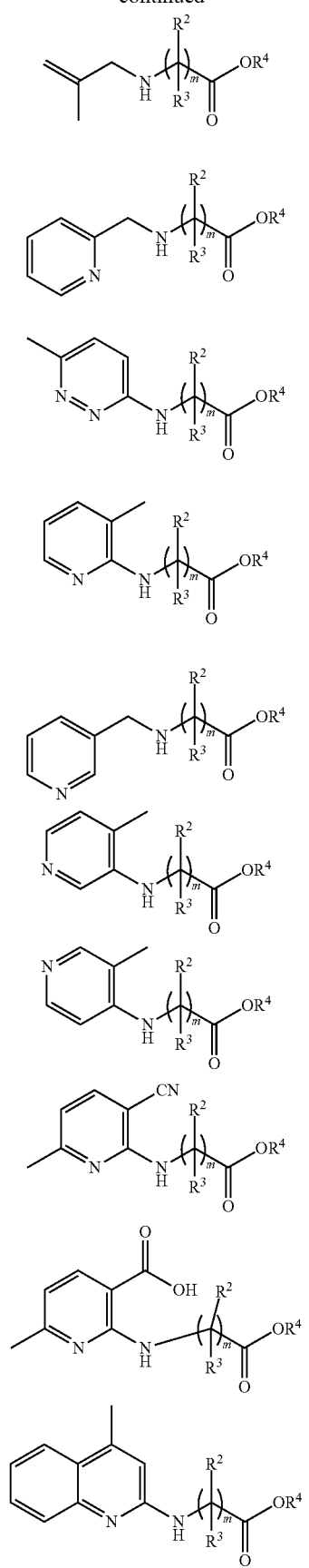

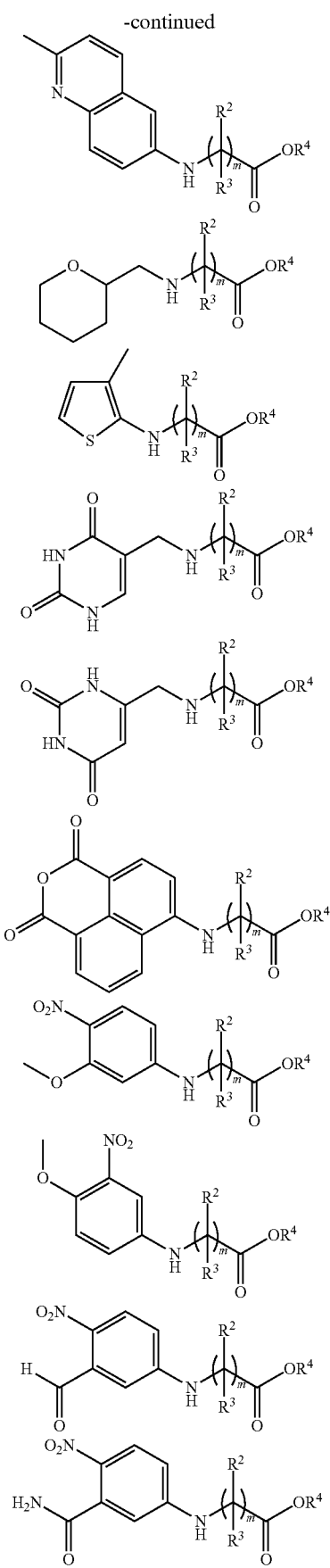
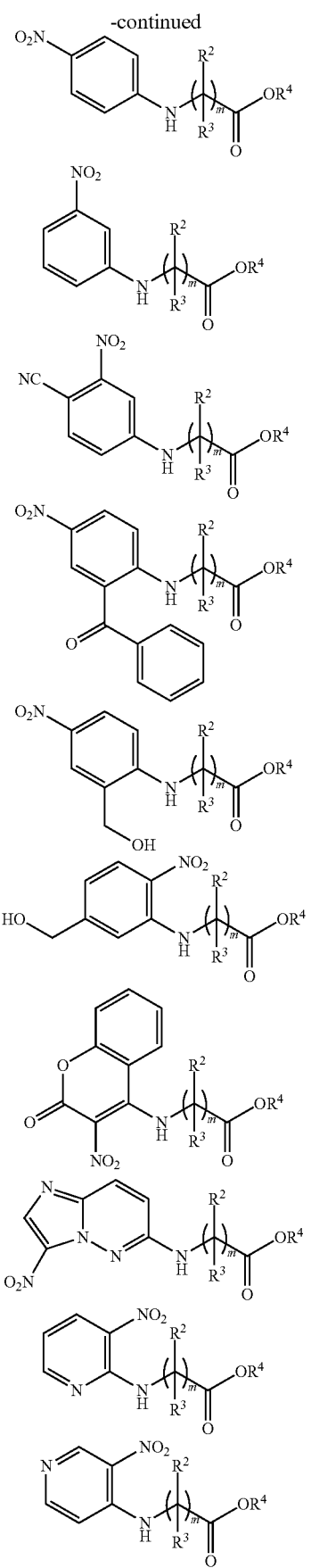

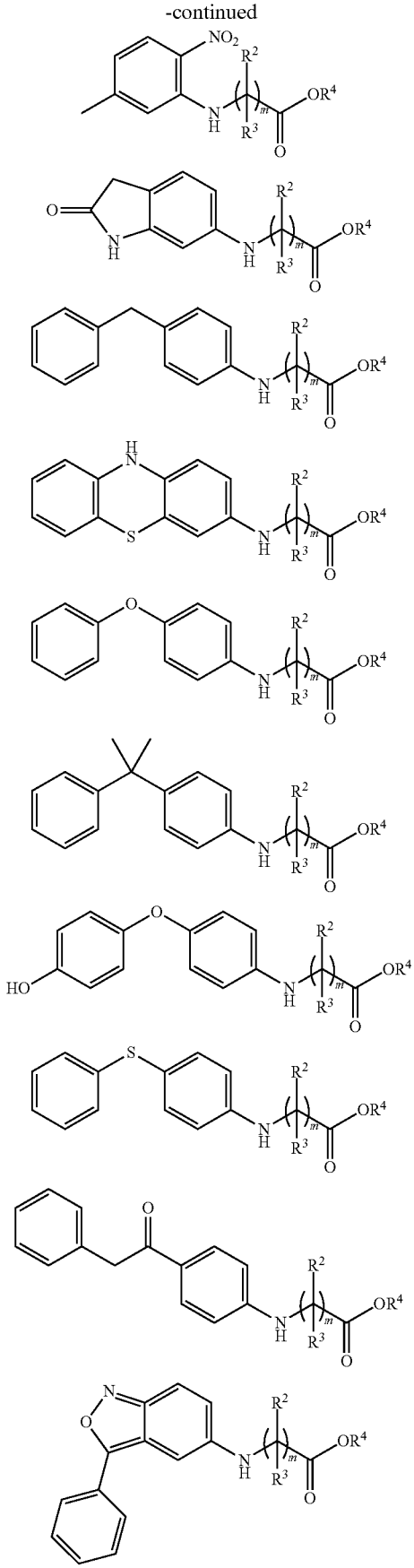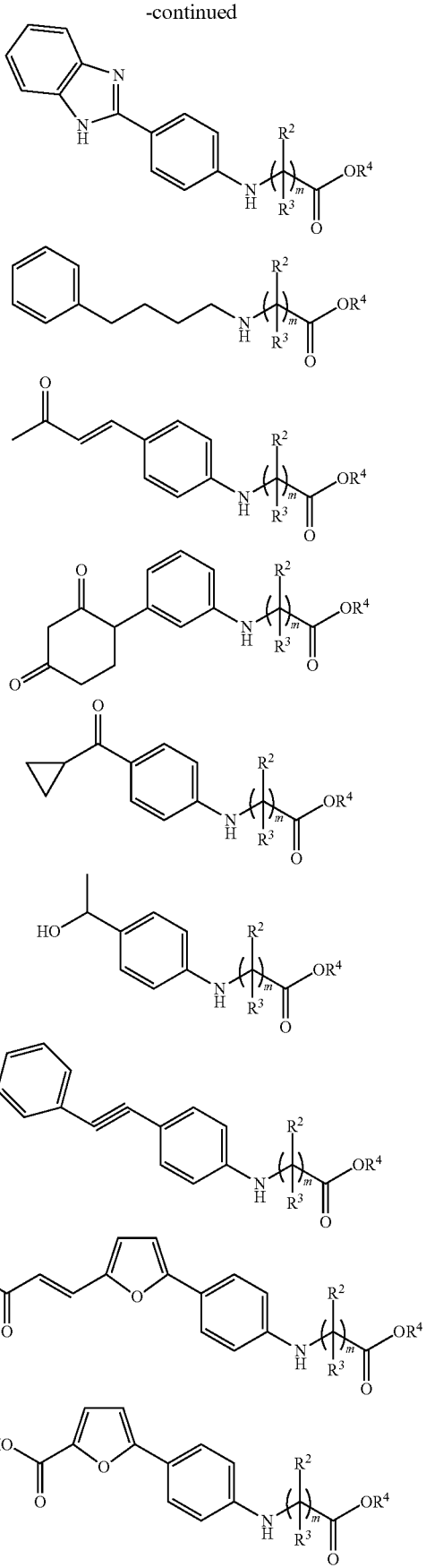

-continued
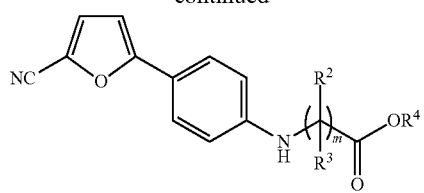
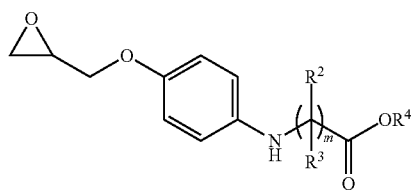
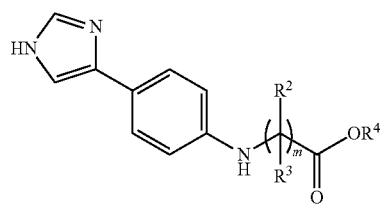
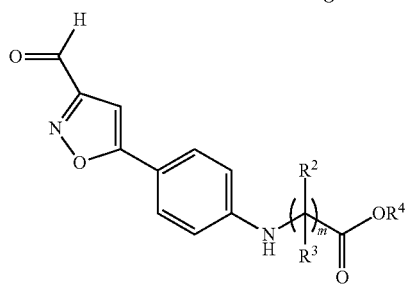
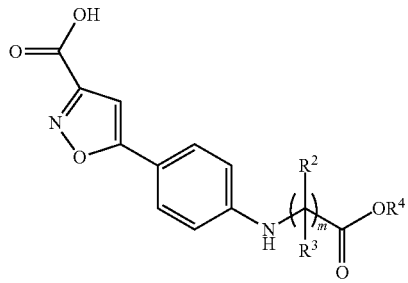
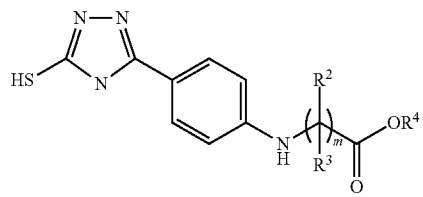
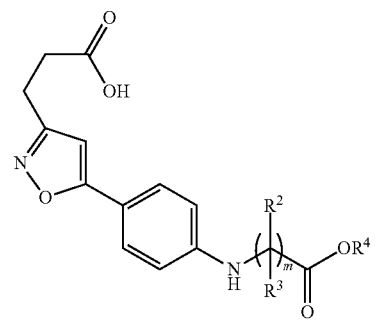
-continued
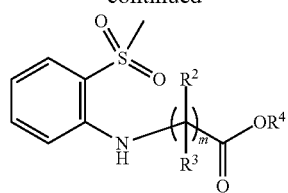
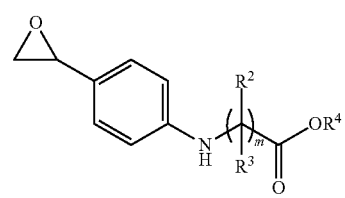
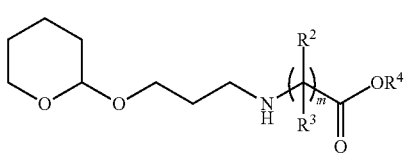
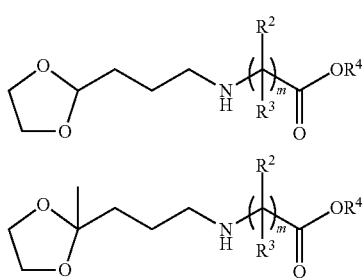
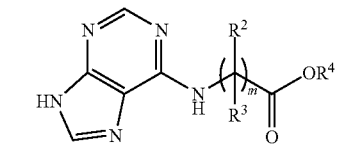
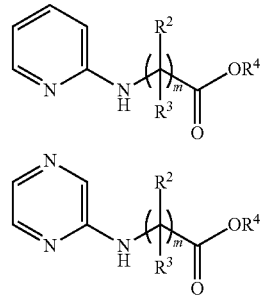
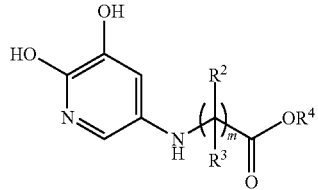
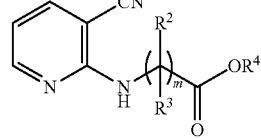

-continued
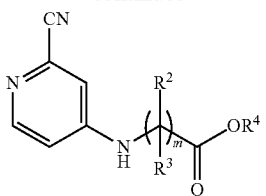
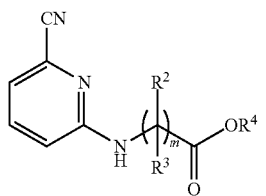
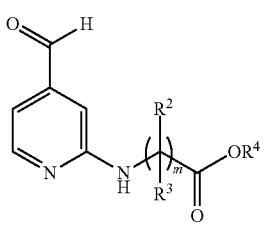
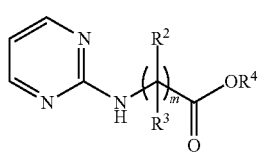
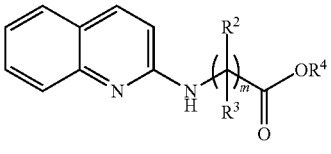
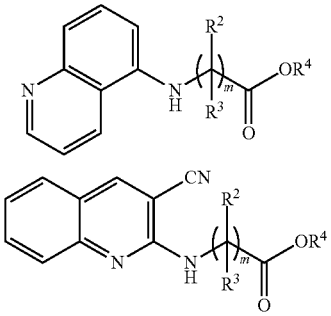
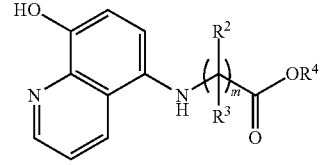
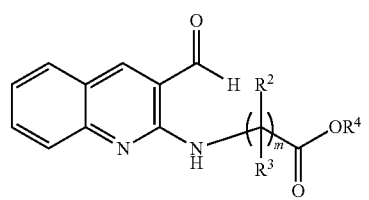
-continued
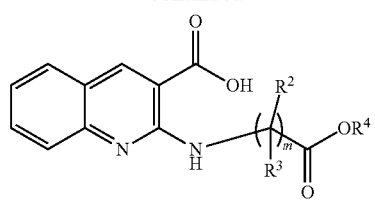
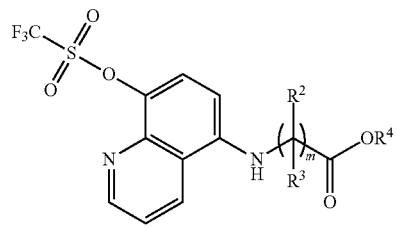
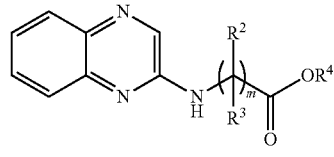
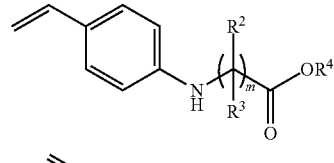
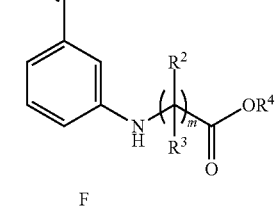
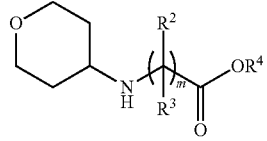
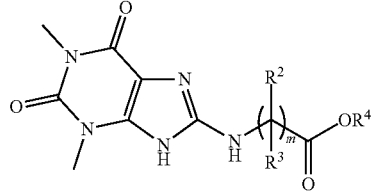
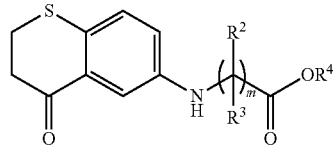

-continued

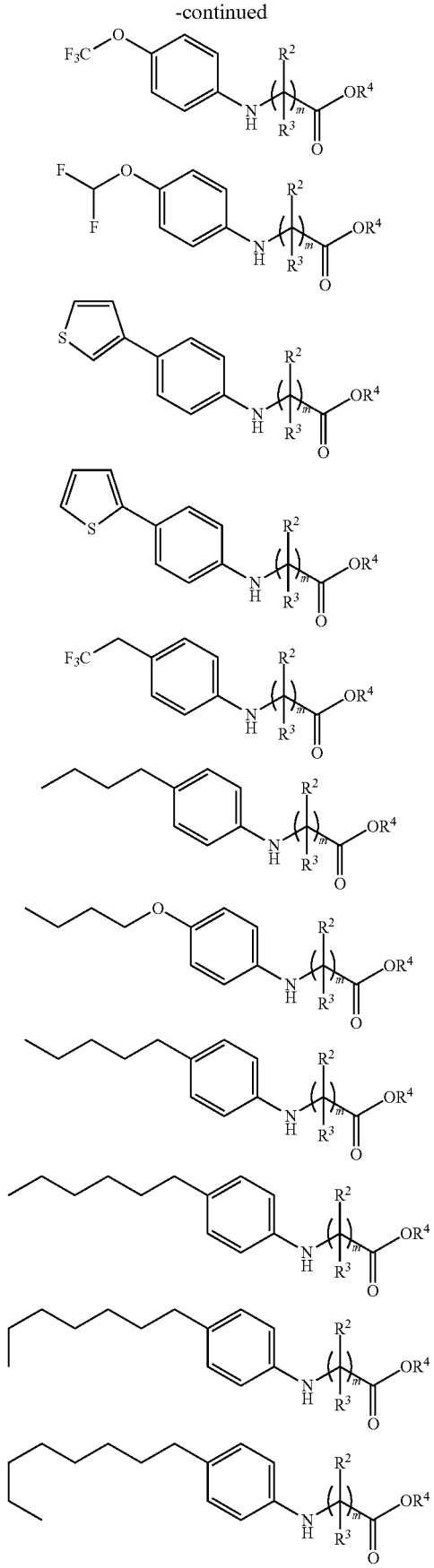
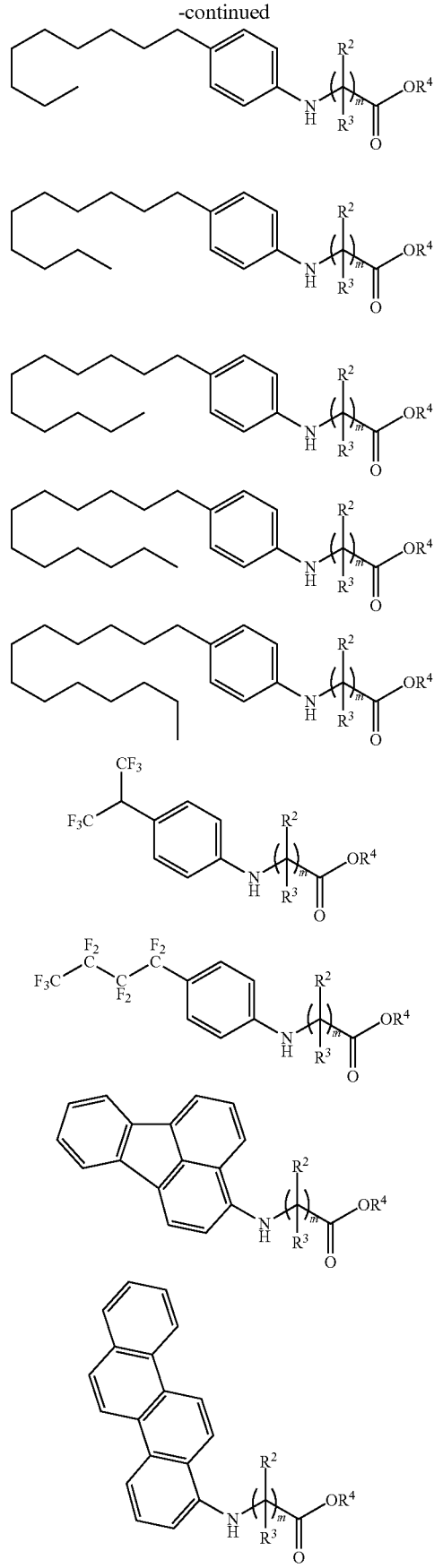

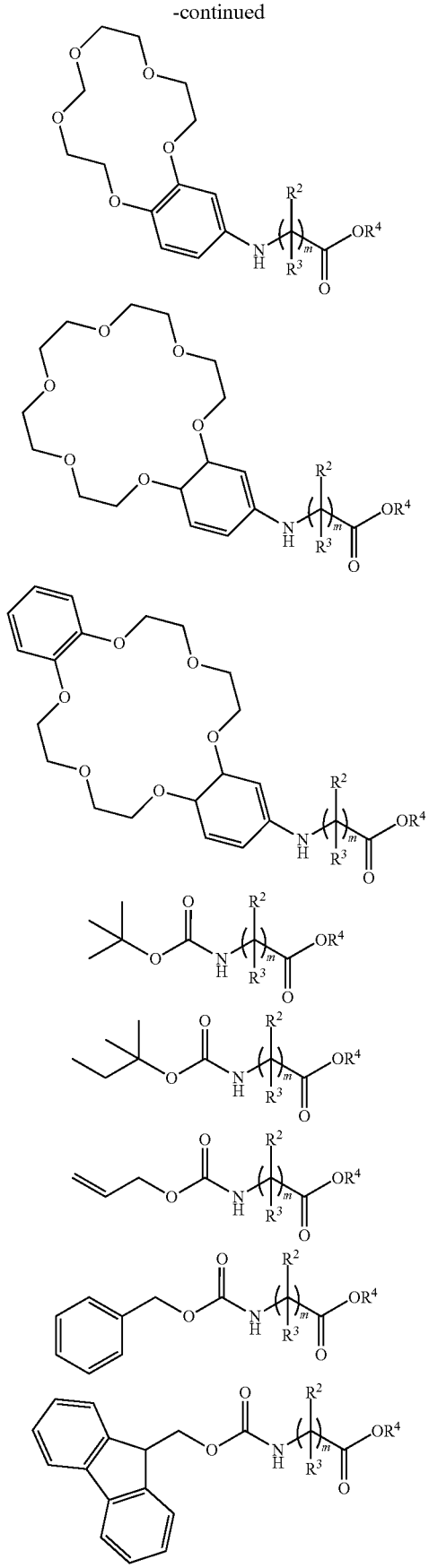
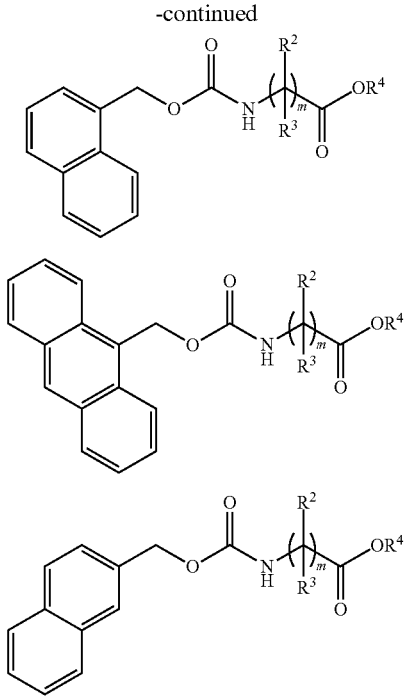
Examples of $R^4$ include hydrogen, methyl, ethyl, n-propyl, isopropyl, n-butyl, isobutyl, sec-butyl, n-pentyl, cyclopentyl, and cyclohexyl.
Preferred examples of the compound of formula (1) are given below.
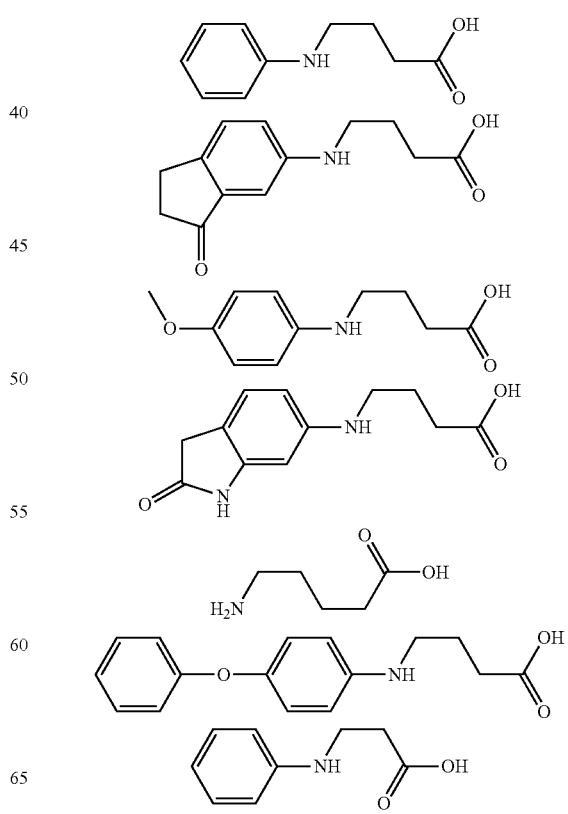

63
-continued
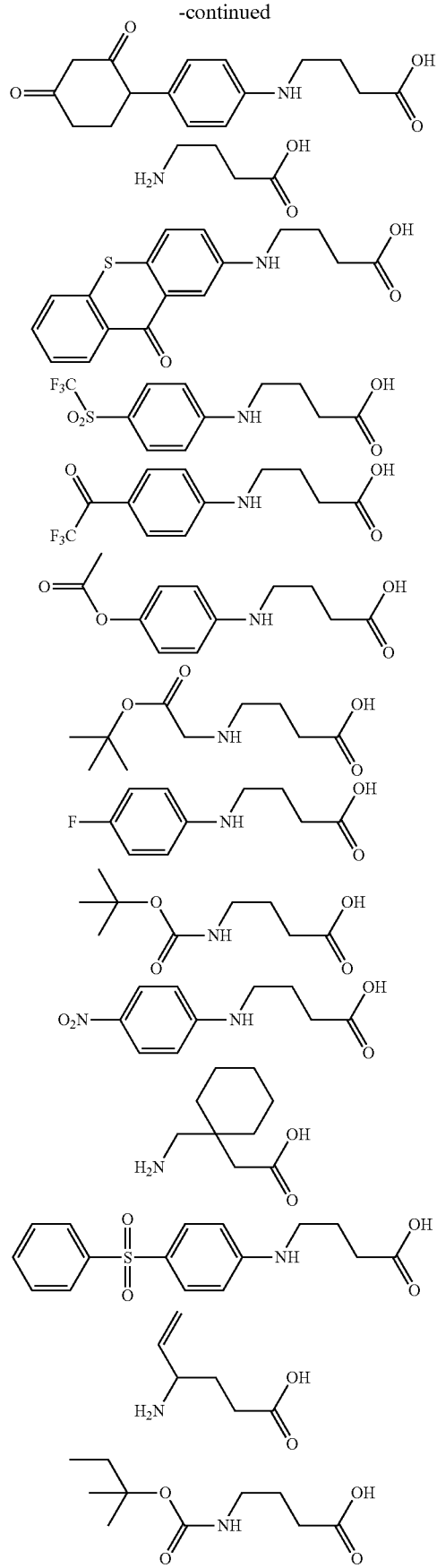
64
-continued
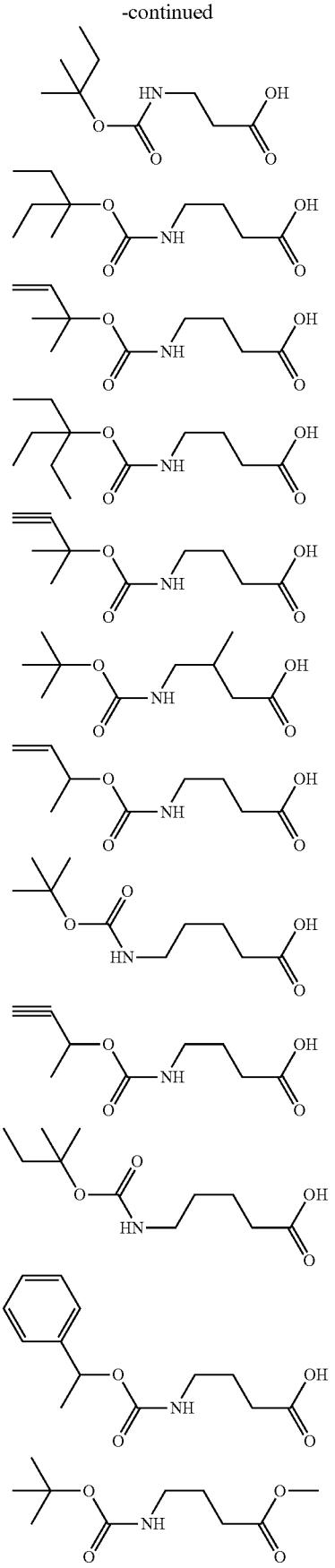

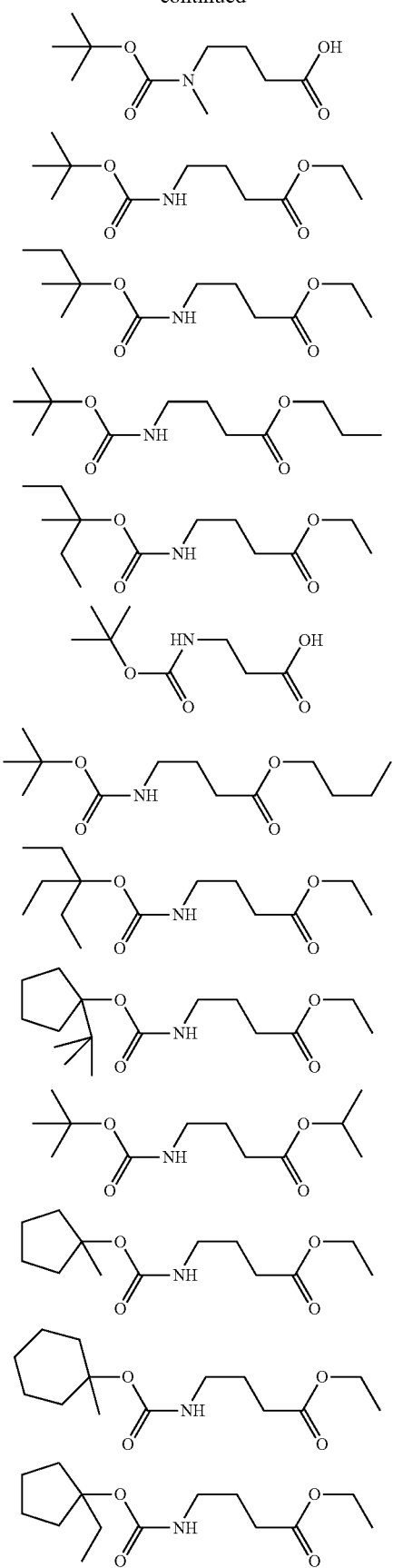
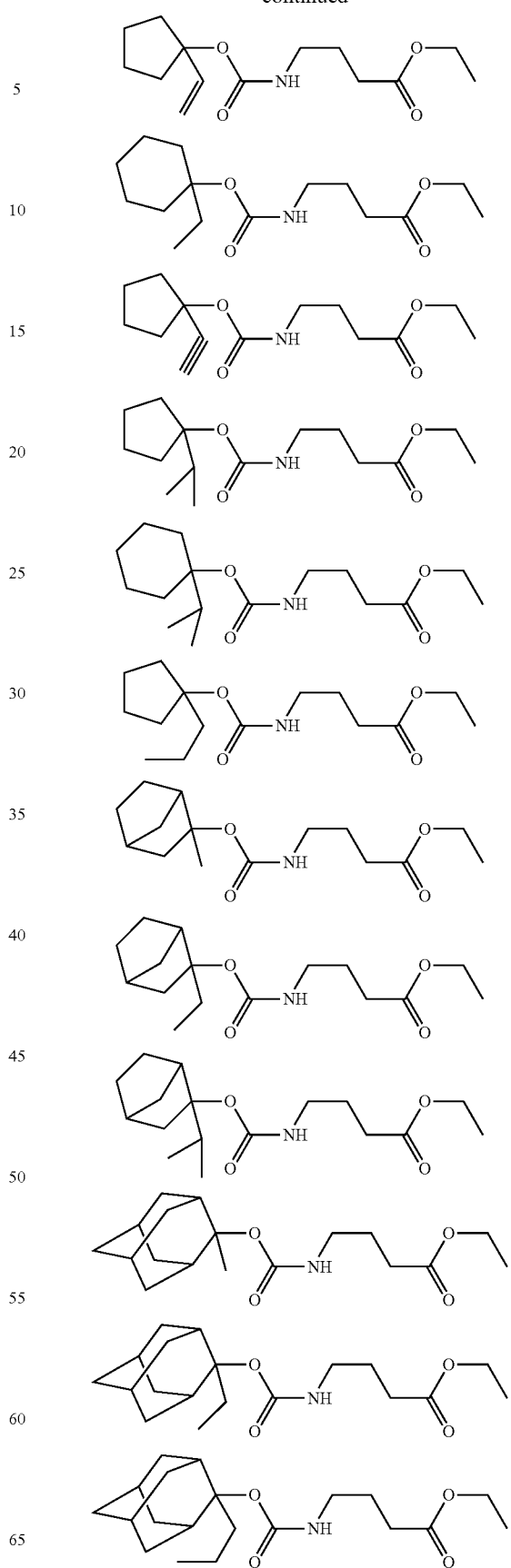

-continued

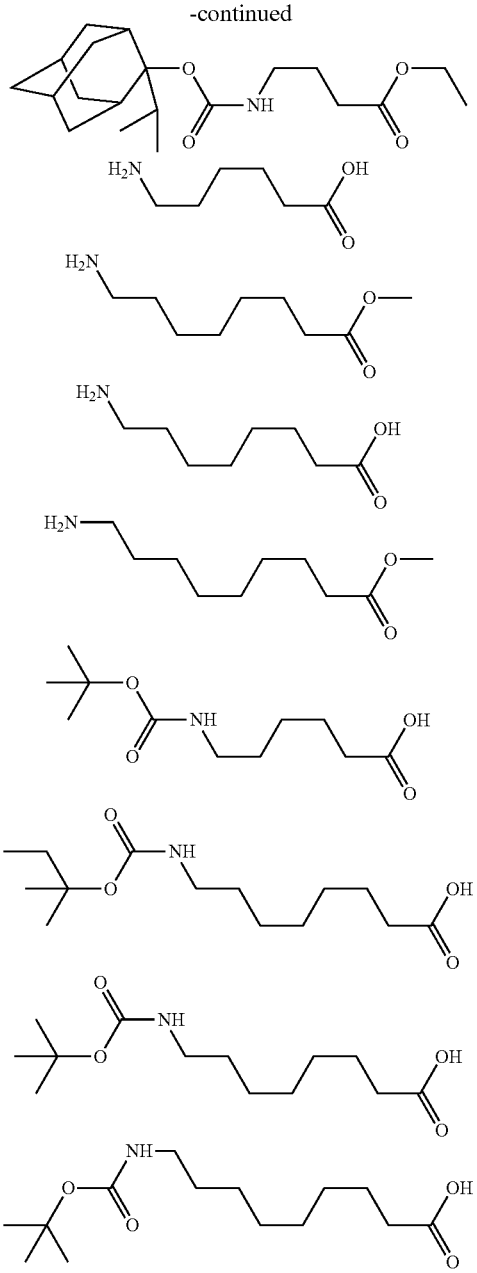

The resist composition comprising the basic compound of the general formula (1) (the β-alanine, γ-aminobutyric acid, 5-aminovaleric acid, 6-aminocaproic acid, 7-aminoheptanoic acid, 8-aminooctanoic acid and 9-aminononanoic acid derivative) having a substituted or unsubstituted carboxyl group may be either positive or negative, but should be a chemically amplified resist composition comprising an acid generator independent of whether it is positive or negative. The β-alanine, γ-aminobutyric acid, 5-aminovaleric acid, 6-aminocaproic acid, 7-aminoheptanoic acid, 8-aminooctanoic acid and 9-aminononanoic acid derivative acts in such a way that it may trap an acid to suppress acid diffusion in the unexposed region, while in the exposed region, it may form a lactam through cyclization reaction of β-alanine, γ-aminobutyric acid, 5-aminovaleric acid, 6-aminocaproic acid, 7-aminoheptanoic acid, 8-aminooctanoic acid or 9-aminononanoic acid with the aid of acid, leading to a lowering of basicity and a concomitant improvement in contrast. The lactam-forming reaction is faster than deprotection reaction of the base resin, which is more effective for improving contrast. Accordingly, the basic compound of formula (1) is advantageously applied to a chemically amplified resist composition utilizing an acid as a catalyst.

The chemically amplified resist composition of the invention comprises the basic compound of formula (1), a base polymer, and an acid generator, both to be described below. From the standpoints of sensitivity and acid diffusion control, the basic compound of formula (1) is preferably present in the composition in an amount of 0.001 to 20 parts by weight, more preferably 0.01 to 10 parts by weight per 100 parts by weight of the base polymer.

In the embodiment wherein chemically amplified resist compositions are positive, the base polymer comprises recurring units having an acid labile group. Suitable recurring units having an acid labile group include recurring units of (meth)acrylate, styrenecarboxylic acid and vinylnaphthalenecarboxylic acid having an acid labile group substituted thereon, as represented by unit (a1) in the general formula (2), and recurring units of hydroxystyrene having an acid labile group substituted thereon, as represented by unit (a2) in the general formula (2).

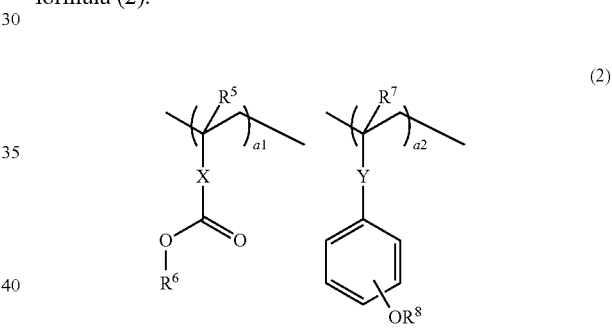

(2)

Herein, $R^5$ and $R^7$ which may be the same or different is hydrogen or methyl. X is a single bond, a linking group of 1 to 12 carbon atoms having an ester moiety and/or lactone ring, phenylene group, or naphthylene group. Y is a single bond or ester group. $R^6$ and $R^8$ each are an acid labile group.

The recurring units (a1) having an acid labile group are preferably derived from (meth)acrylic acid, styrenecarboxylic acid and vinylnaphthalenecarboxylic acid by substituting an acid labile group for the hydrogen atom of carboxyl group. Illustrative, non-limiting, examples of recurring units (a1) are given below.

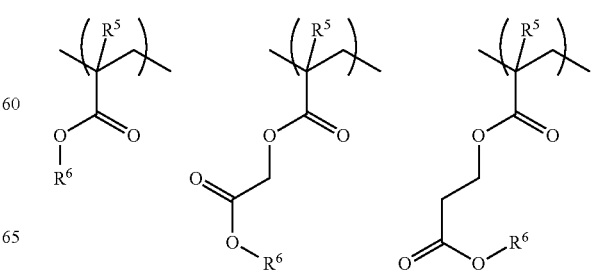

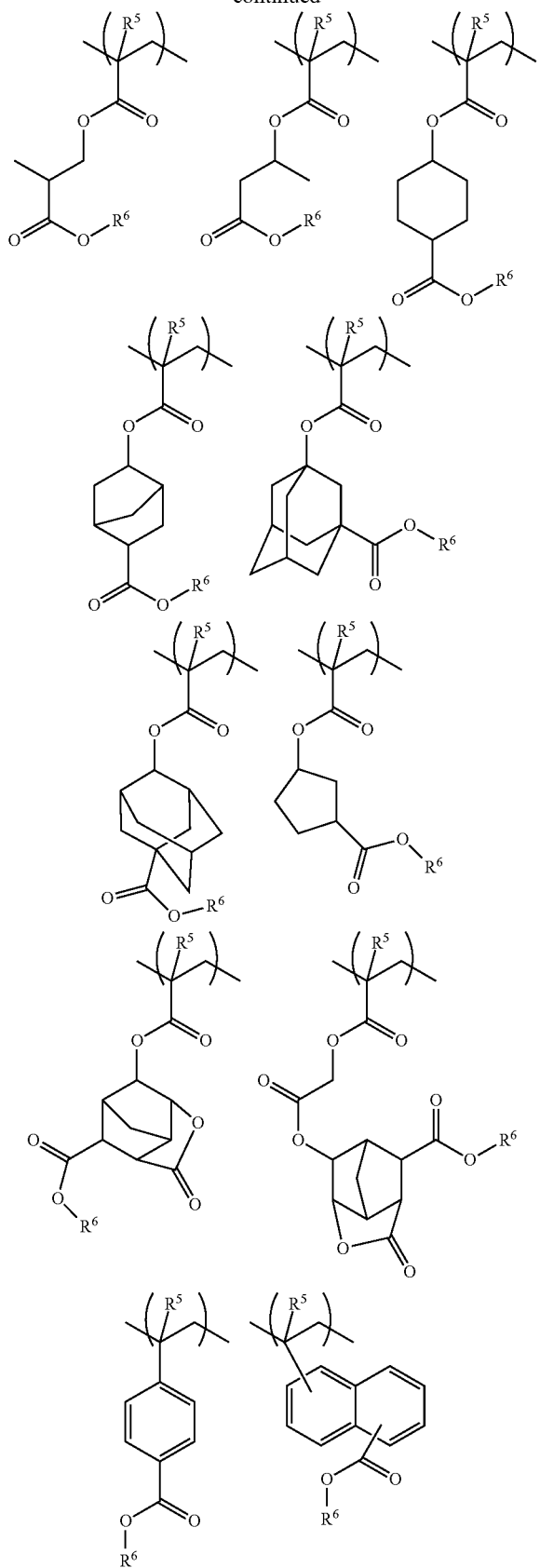

Herein R⁵ and R⁶ are as defined above.

The acid labile groups represented by $R^1$ in formula (1), i.e., basic compound and $R^6$ and $R^8$ in the recurring units (a1) and (a2) may be selected from a variety of such groups. The acid labile groups may be the same or different and preferably include groups of the following formulae (A-1) to (A-3).

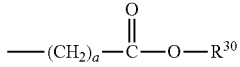

(A-1)

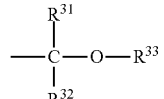

(A-2)

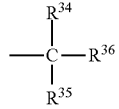

(A-3)

In formula (A-1), $R^{30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are test-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter "a" is an integer of 0 to 6.

In formula (A-2), $R^{31}$ and $R^{32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

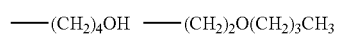

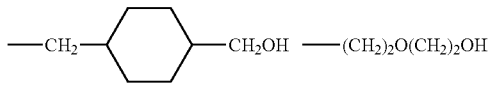

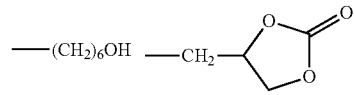

A pair of $R^{31}$ and $R^{32}$, $R^{31}$ and $R^{33}$, or $R^{32}$ and $R^{33}$ may bond together to form a ring with the carbon and oxygen atoms to which they are attached. Each of $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

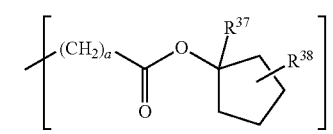
(A-1)-1

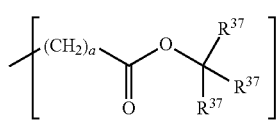
(A-1)-2

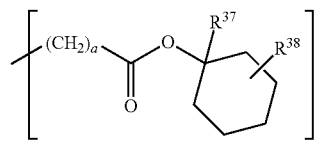
(A-1)-3

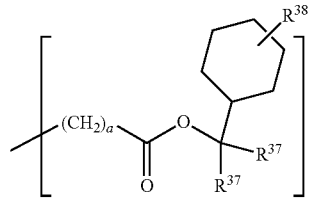
(A-1)-4

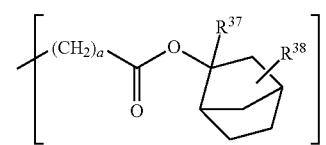
(A-1)-5

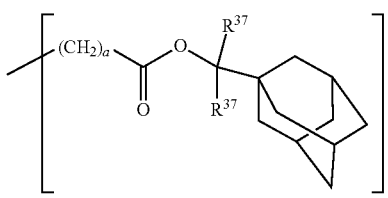
(A-1)-6

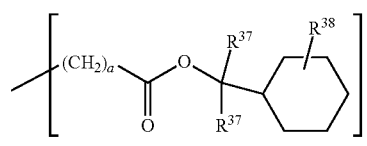
(A-1)-7

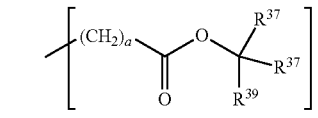
(A-1)-8

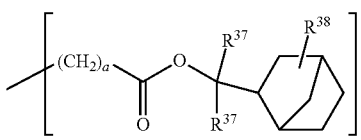
(A-1)-9

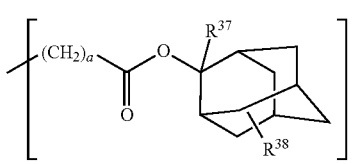
(A-1)-10

Herein $R^{37}$ is each independently a straight, branched or cyclic $C_1$-$C_{10}$ alkyl group or $C_6$-$C_{20}$ aryl group, $R^{38}$ is hydrogen or a straight, branched or cyclic $C_1$-$C_{10}$ alkyl group, $R^{39}$ is each independently a straight, branched or cyclic $C_2$-$C_{10}$ alkyl group or $C_6$-$C_{20}$ aryl group, and "a" is an integer of 0 to 6.

Of the acid labile groups of formula (A-2), the straight and branched ones are exemplified by the following groups having formulae (A-2)-1 to (A-2)-72.

—CH$_2$—O—CH$_3$     (A-2)-1

—CH$_2$—O—CH$_2$—CH$_3$     (A-2)-2

—CH$_2$—O—(CH$_2$)$_2$—CH$_3$     (A-2)-3

—CH$_2$—O—(CH$_2$)$_3$—CH$_3$     (A-2)-4

(A-2)-5

(A-2)-6

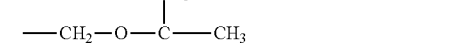
(A-2)-7

(A-2)-8

(A-2)-9

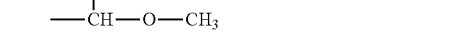
(A-2)-10

(A-2)-11

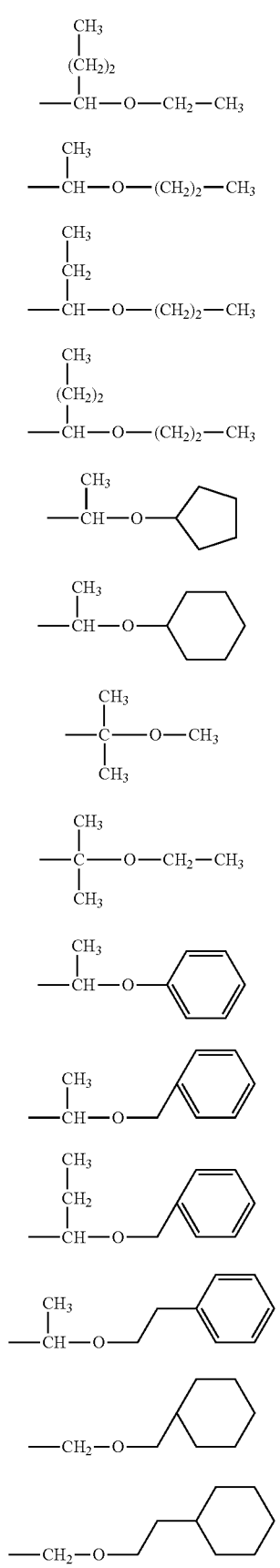
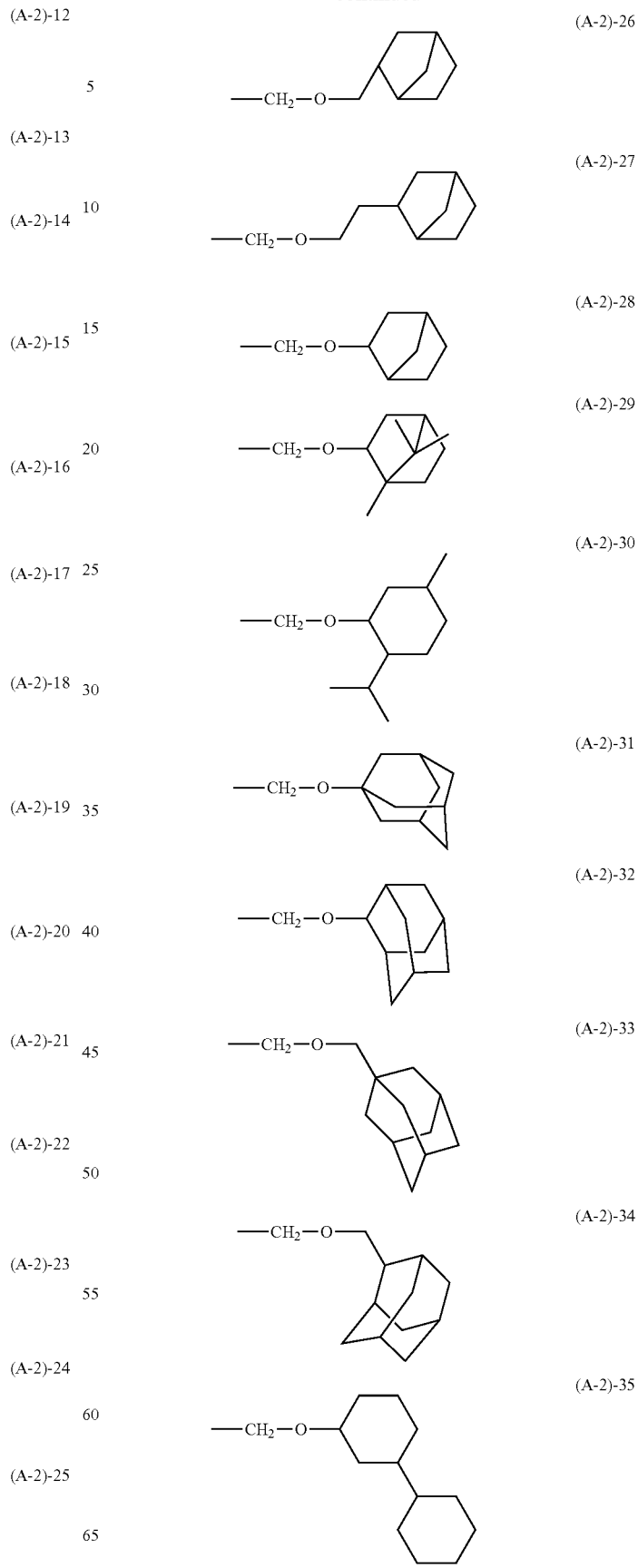

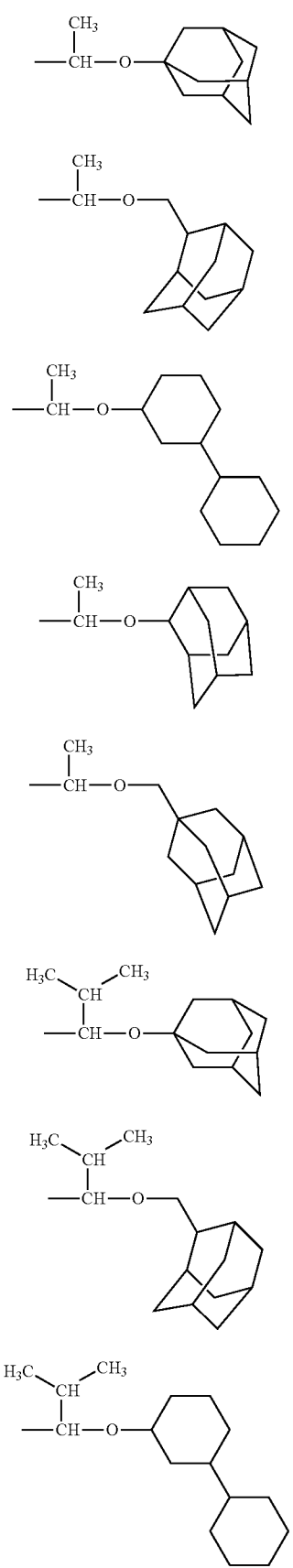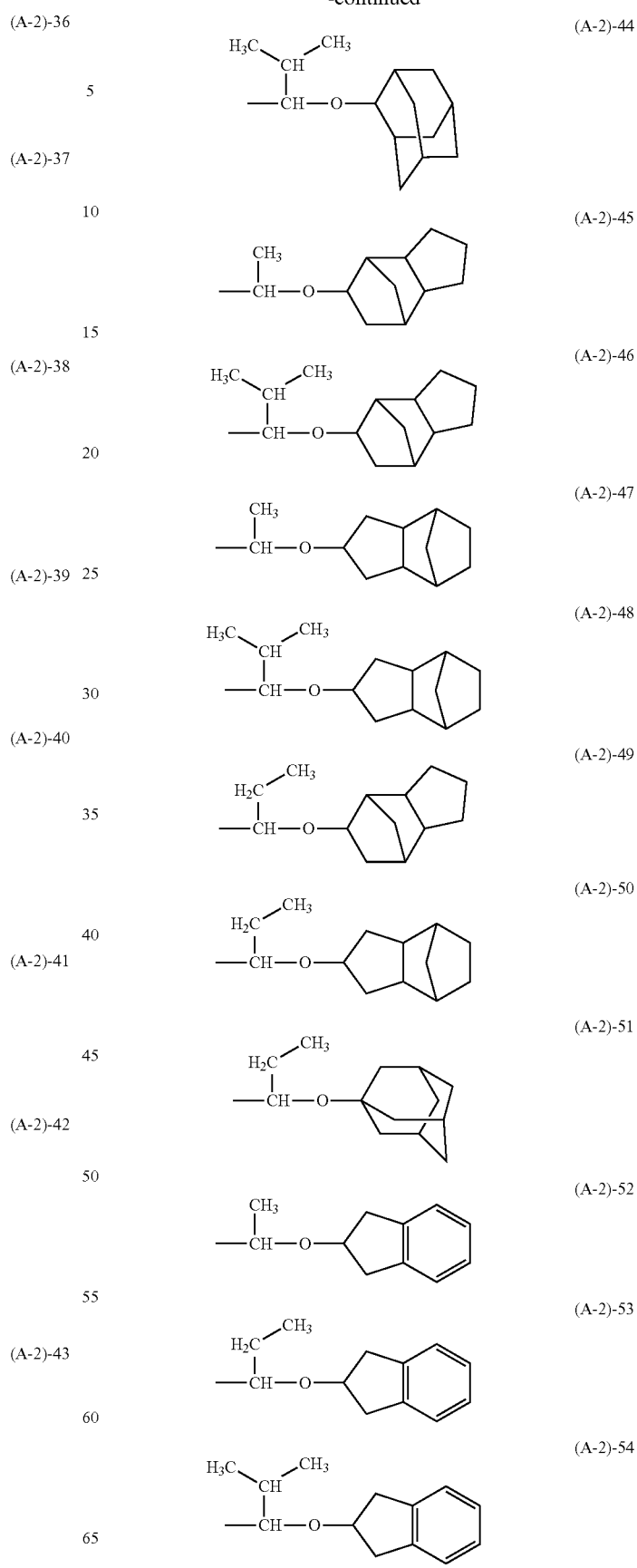

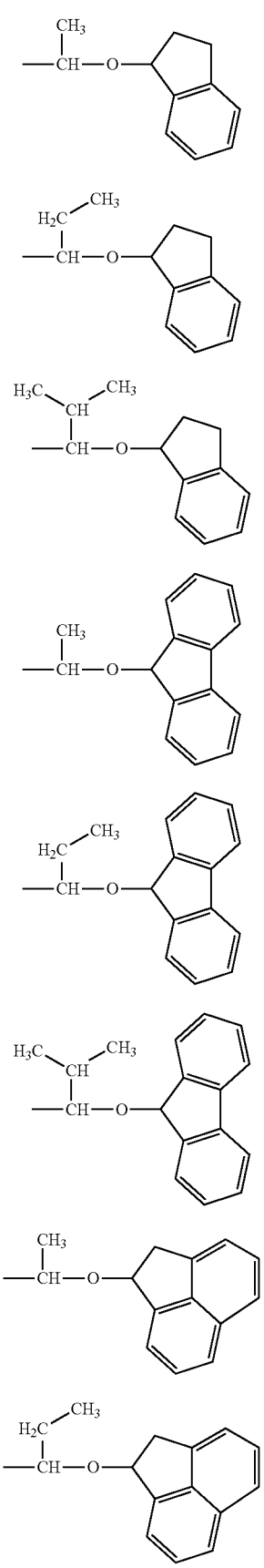
(A-2)-55
(A-2)-56
(A-2)-57
(A-2)-58
(A-2)-59
(A-2)-60
(A-2)-61
(A-2)-62
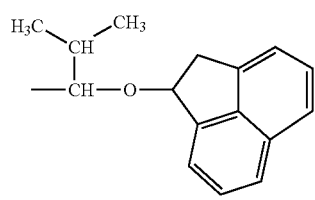
(A-2)-63
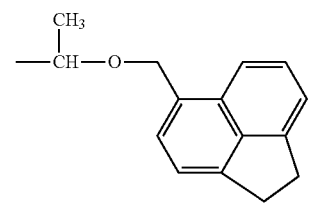
(A-2)-64
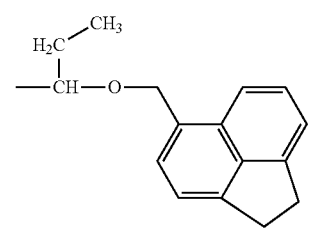
(A-2)-65
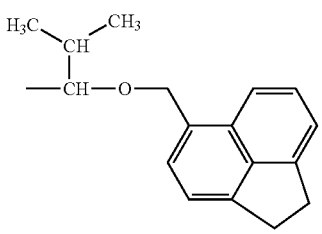
(A-2)-66
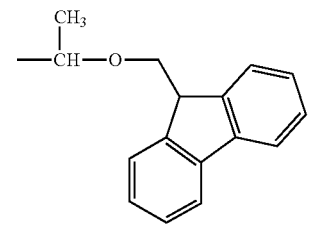
(A-2)-67
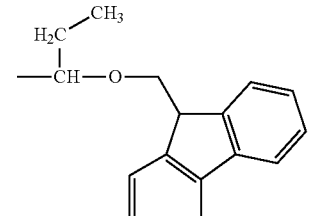
(A-2)-68
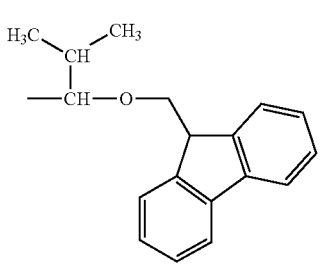
(A-2)-69

(A-2)-70

[Structure: —CH(CH3)—O—CH2— attached to fluorene]

(A-2)-71

[Structure: —CH(CH2CH3)(CH3... )—O—CH2— attached to fluorene, with H2C and CH3 branches]

(A-2)-72

[Structure: —CH(—O—CH2—fluorene)— with isopropyl H3C, CH3 group]

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

$$\begin{array}{c}\text{(A-2a)}\\ -[\overset{R^{40}}{\underset{R^{41}}{C}}-(O-R^{42})_{b1}-O-A-(O-(R^{42}-O)_{d1}-\overset{R^{40}}{\underset{R^{41}}{C}}-]_{c1}\end{array}$$

$$\begin{array}{c}\text{(A-2b)}\\ -[\overset{R^{40}}{\underset{R^{41}}{C}}-O-R^{42}-B-A-[B-(R^{42}-O)_{d1}-\overset{R^{40}}{\underset{R^{41}}{C}}-]_{c1}\end{array}$$

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring. $R^{42}$ is a straight, branched or cyclic $C_1$-$C_{10}$ alkylene group. Each of b1 and d1 is 0 or an integer of 1 to 10, preferably 0 or an integer of 1 to 5, and c1 is an integer of 1 to 7. "A" is a (c1+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some of the hydrogen atoms attached to carbon atoms may be substituted by hydroxyl, carboxyl, acyl radicals or halogen atoms. The subscript c1 is preferably an integer of 1 to 3.

The crosslinking acetal groups of formulae (A-2a) and (A-2b) are exemplified by the following formulae (A-2)-73 through (A-2)-80.

(A-2)-73

—CH(CH3)—O—CH2CH2—O—CH(CH3)—

(A-2)-74

—CH(CH3)—O—[cyclohexane-1,4-diyl]—O—CH(CH3)—

(A-2)-75

—CH(CH3)—O—CH2CH2CH2CH2—O—CH(CH3)—

(A-2)-76

—CH(CH3)—O—CH2CH2OCH2CH2OCH2CH2—O—CH(CH3)—

(A-2)-77

—CH(CH3)—O—CH2CH2O—[1,3-phenylene]—OCH2CH2—O—CH(CH3)—

(A-2)-78

—CH(CH3)—O—CH2CH2O—[furan-3,4-diyl]—OCH2CH2—O—CH(CH3)—

(A-2)-79

—CH(CH3)—O—CH2CH2O—[1,3,5-benzenetriyl]—(OCH2CH2—O—CH(CH3)—)3

(A-2)-80

—CH(CH3)—O—CH2CH2O—[C6H4]—C(CH3)2—[C6H4]—OCH2CH2—O—CH(CH3)—

In formula (A-3), $R^{34}$, $R^{35}$ and $R^{36}$ each are hydrogen, or a monovalent hydrocarbon group, typically a straight, branched or cyclic $C_1$-$C_{20}$ alkyl group, aryl group or alkenyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

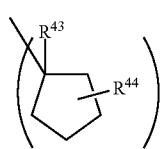 (A-3)-1
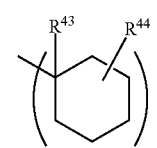 (A-3)-2
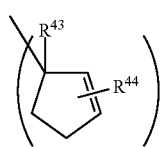 (A-3)-3
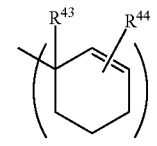 (A-3)-4
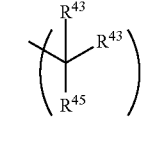 (A-3)-5
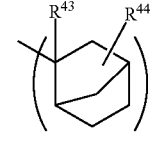 (A-3)-6
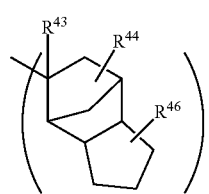 (A-3)-7
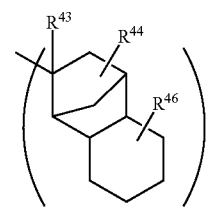 (A-3)-8
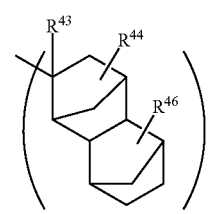 (A-3)-9
-continued
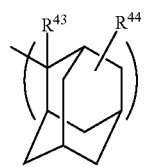 (A-3)-10
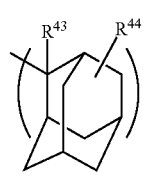 (A-3)-11
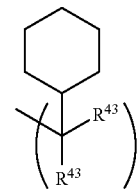 (A-3)-12
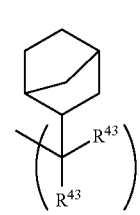 (A-3)-13
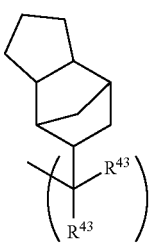 (A-3)-14
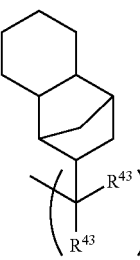 (A-3)-15
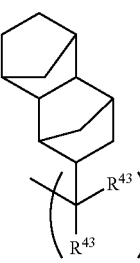 (A-3)-16

-continued (A-3)-17

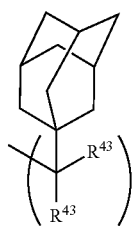

(A-3)-18

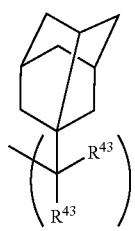

Herein $R^{43}$ is each independently a straight, branched or cyclic $C_1$-$C_8$ alkyl group or $C_6$-$C_{20}$ aryl group, typically phenyl or naphthyl. $R^{44}$ and $R^{46}$ each are hydrogen or a straight, branched or cyclic $C_1$-$C_{20}$ alkyl group. $R^{45}$ is a $C_6$-$C_{20}$ aryl group, typically phenyl.

The polymer may be crosslinked within the molecule or between molecules with groups having $R^{47}$ which is a di- or multi-valent alkylene or arylene group, as shown by the following formulae (A-3)-19 and (A-3)-20.

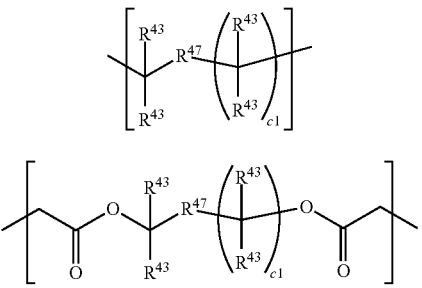

(A-3)-19

(A-3)-20

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

Examples of $R^{30}$, $R^{33}$ and $R^{36}$ in formulae (A-1), (A-2) and (A-3) include substituted or unsubstituted aryl groups such as phenyl, p-methylphenyl, p-ethylphenyl, and alkoxy-substituted phenyl groups, typically p-methoxyphenyl, and aralkyl groups such as benzyl and phenethyl, and modified forms of the foregoing groups in which an oxygen atom is introduced, and modified forms of alkyl groups in which a carbon-bonded hydrogen atom is replaced by a hydroxyl radical, or oxoalkyl groups in which two hydrogen atoms are replaced by an oxygen atom to form a carbonyl group, as represented by the following formulae.

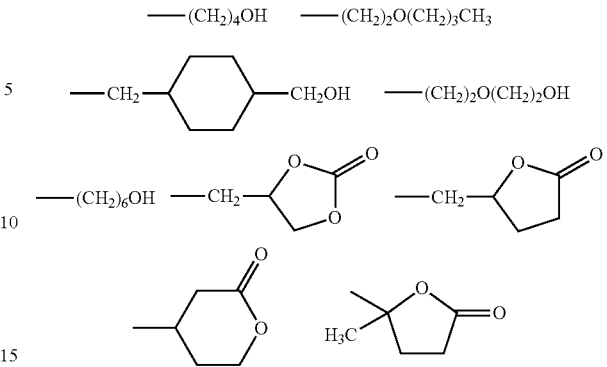

Of recurring units having acid labile groups of formula (A-3), recurring units of (meth)acrylate having an exo-form structure represented by the formula (A-3)-21 are preferred.

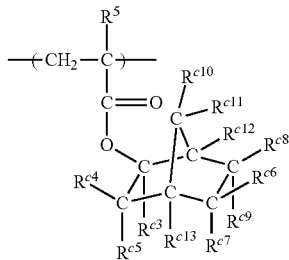

(A-3)-21

Herein, $R^5$ is hydrogen or methyl; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ each are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, and $R^{c7}$ and $R^{c13}$, $R^{c8}$ and $R^{c12}$, $R^{c10}$ and $R^{c11}$, or $R^{c11}$ and $R^{c12}$, taken together, may form a non-aromatic ring with the carbon atom to which they are attached, and in that event, each ring-forming R is a divalent $C_1$-$C_{15}$ hydrocarbon group, typically alkylene which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

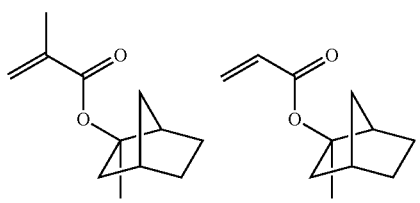

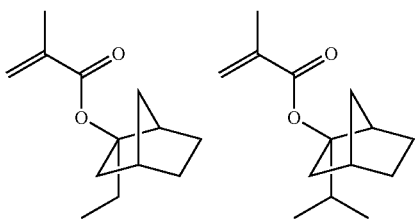
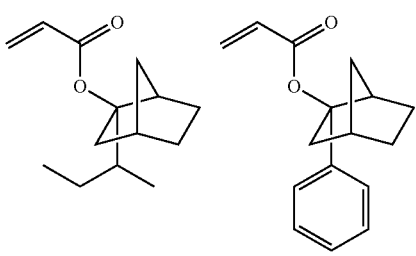
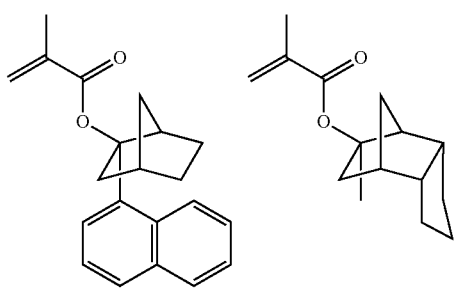
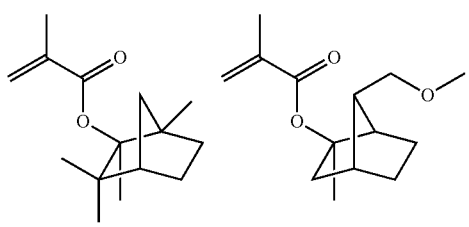
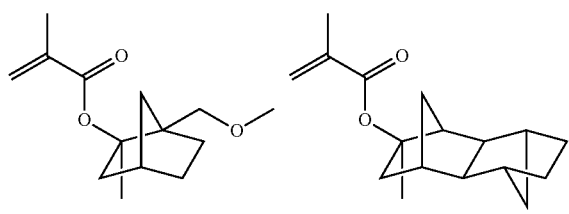
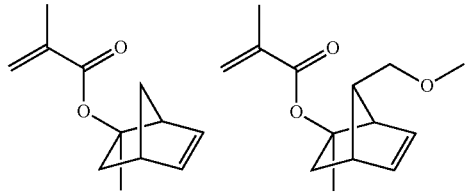
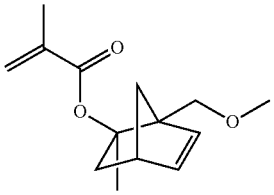

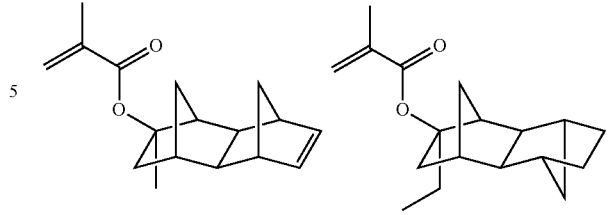
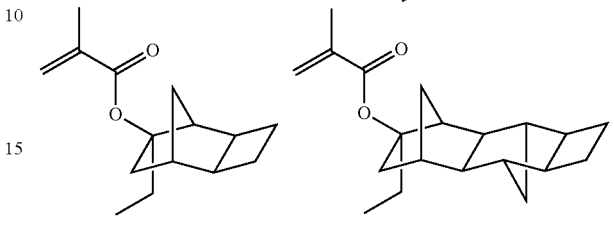

Also included in the acid labile groups of formula (A-3) are acid labile groups of (meth)acrylate having furandiyl, tetrahydrofurandiyl or oxanorbornanediyl as represented by the following formula (A-3)-22.

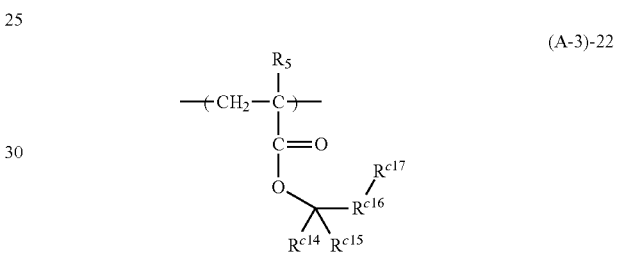

(A-3)-22

Herein, $R^5$ is as defined above. $R^{c14}$ and $R^{c15}$ are each independently a monovalent, straight, branched or cyclic $C_1$-$C_{10}$ hydrocarbon group, or $R^{c14}$ and $R^{c15}$, taken together, may form a $C_3$-$C_8$ aliphatic hydrocarbon ring with the carbon atom to which they are attached. $R^{16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

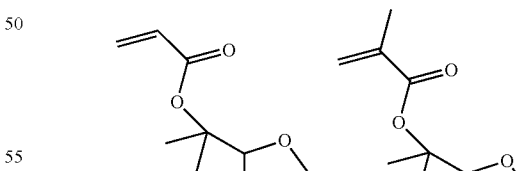
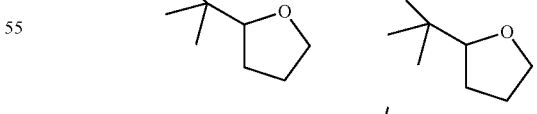
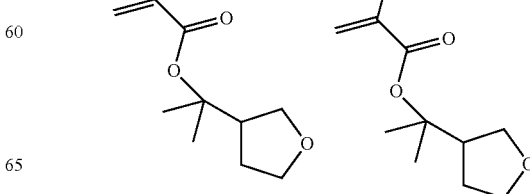

-continued
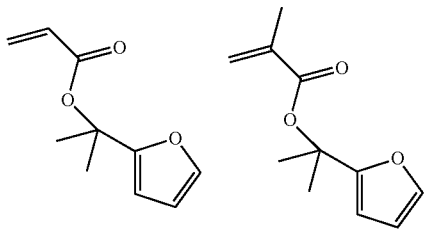
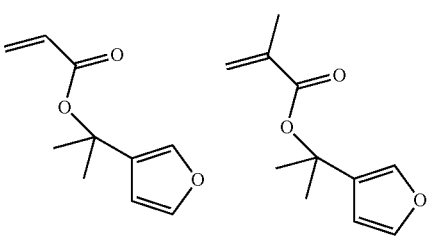
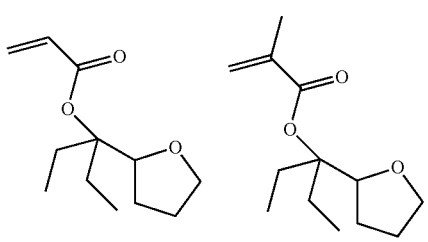
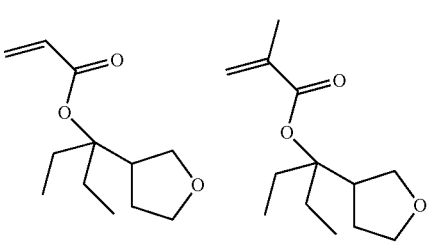
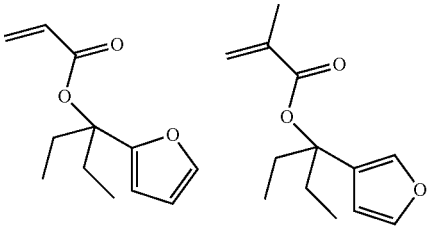
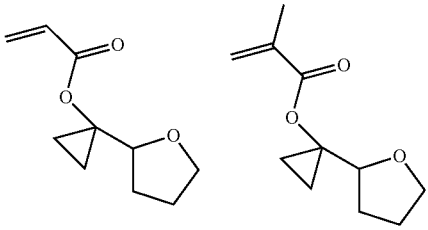
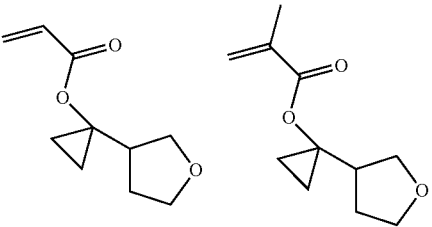
-continued
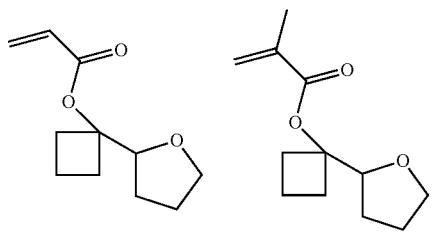
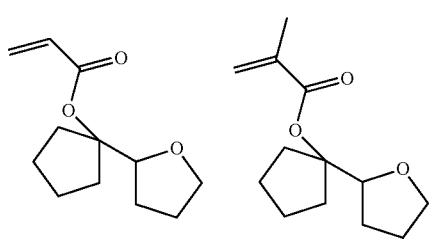
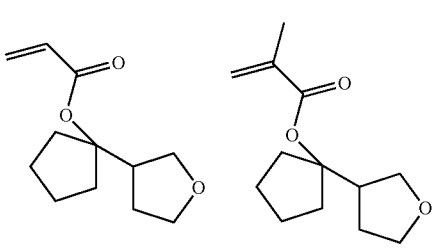
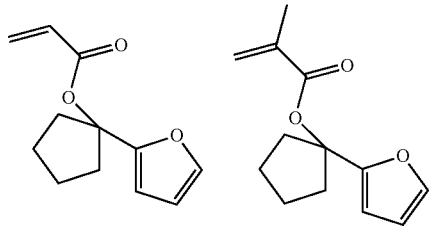
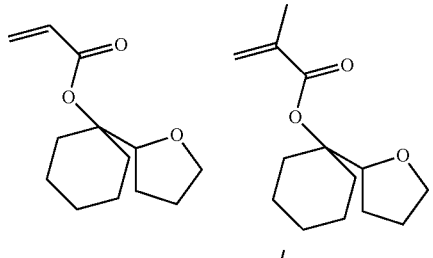
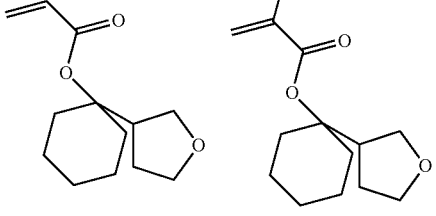
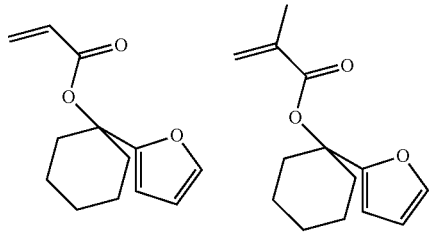

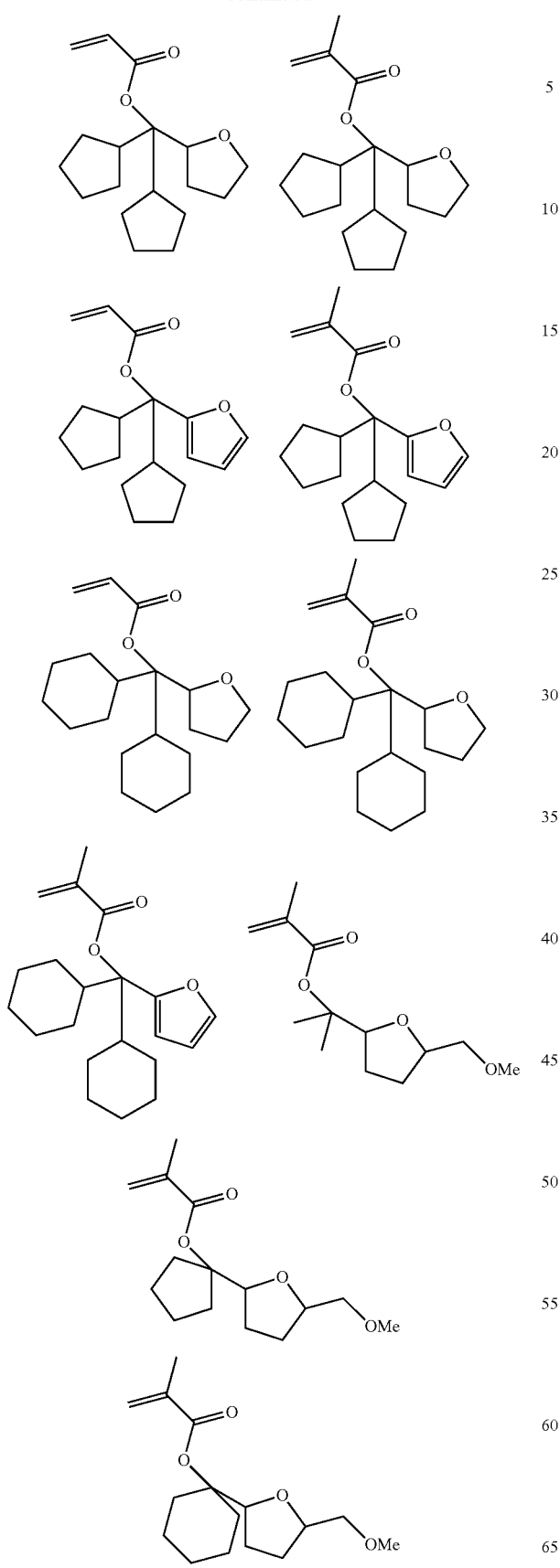
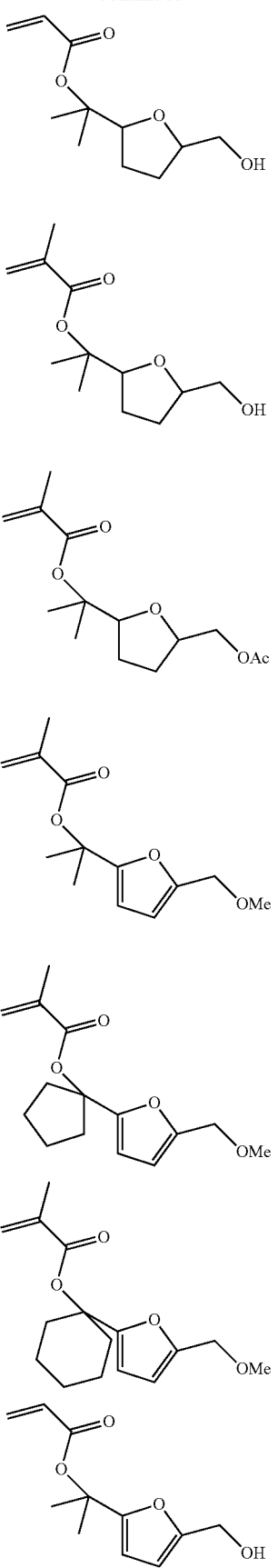

91
-continued
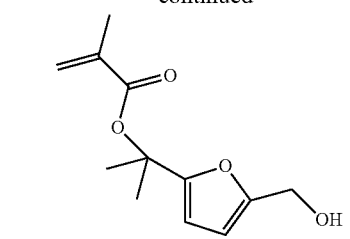
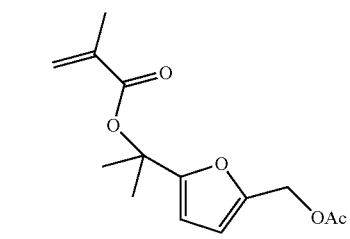
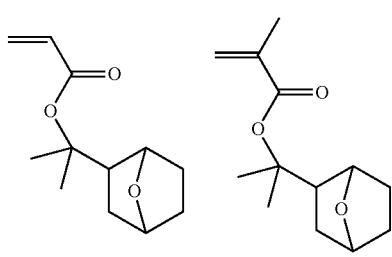
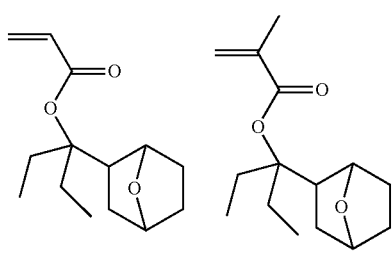
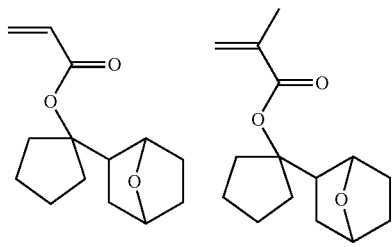
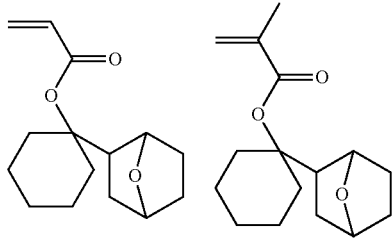
92
-continued
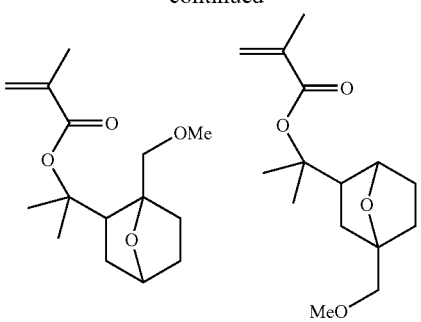
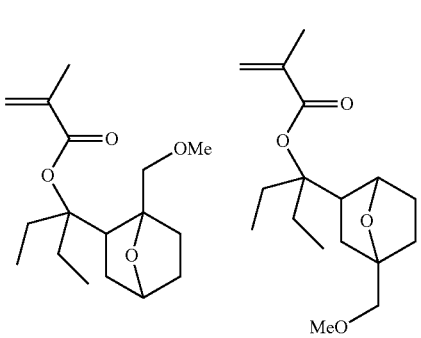
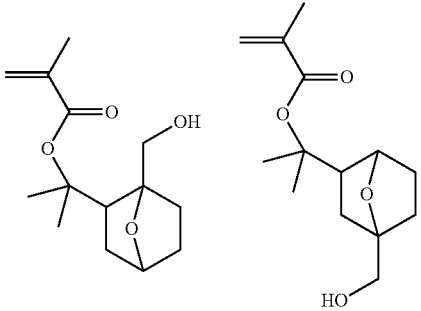
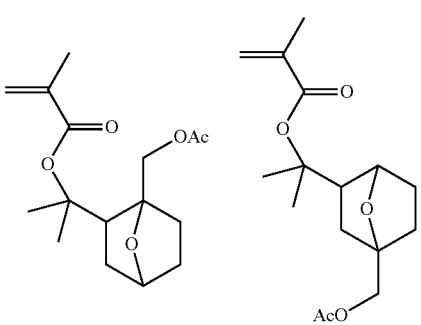
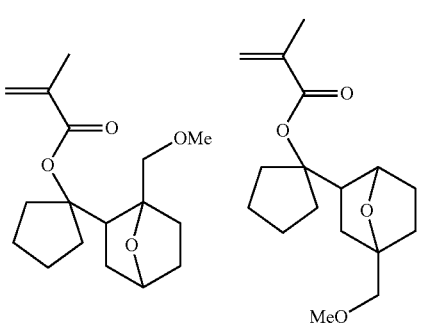

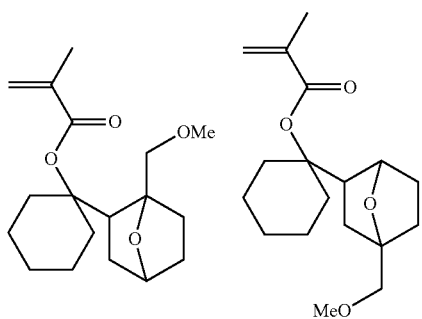
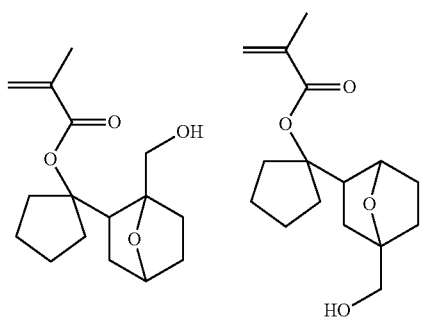
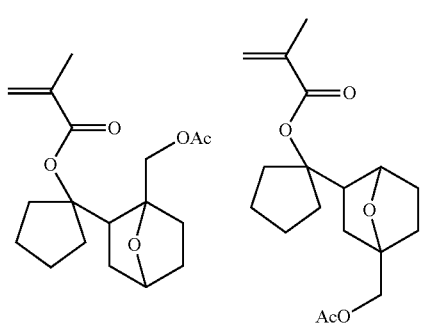 [SMILES: C=C(C)C(=O)OC1(C2CC3CCC2(COC(C)=O)O3)CCCC1 ; C=C(C)C(=O)OC1(C2CC3(COC(C)=O)CCC2O3)CCCC1]
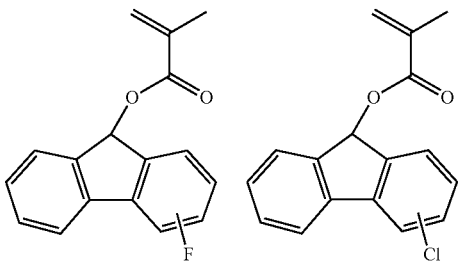
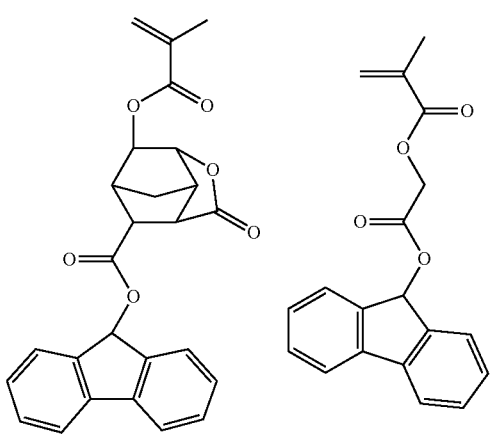
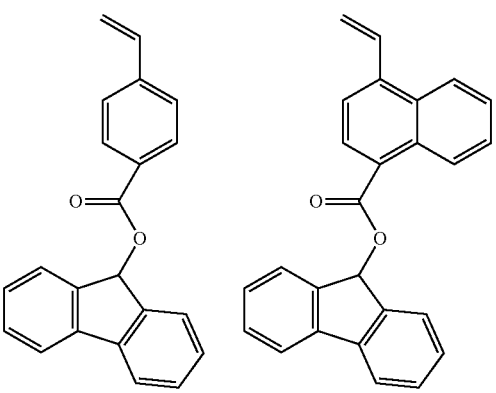
As the recurring units having an acid labile group, recurring units having a secondary acid labile group may also be copolymerized. Examples of suitable monomers from which units having a secondary acid labile group are derived are given below.
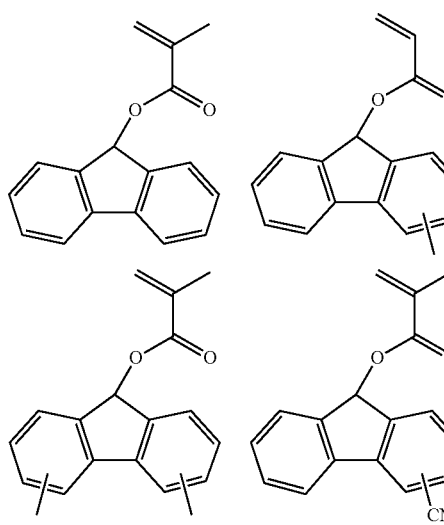

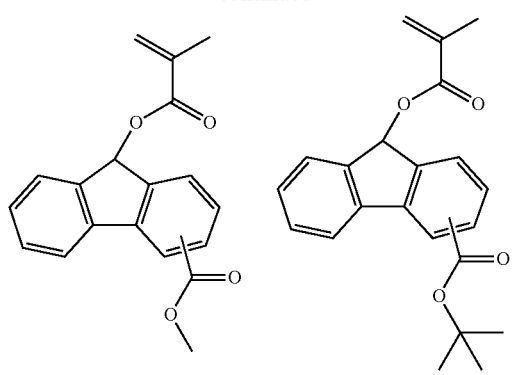
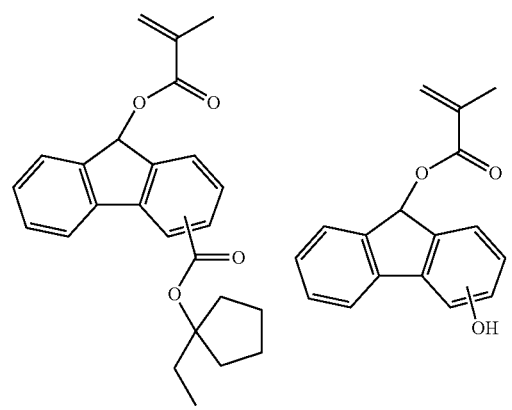
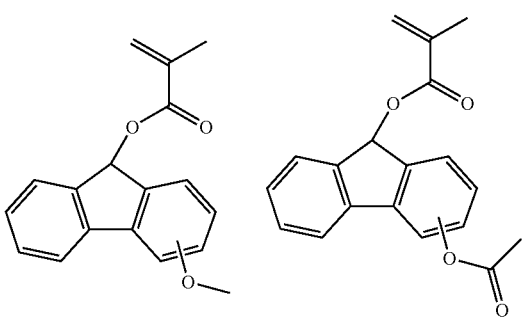
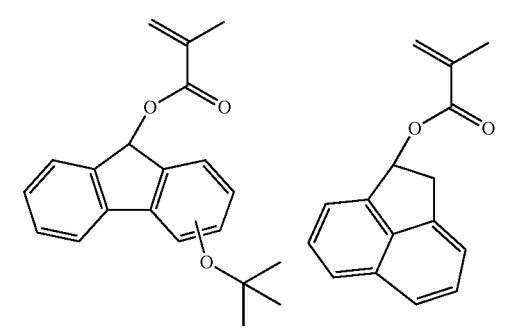
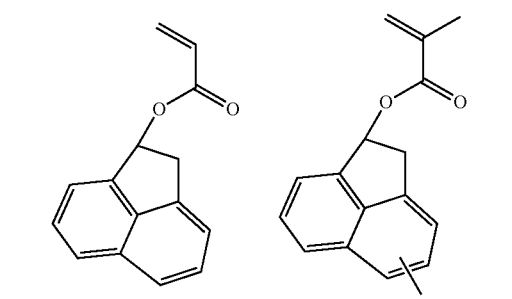
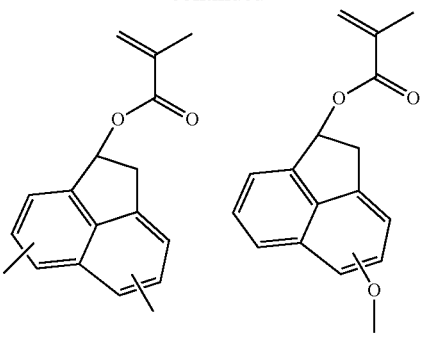
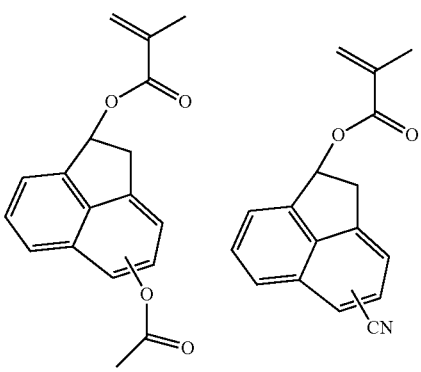
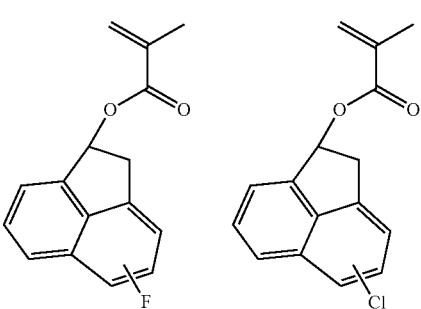
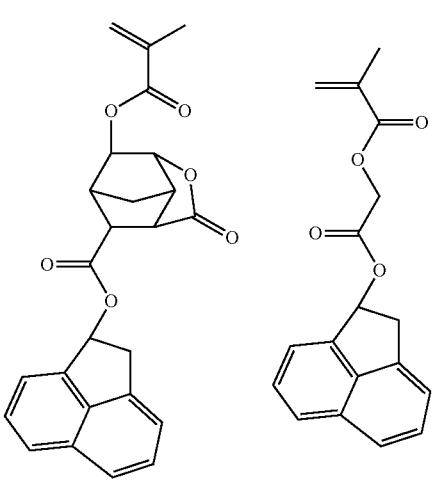

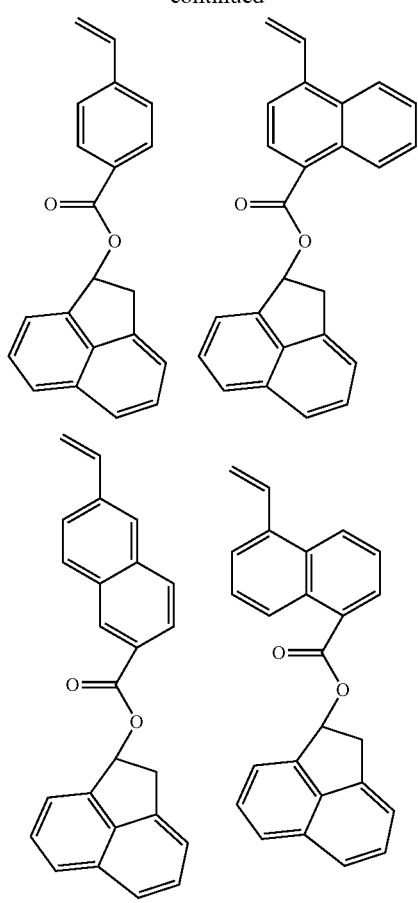

In addition to recurring units (a1) of (meth)acrylate, styrenecarboxylic acid and vinylnaphthalenecarboxylic acid having an acid labile group substituted thereon, and recurring units (a2) of hydroxystyrene having an acid labile group substituted thereon, the base polymer in the chemically amplified positive resist composition may have further copolymerized therein recurring units (b) having a phenolic hydroxyl group as an adhesive group. Examples of suitable monomers from which recurring units (b) having a phenolic hydroxyl group axe derived are given below.

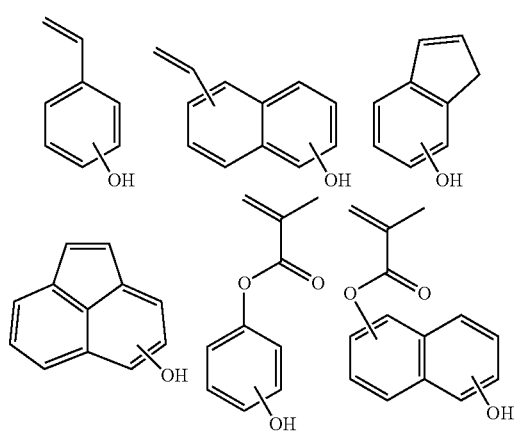

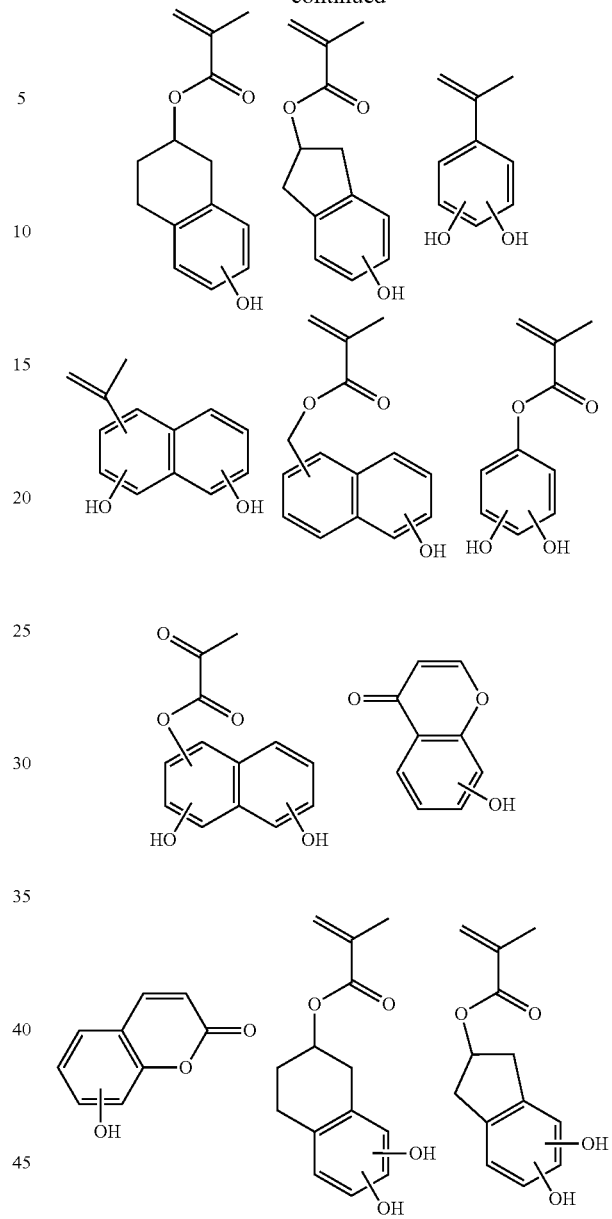

Further, recurring units (c) having another adhesive group selected from hydroxyl, lactone ring, ether, ester, carbonyl and cyano groups may also be copolymerized. Examples of suitable monomers from which recurring units (c) are derived are given below.

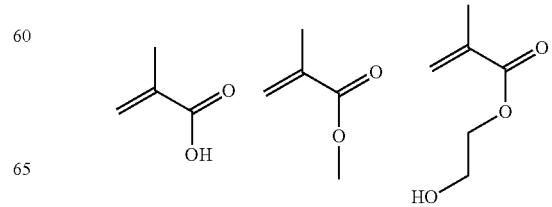

99
-continued
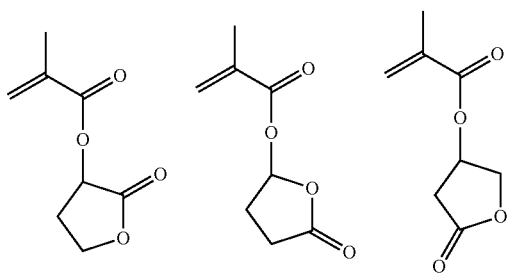
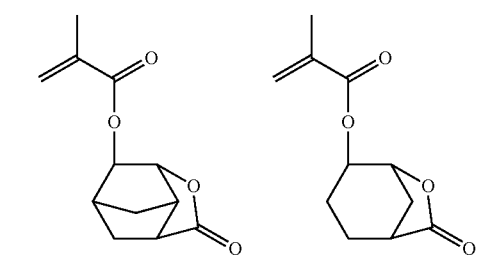
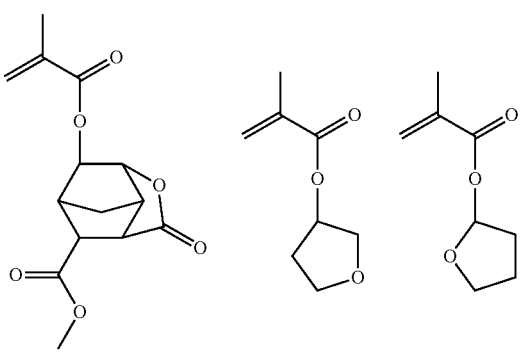
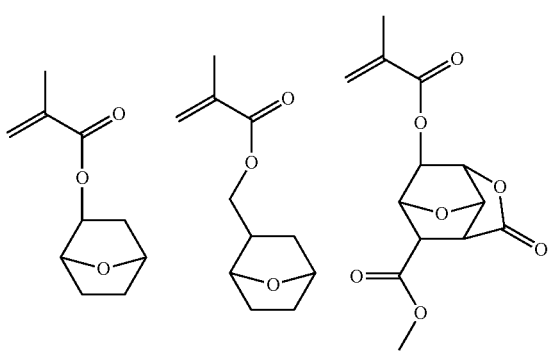
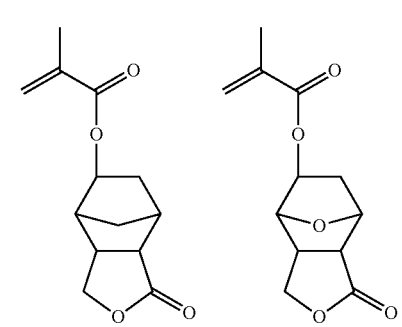
100
-continued
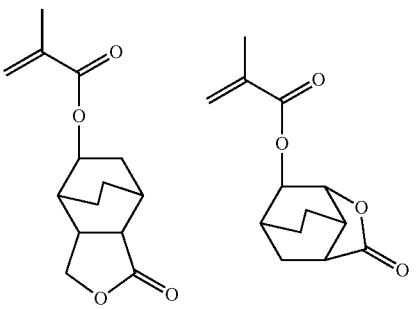
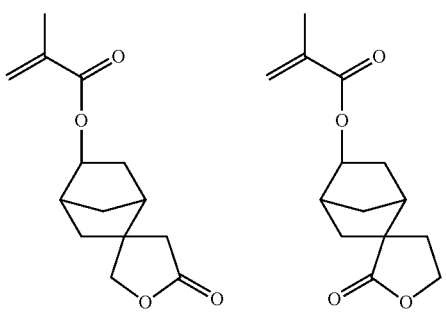
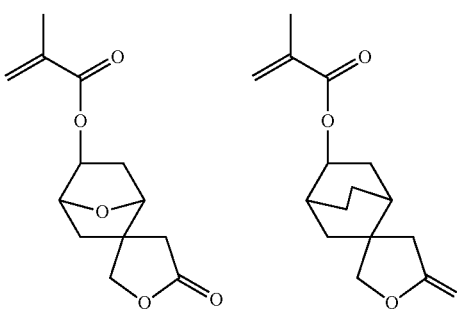
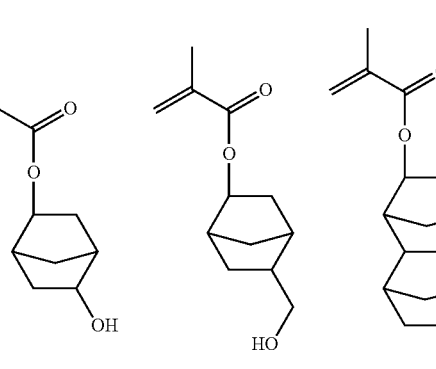
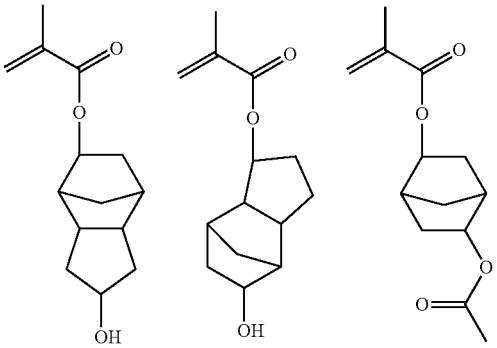

101
-continued
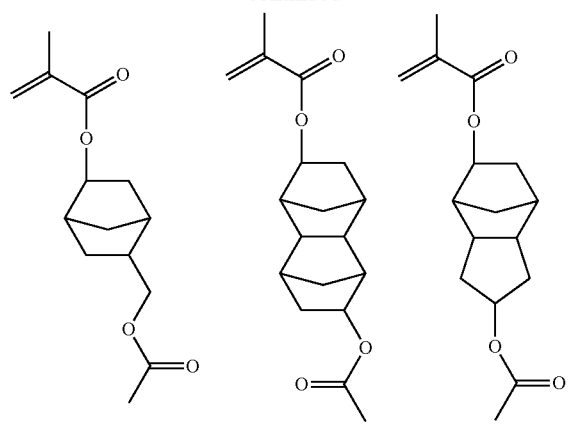
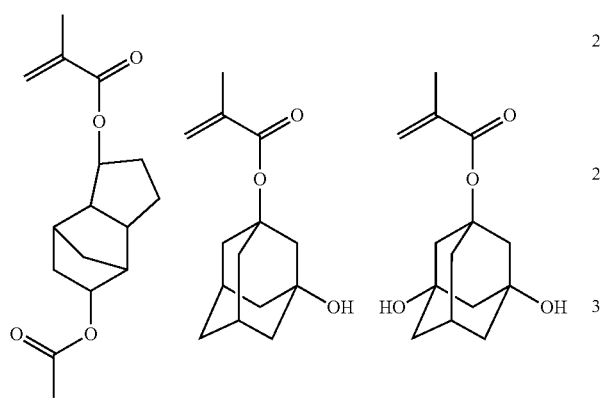
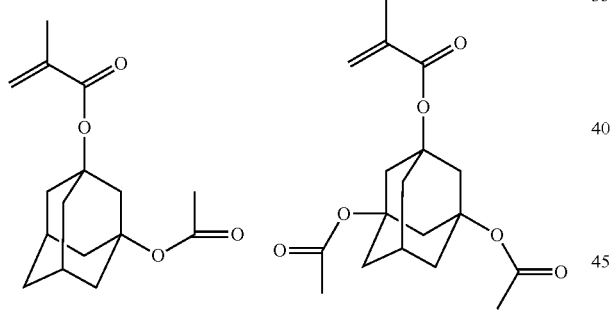
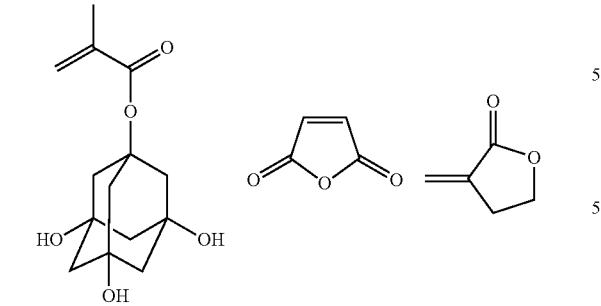
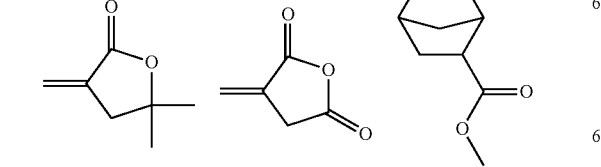
102
-continued
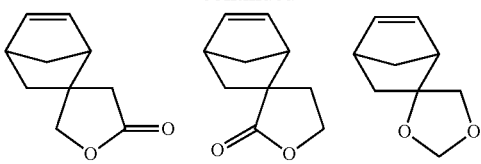
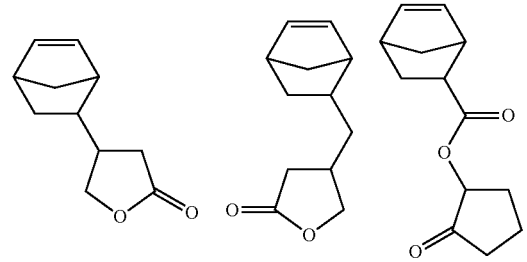
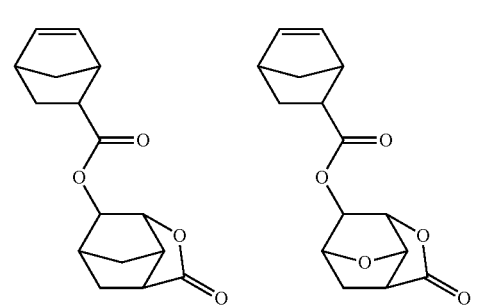
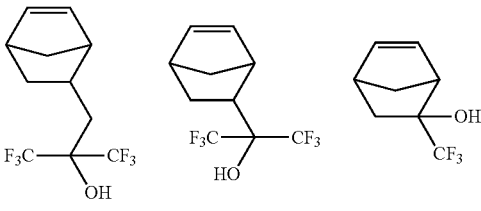
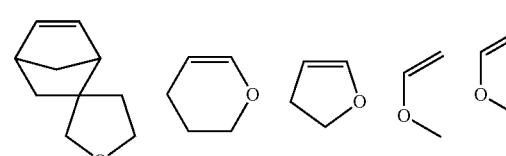
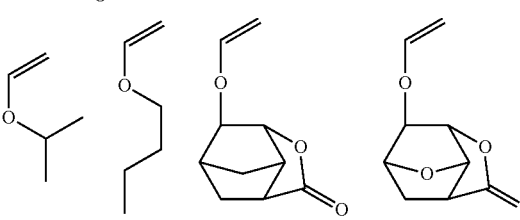
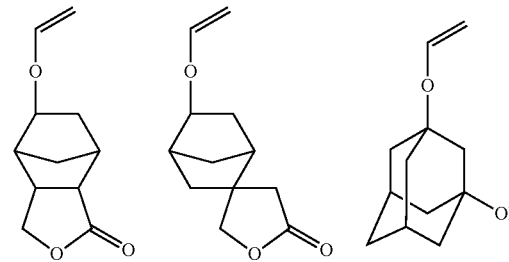

-continued
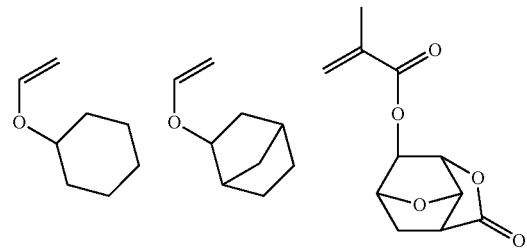
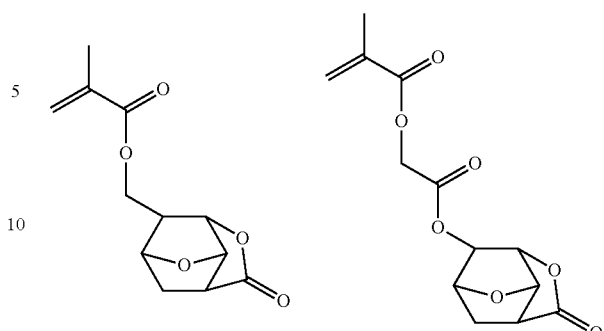
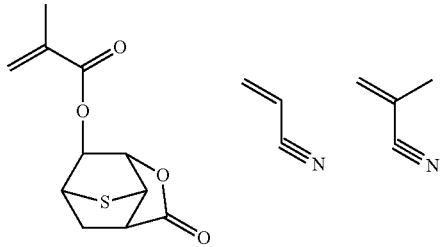
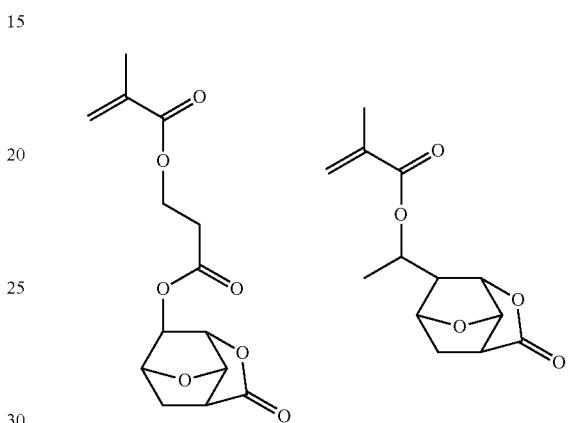
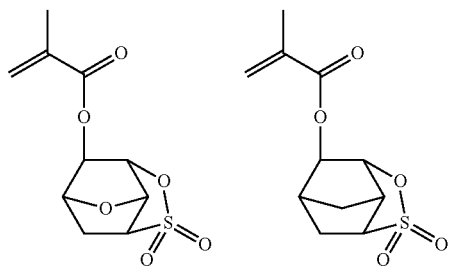
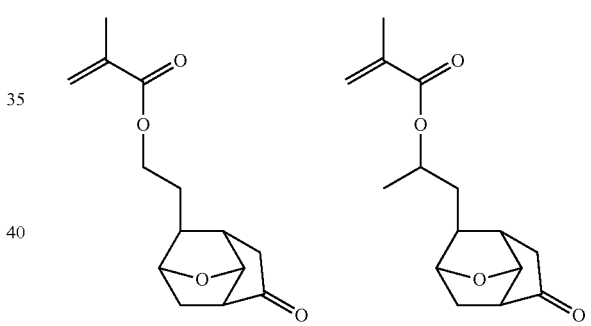
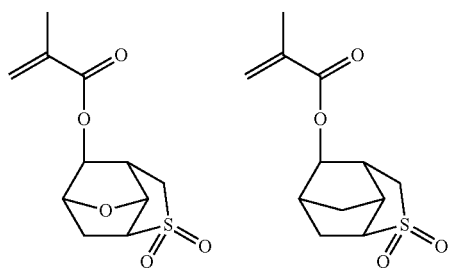
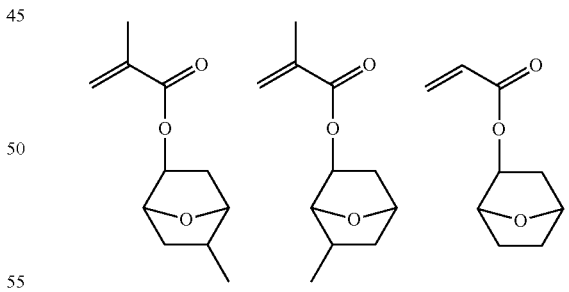
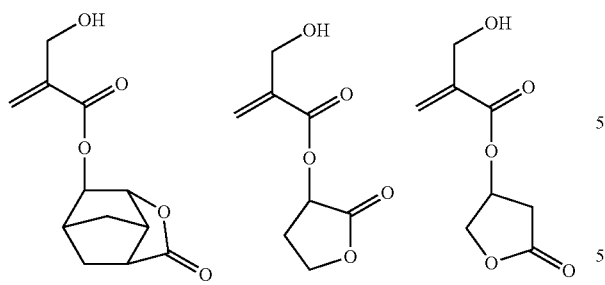
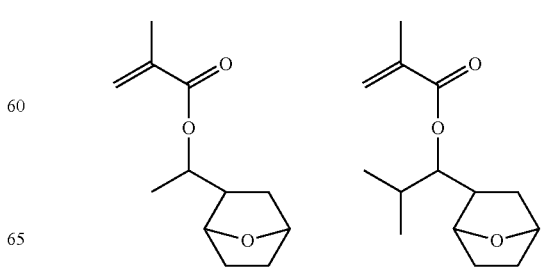
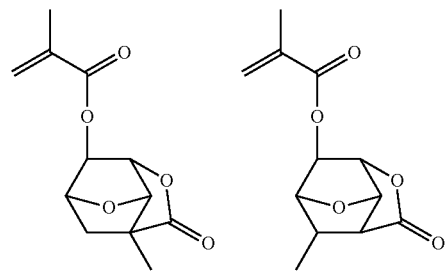

105
-continued
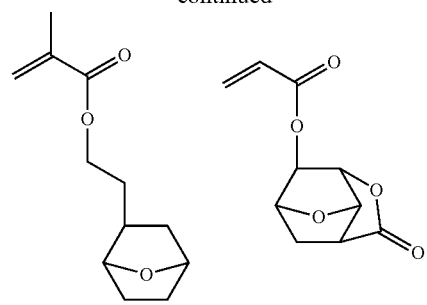
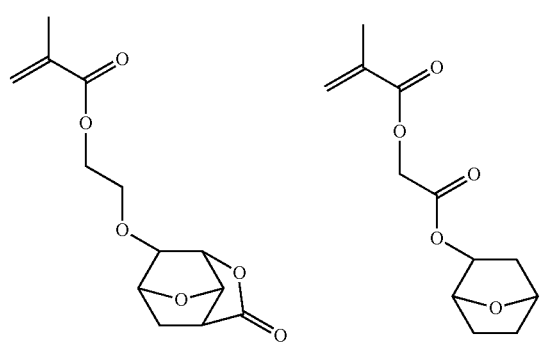
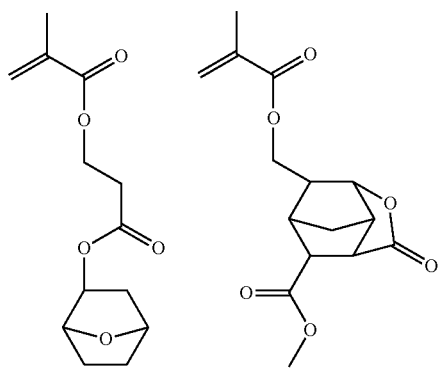
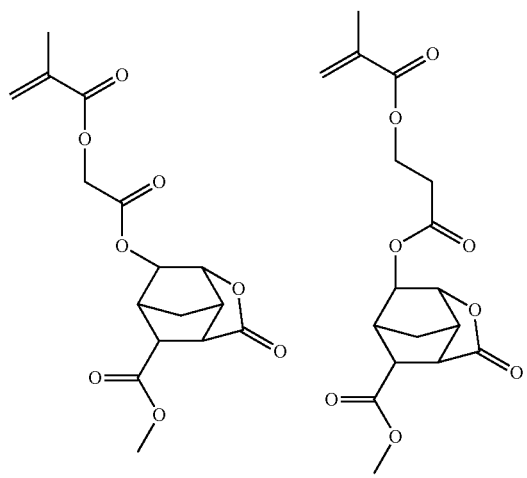
106
-continued
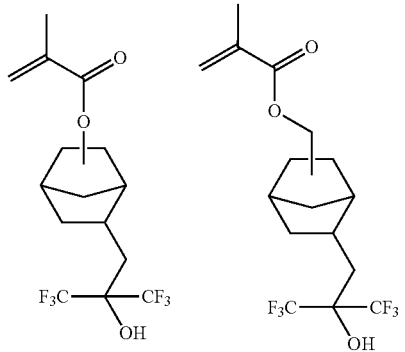
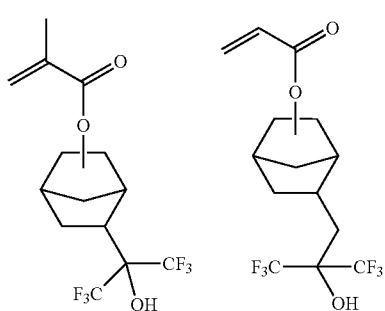
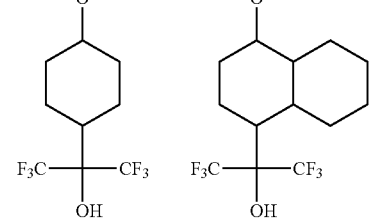
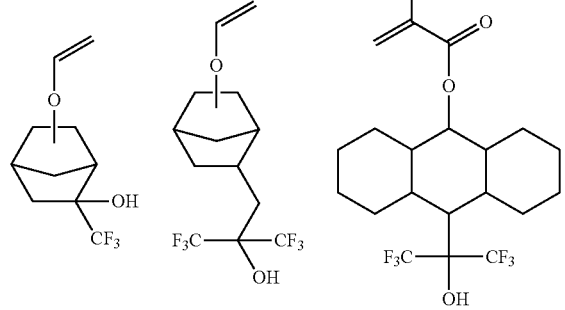

107
-continued
108
-continued
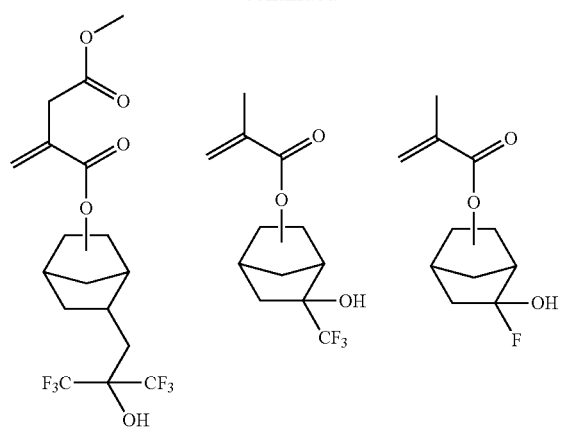
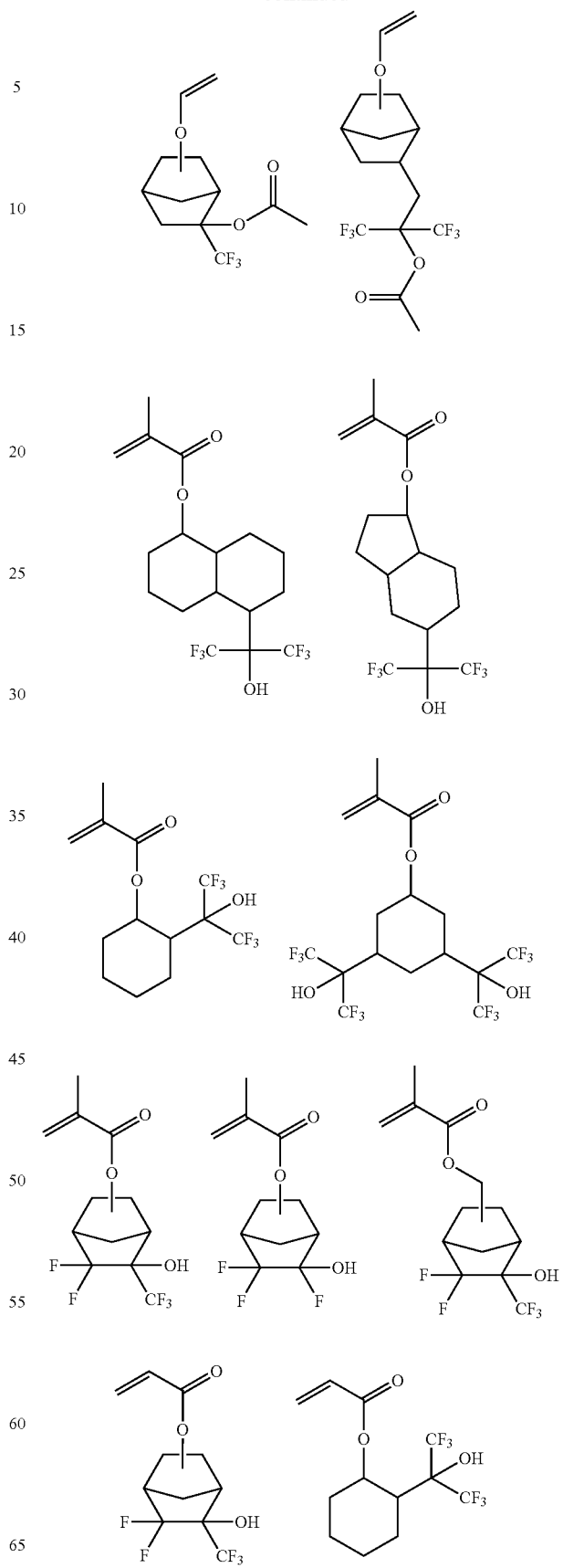

-continued
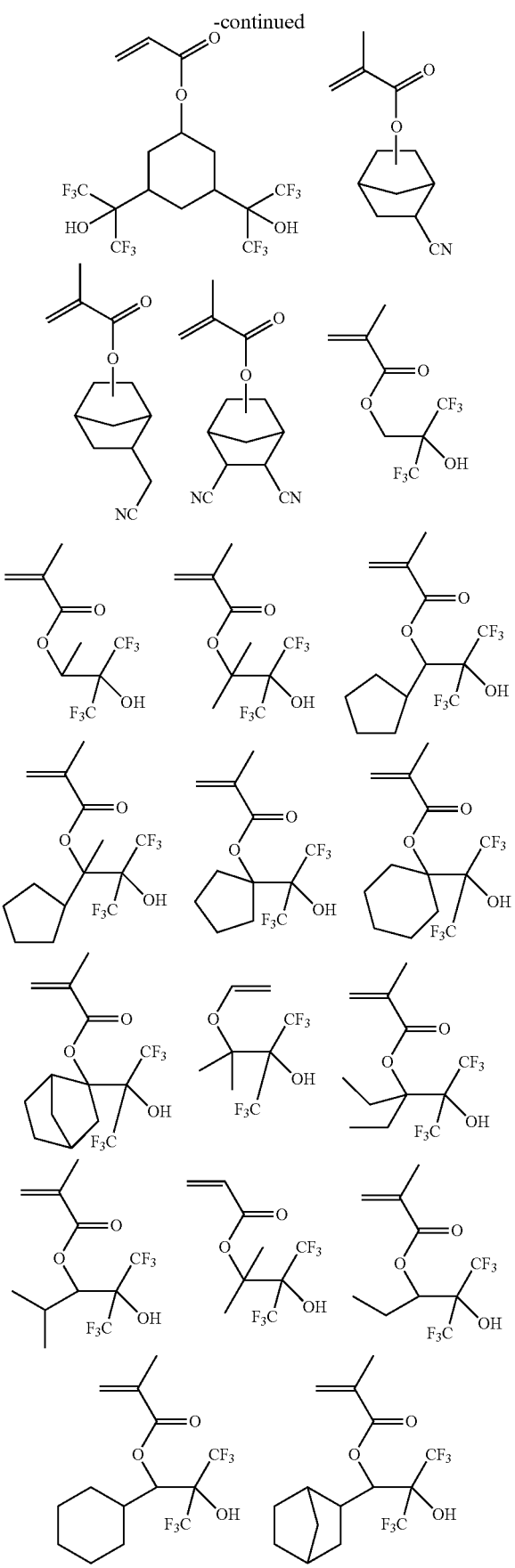
-continued
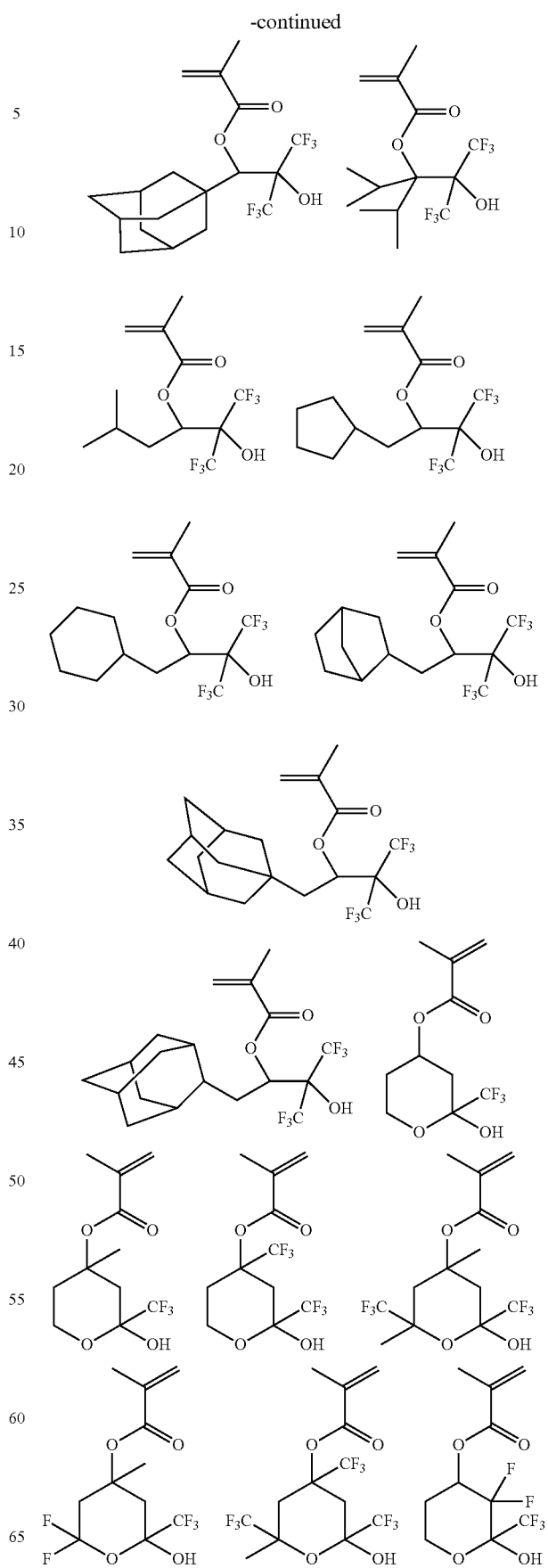

111
-continued
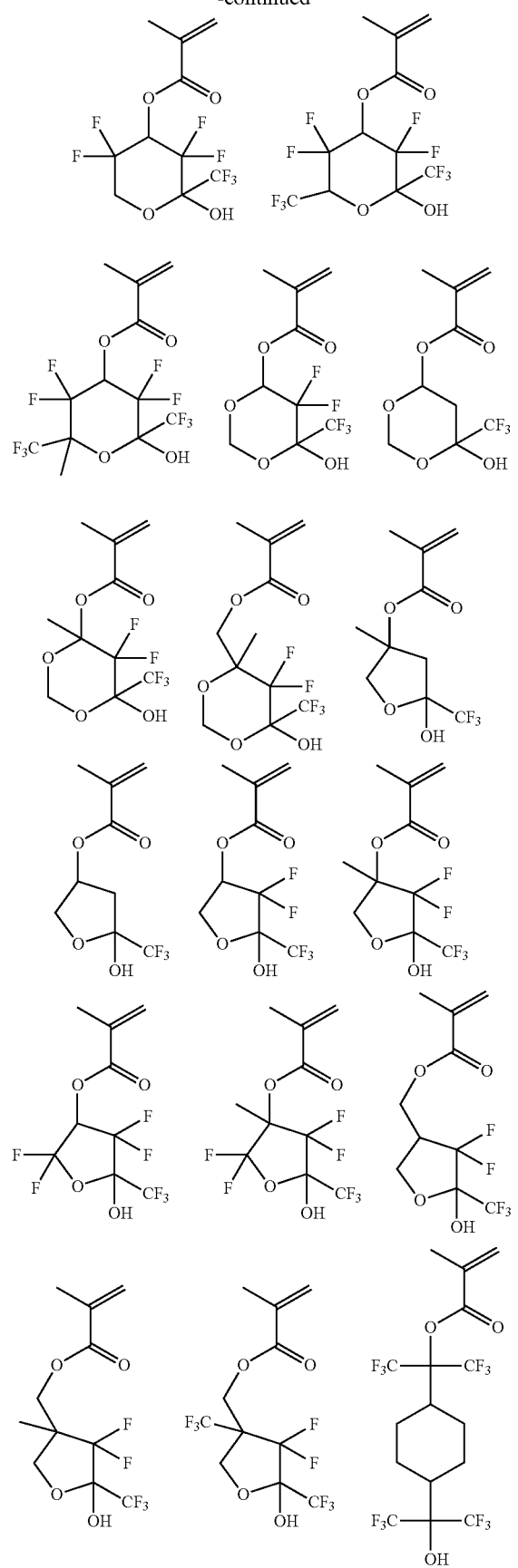
112
-continued
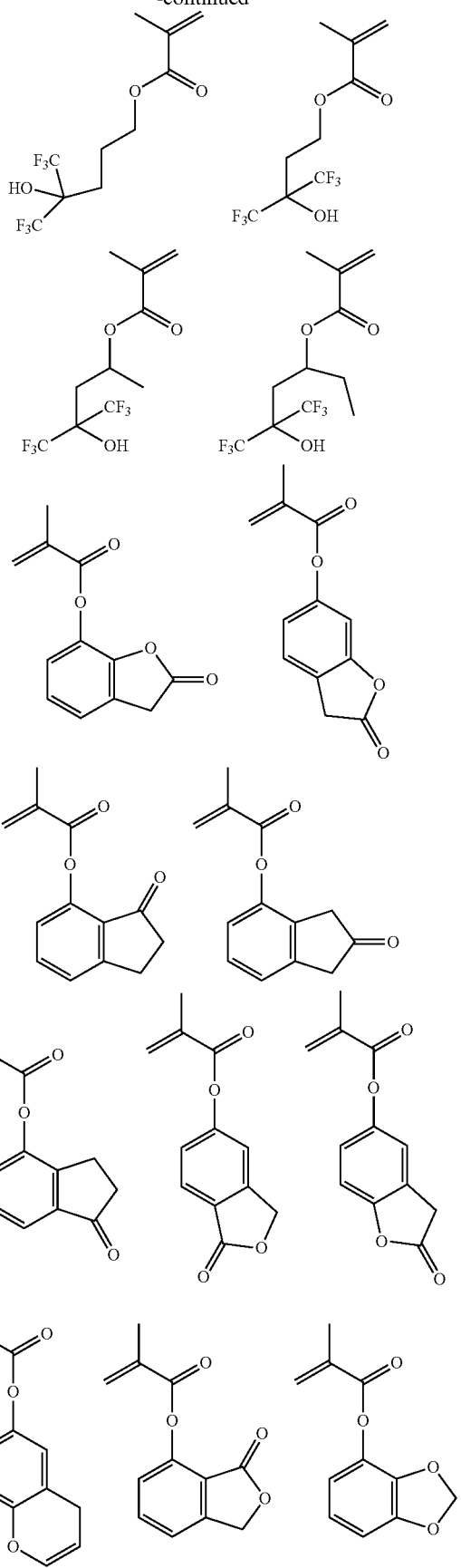

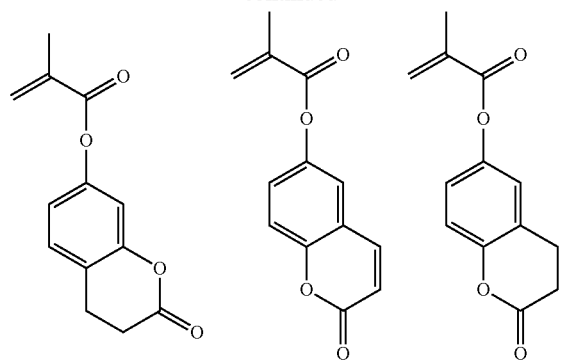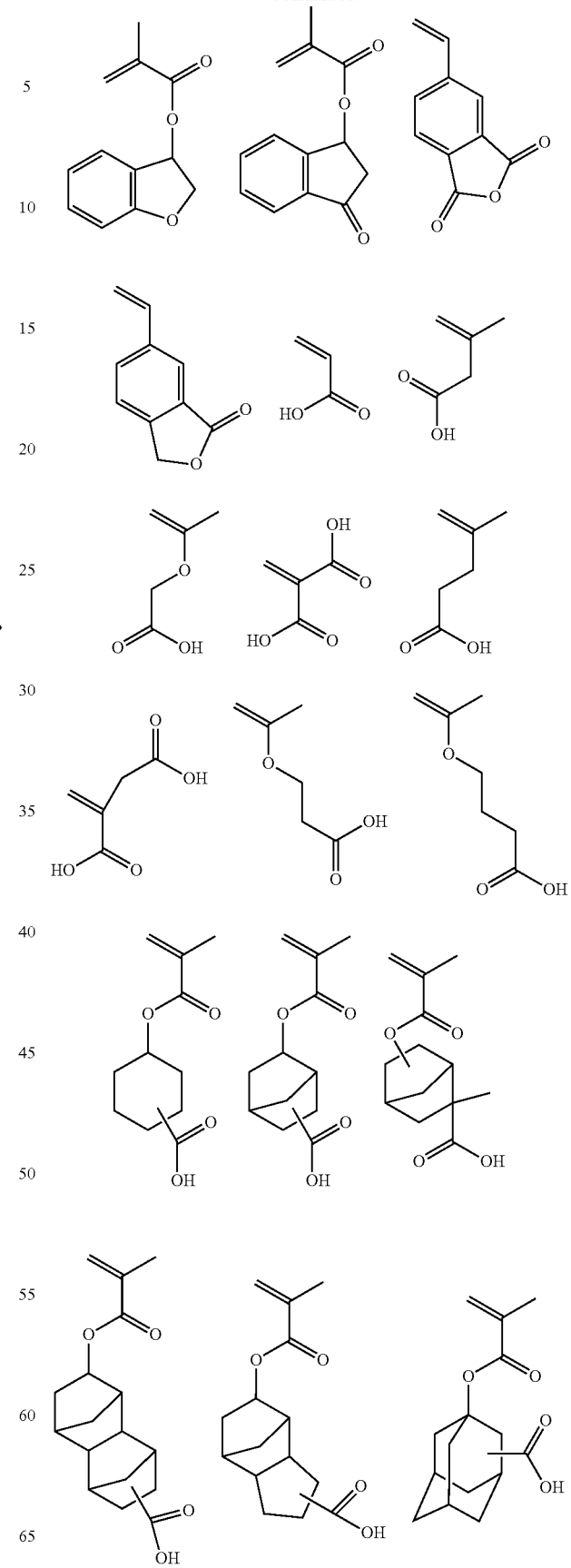

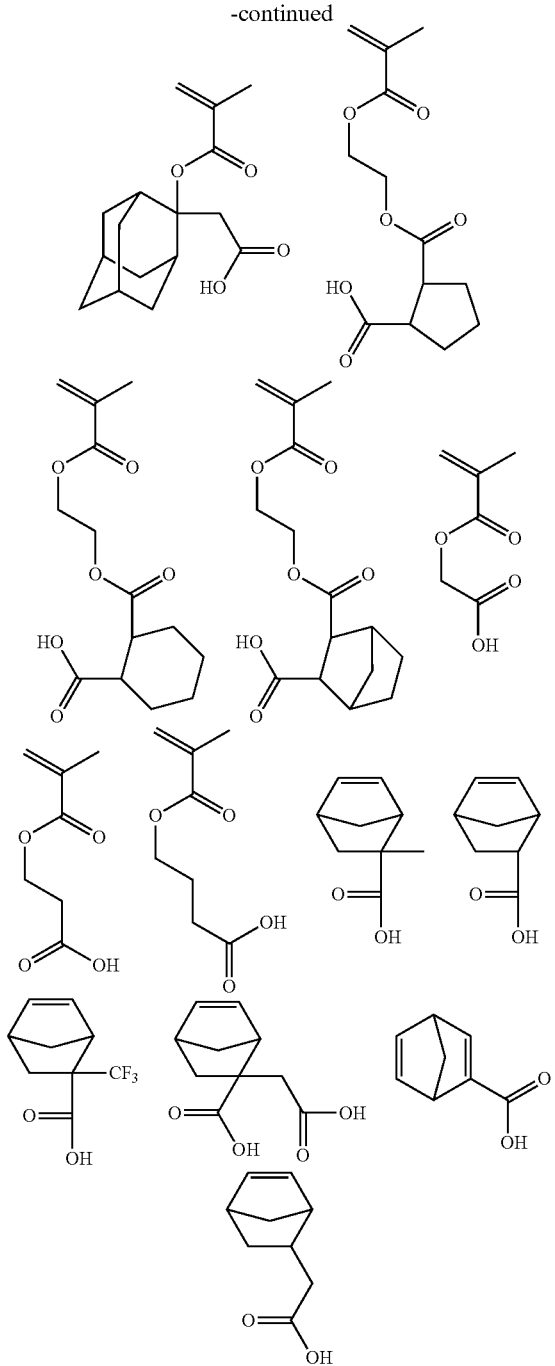

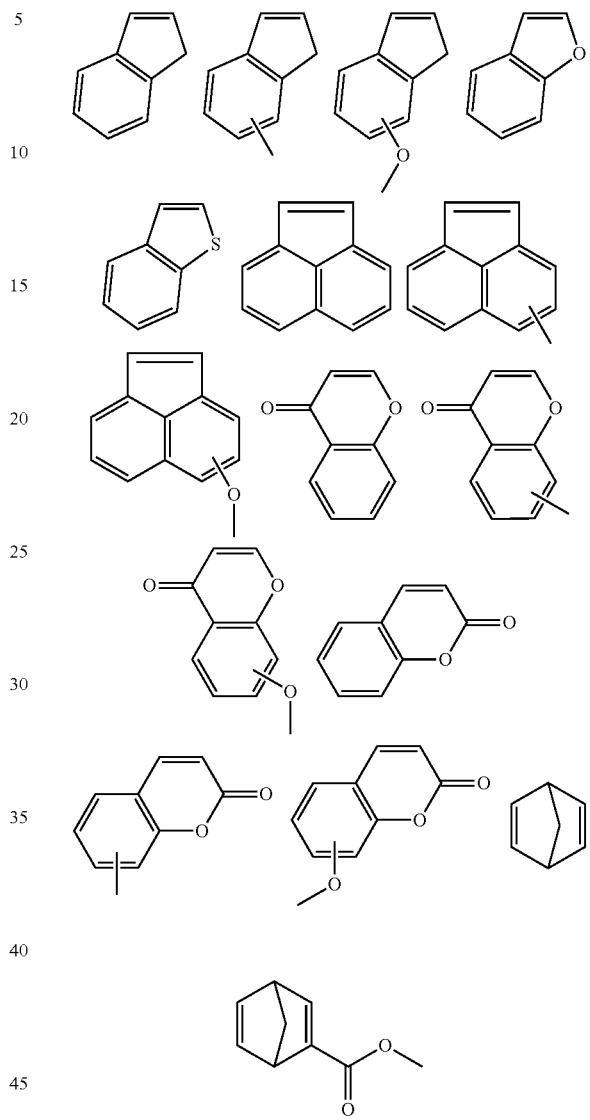

thylene, chromone, coumarin, and norbornadiene, or derivatives thereof. Suitable monomers are exemplified below.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In another preferred embodiment, the copolymer may have further copolymerized therein recurring units (d) selected from units of indene, benzofuran, benzothiophene, acenaph- Besides the recurring units described above, further recurring units (e) can be copolymerized, examples of which include styrene, vinylnaphthalene, vinylanthracene, vinylpyrene, methyleneindene, vinylpyridine, and vinylcarbazole.

In a further embodiment, an acid generator (f) in the form of an onium salt having polymerizable olefin may be copolymerized with the foregoing monomers. JP-A 2005-084365 discloses sulfonium salts having polymerizable olefin capable of generating a sulfonic acid and similar iodonium salts. JP-A 2006-178317 discloses a sulfonium salt having sulfonic acid directly attached to the main chain.

In this embodiment, the polymer may have further copolymerized therein recurring units having a sulfonium salt (f1) to (f3) represented by the general formula (3).

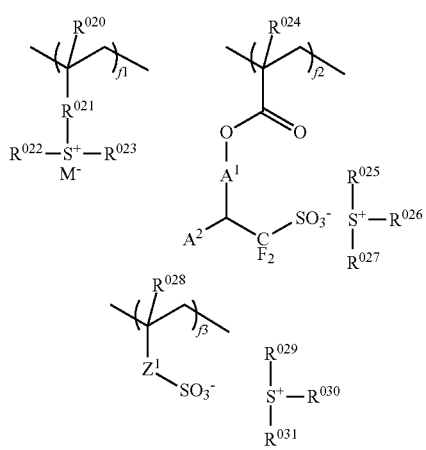

(3)

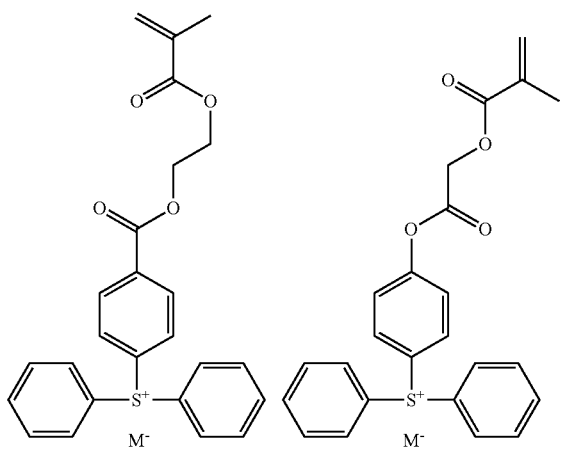

-continued

Herein $R^{020}$, $R^{024}$ and $R^{028}$ each are hydrogen or methyl. $R^{021}$ is a single bond, phenylene, —O—$R^{033}$—, or —C(=O)—Y—$R^{033}$— wherein Y is oxygen or NH and $R^{033}$ is a straight, branched or cyclic $C_1$-$C_6$ alkylene group, alkenylene group or phenylene group, which may contain a carbonyl (—CO—), ester (—COO—), ether (—O—) or hydroxyl moiety. $R^{022}$, $R^{023}$, $R^{025}$, $R^{026}$, $R^{027}$, $R^{029}$, $R^{030}$, and $R^{033}$ are each independently a straight, branched or cyclic $C_1$-$C_{12}$ alkyl group which may contain a carbonyl, ester or ether moiety, or a $C_6$-$C_{12}$ aryl group, $C_7$-$C_{20}$ aralkyl group, or thiophenyl group. $A^1$ is a single bond, -$A^0$-C(=O)—O—, -$A^0$-O— or -$A^0$-O—C(=O)—. $A^0$ is a straight, branched or cyclic $C_1$-$C_{12}$ alkylene group which may contain a carbonyl, ester or ether moiety. $A^2$ is hydrogen, $CF_3$ or carbonyl group. $Z^1$ is a single band, methylene, ethylene, phenylene, fluorinated phenylene, —O—$R^{032}$—, or —C(=O)—$Z^2$—$R^{032}$— wherein $Z^2$ is oxygen or NH and $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety. $M^-$ is a non-nucleophilic counter ion, and f1, f2 and f3 are in the ranges 0≤f1≤0.3, 0≤f2≤0.3, 0≤f3≤0.3, and 0≤f1+f2+f3≤0 3.

Examples of the monomer from which recurring units (f1) of sulfonium salt in formula (3) are derived are shown below.

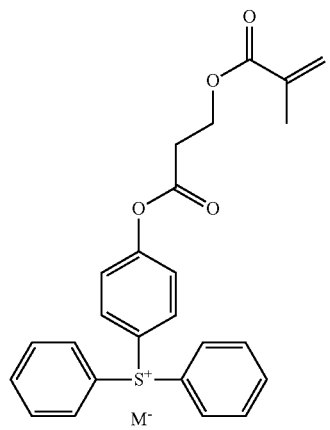

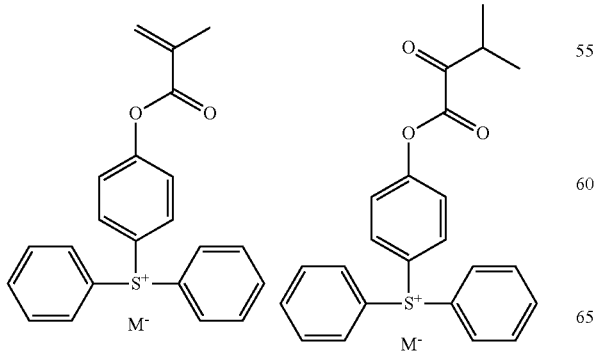

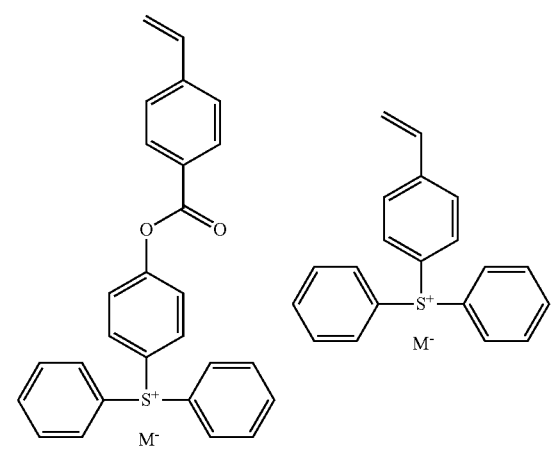

-continued

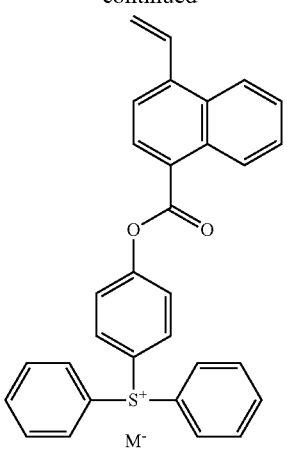
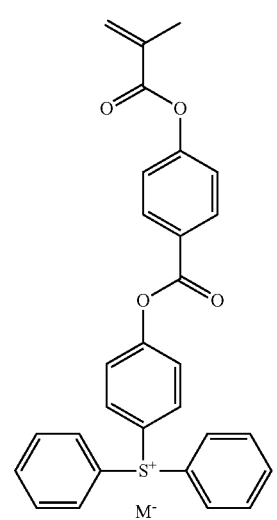
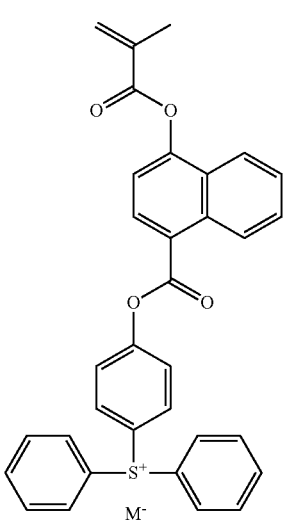

-continued

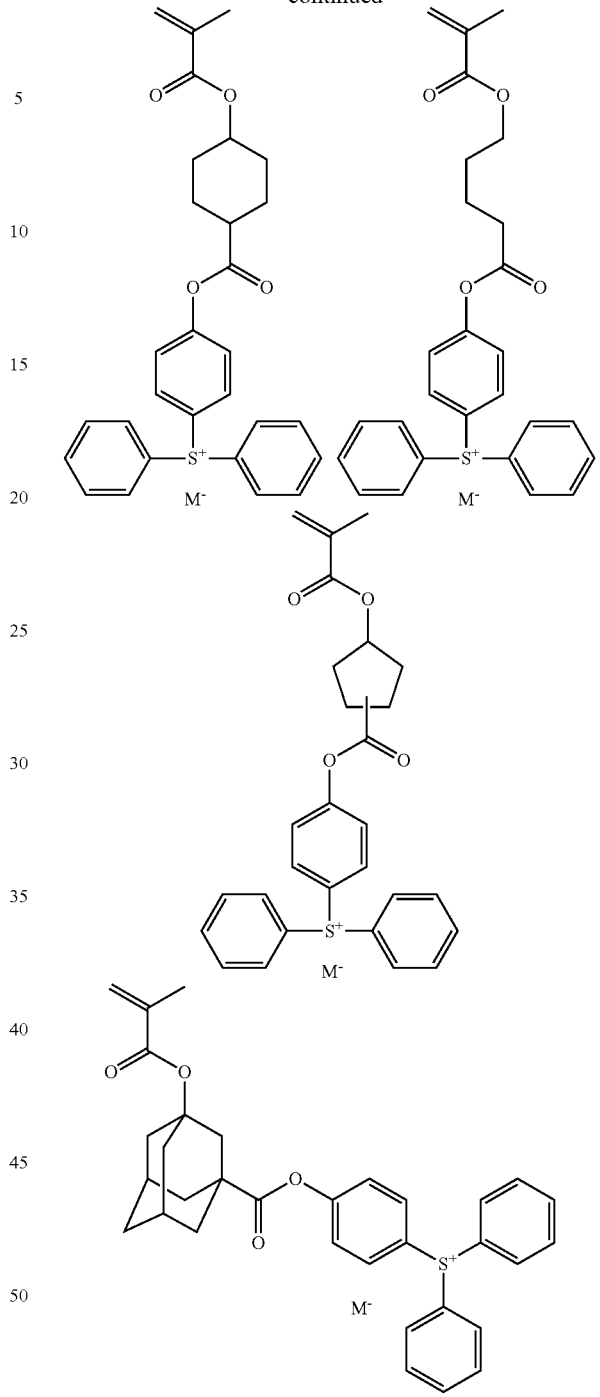

Herein, M⁻ is a non-nucleophilic counter ion.

Examples of the non-nucleophilic counter ion M⁻ include halide ions such as chloride and bromide ions: fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Also included are sulfonates having fluorine is substituted at α-position as represented by the general formula (K-1) and sulfonates having fluorine substituted at α- and β-positions as represented by of the general formula (K-2).

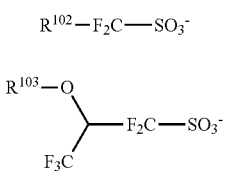

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl moiety, lactone ring, or fluorine atom. In formula (K-2), $R^{103}$ is hydrogen, or a straight, branched or cyclic $C_1$-$C_{30}$ alkyl or acyl group. $C_2$-$C_{20}$ alkenyl group, or $C_6$-$C_{20}$ aryl or aryloxy group, which may have an ether ester, carbonyl moiety or lactone ring.

Examples of the monomer from which recurring units (f2) of sulfonium salt in formula (3) are derived are shown below.

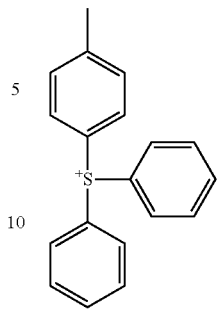
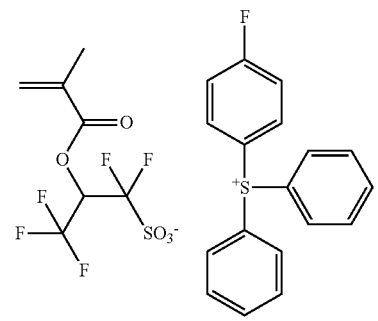
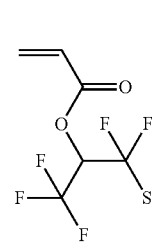
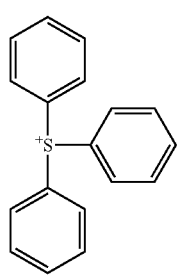
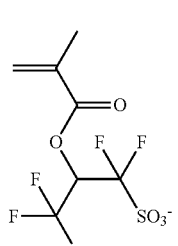
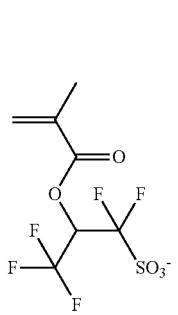
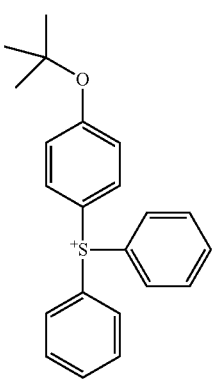
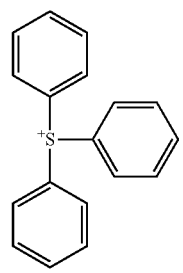
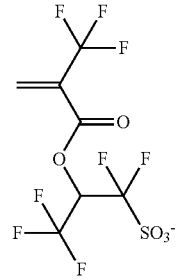
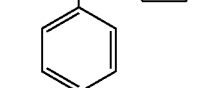
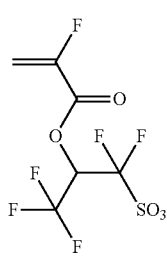
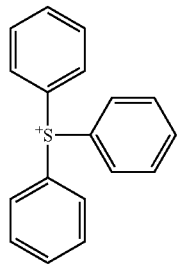
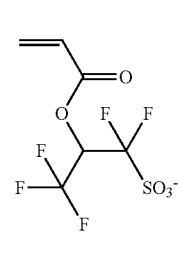
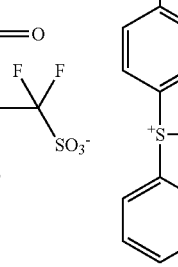
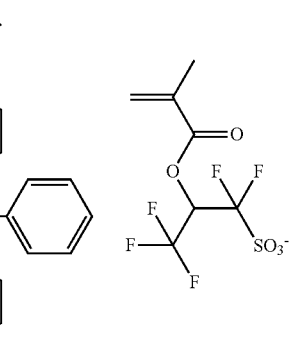

123
-continued
124
-continued
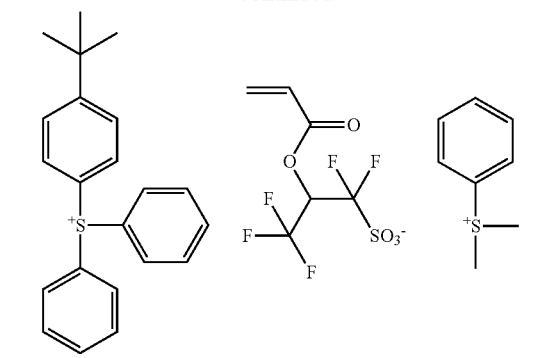
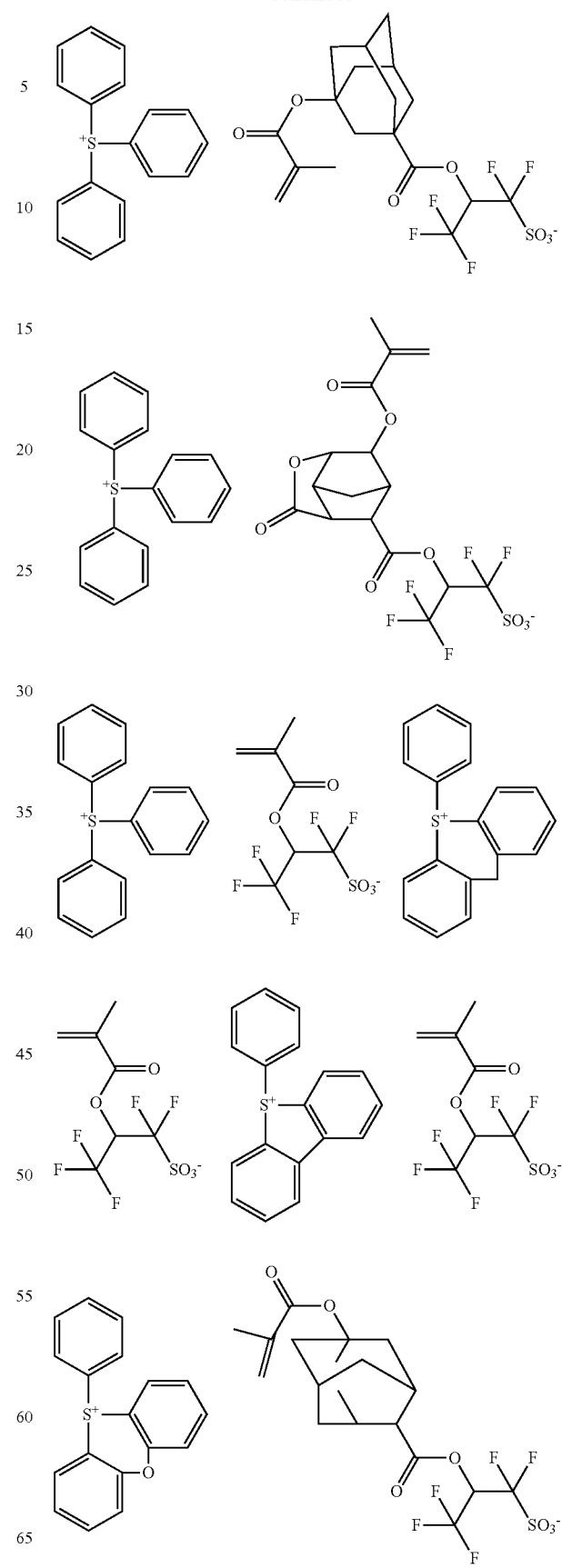

125
-continued
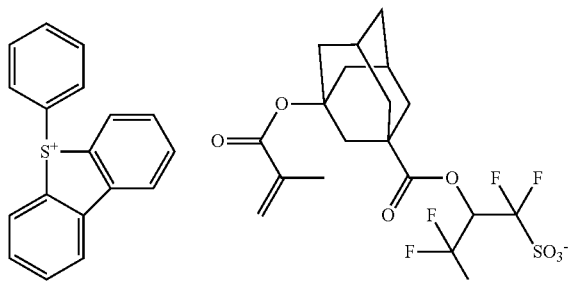
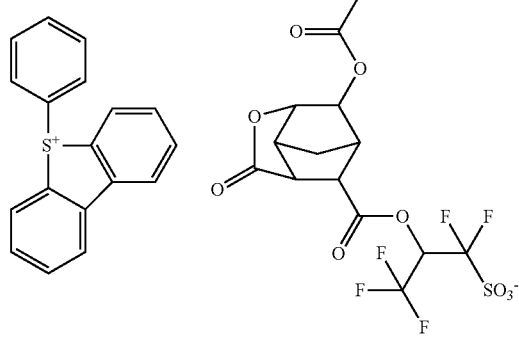
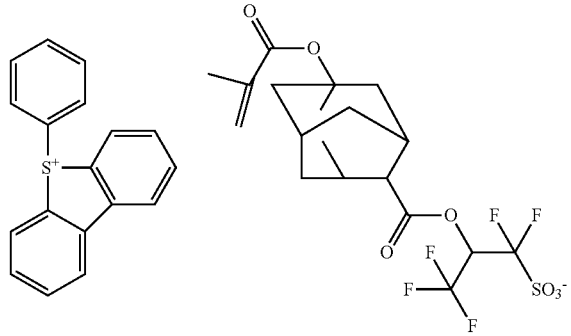
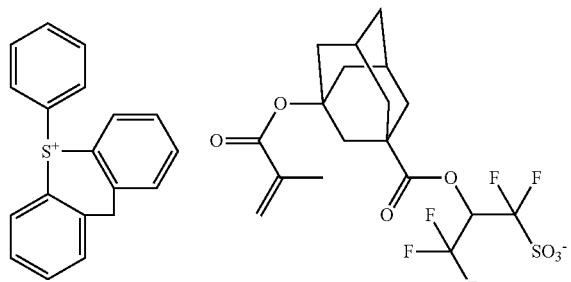
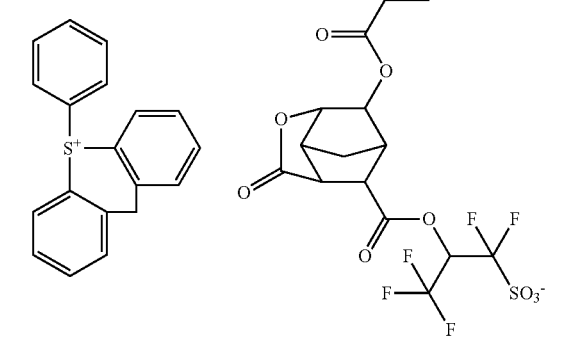
126
-continued
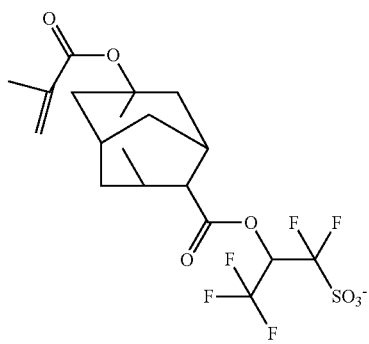
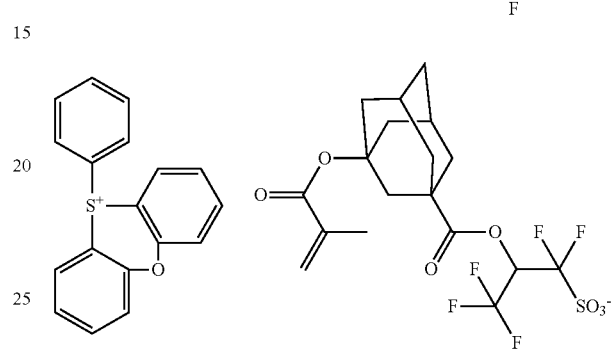
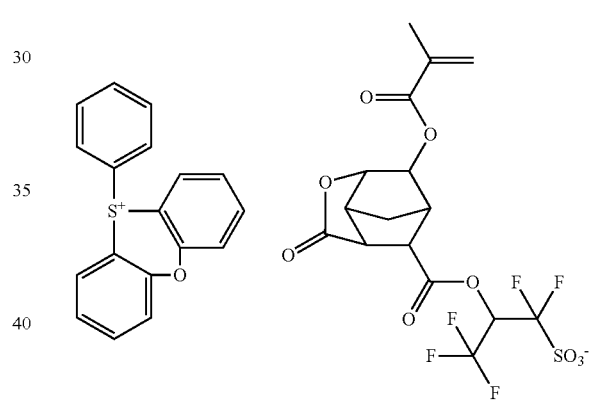
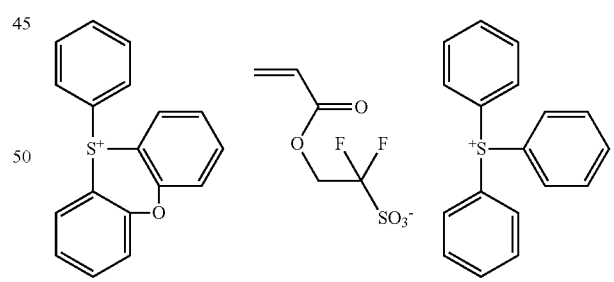
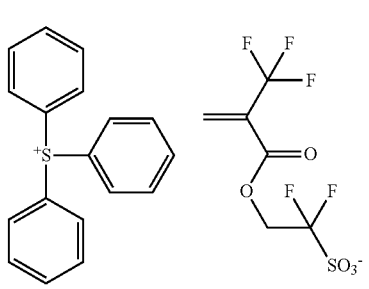

127
-continued
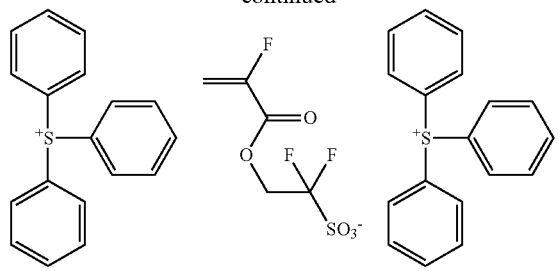
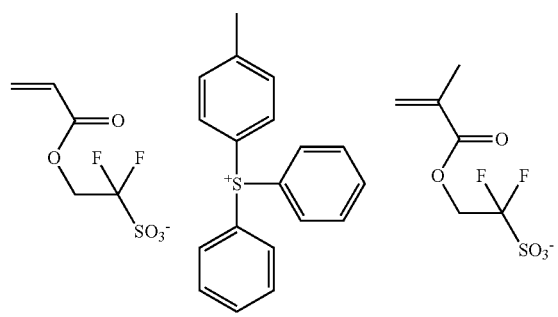
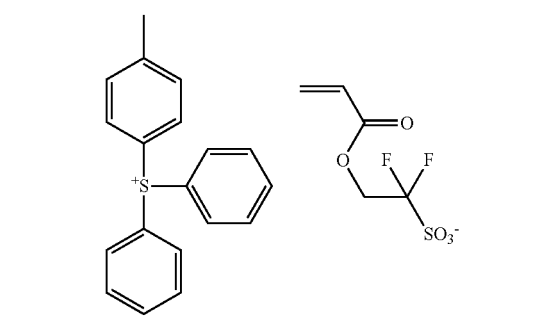
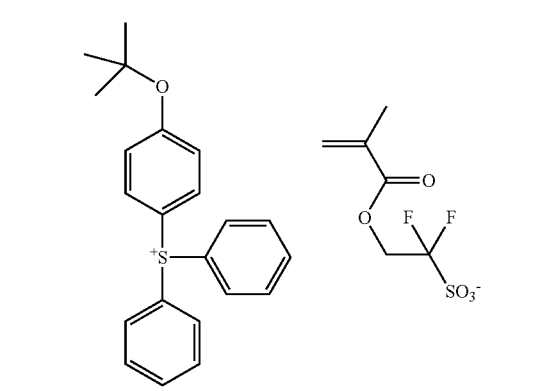
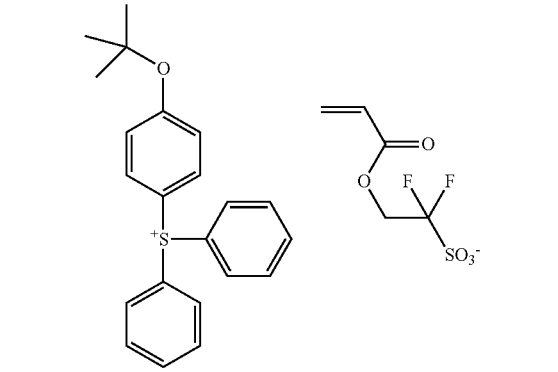
128
-continued
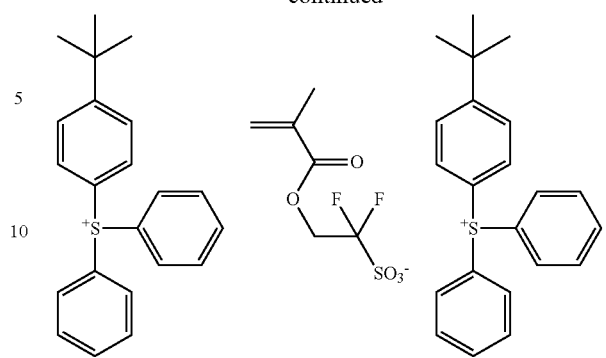
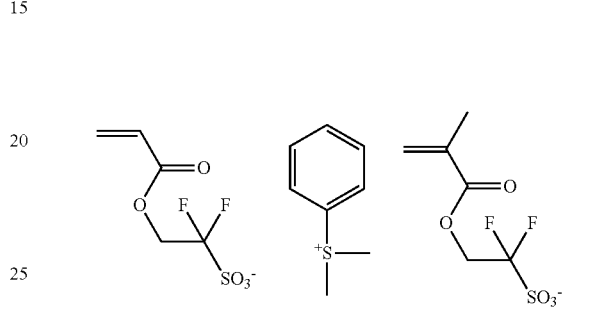
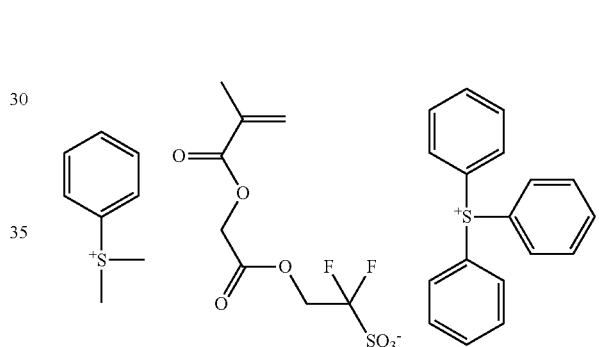
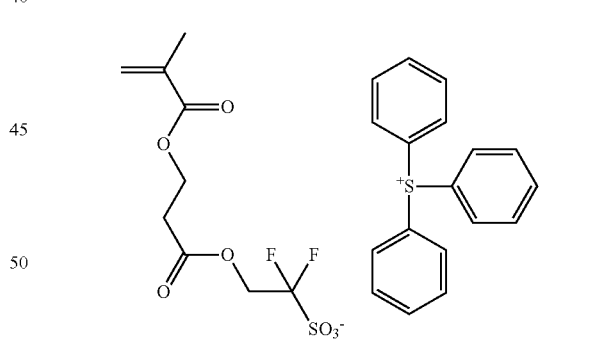
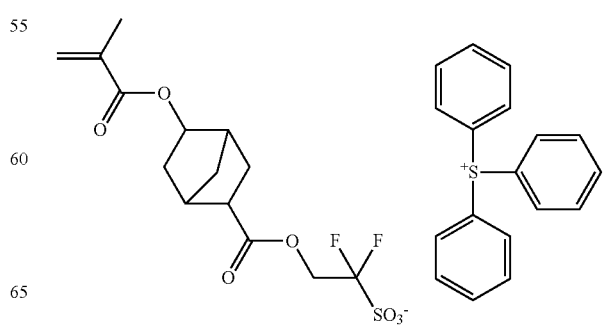

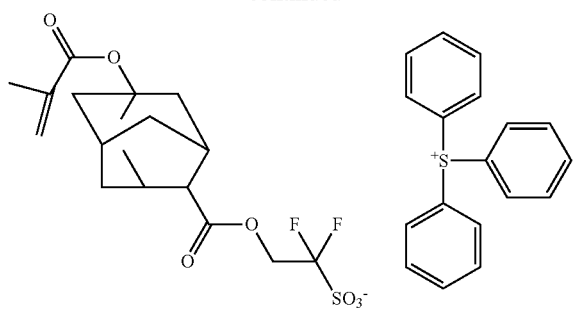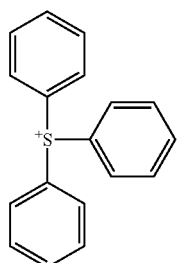
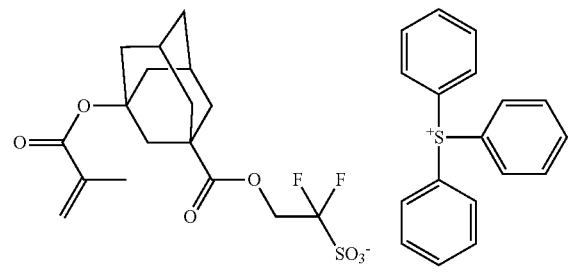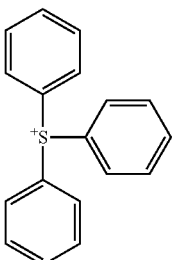
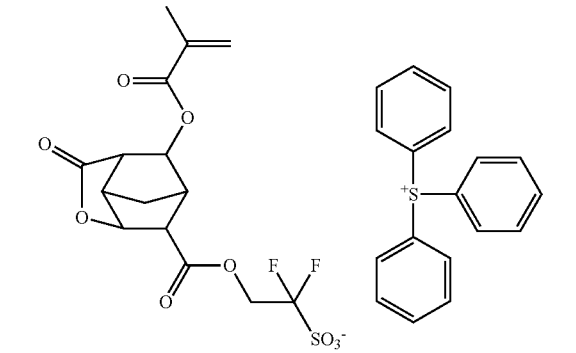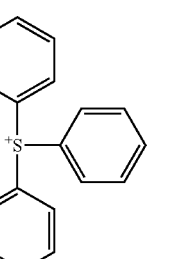
Examples of the monomer from which recurring units (f3) of sulfonium salt in formula (3) are derived are shown below.
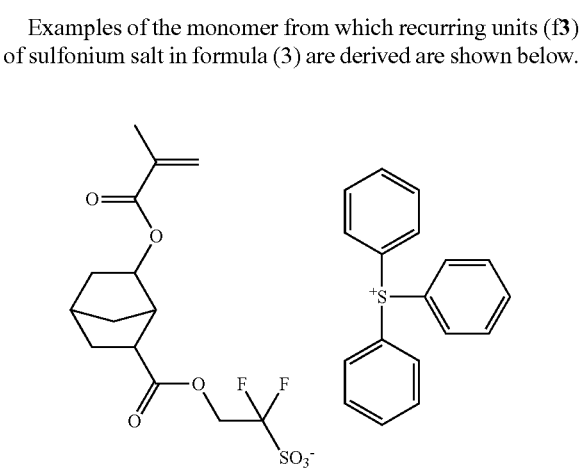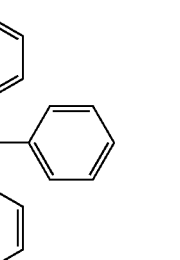
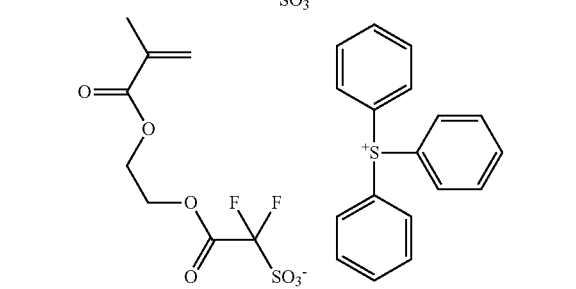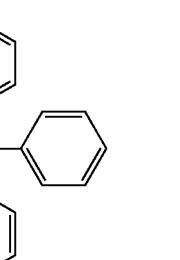
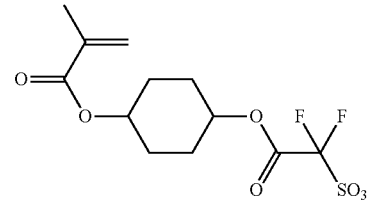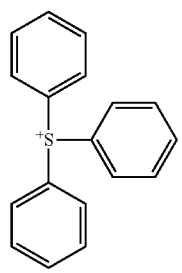
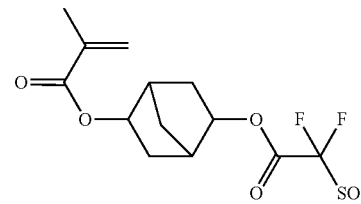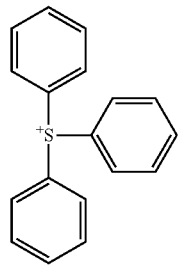
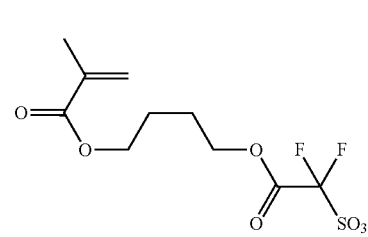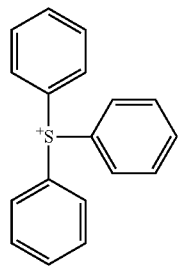
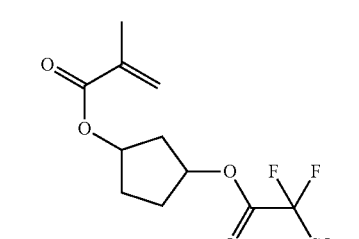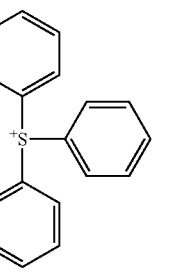
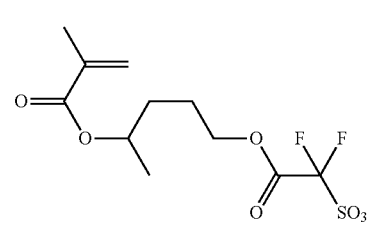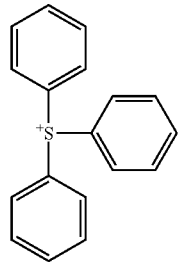
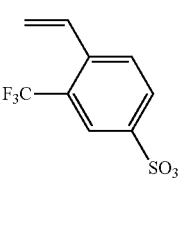

131
-continued

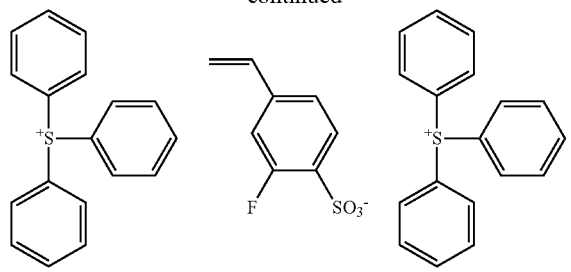
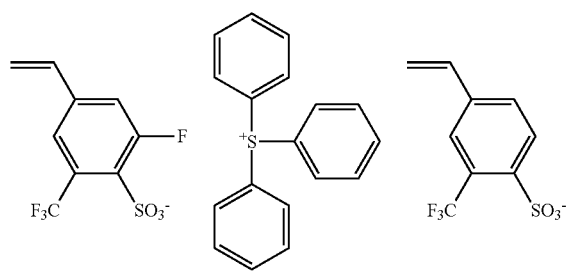
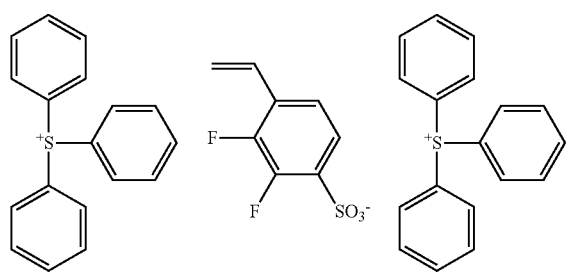
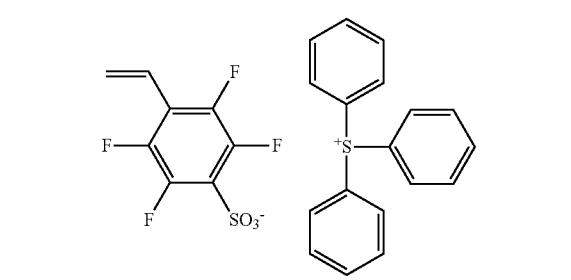
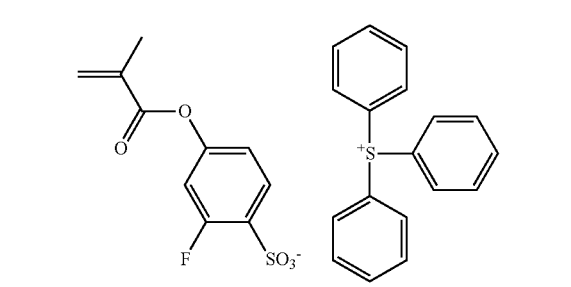
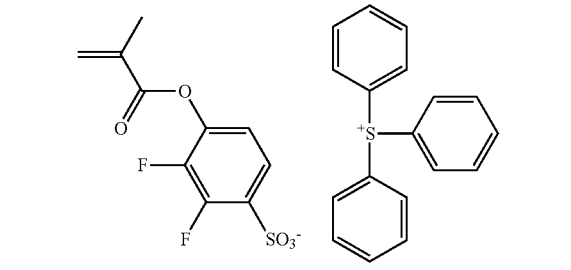

132
-continued

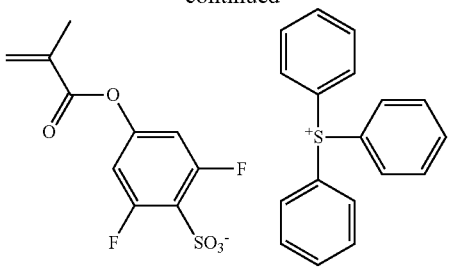
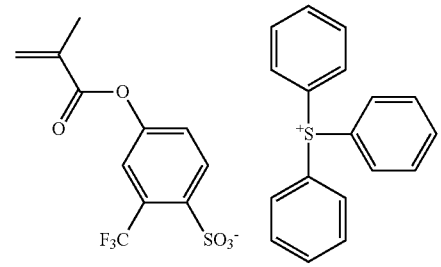
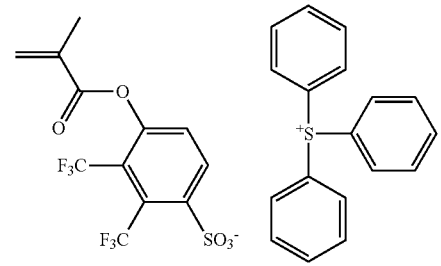
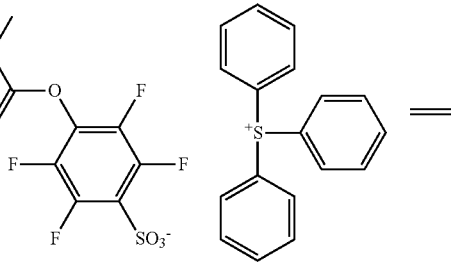
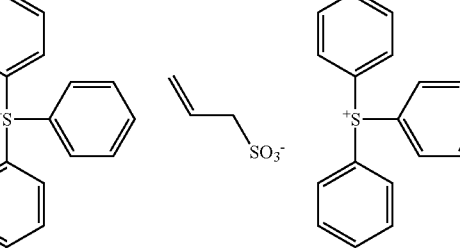

Onium salts such as sulfonium salts, iodonium salts and ammonium salts of sulfonic acids which are not fluorinated at α-position as described in US 2008153030 (JP-A 2008-158339) and similar onium salts of carboxylic acid may also be used as the quencher. While an α-fluorinated sulfonic acid, imidic acid, and methidic acid are necessary to deprotect the acid labile group of carboxylic acid ester, an α-non-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction. In particular, since sulfonium salts and iodonium salts of an α-non-fluorinated sulfonic acid and a carboxylic acid are photodegradable, those portions receiving a high light intensity are reduced in quenching capability and increased in the concentration of a α-fluorinated sulfonic acid, imidic acid, or methidic acid. As a result, the exposed portions are improved in contrast. When a negative tone pattern is formed using an organic solvent, the improvement in the contrast of exposed portions leads to an improvement in the rectangularity of negative pattern. Onium salts including sulfonium salts, iodonium salts and ammonium salts of an α-non-fluorinated sulfonic acid and a carboxylic acid are highly effective in controlling the diffusion of an α-fluorinated sulfonic acid, imidic acid and methidic acid. This is because the onium salt resulting from salt exchange less mobile due to a higher molecular weight. In the event that a hole pattern is formed by negative tone development, since acid is generated in many regions, it is very important to control the diffusion of acid from the exposed area to the unexposed area. The addition of onium salts including sulfonium salts, iodonium salts and ammonium salts of an α-non-fluorinated sulfonic acid and a carboxylic acid as well as the amine quencher defined herein is very important from the aspect of acid diffusion control.

The attachment of an acid generator to the polymer main chain is effective in restraining acid diffusion, thereby preventing a reduction of resolution due to blur by acid diffusion. Also roughness (LER or LWR) is improved since the acid generator is uniformly distributed.

The base polymer for formulating the positive resist composition comprises recurring units (a1) and/or (a2) having an acid labile group as essential components and additional recurring units (b), (c), (d), (e), (f1), (f2) and/or (f3) as optional components. A copolymerization proportion of units (a1), (a2), (b), (c), (d), (e), (f1), (f2) and (f3) is: $0 \leq a1 < 1.0$, $0 \leq a2 < 1.0$, $0 < a1+a2 < 1.0$, $0 \leq b \leq 0.9$, $0 \leq c \leq 0.9$, $0 \leq d \leq 0.8$, $0 \leq e \leq 0.8$, $0 \leq f1 \leq 0.3$, $0 \leq f2 \leq 0.3$, $0 \leq f3 \leq 0.3$, and $0 \leq f1+f2+f3 \leq 0.3$: preferably $0 \leq a1 \leq 0.9$, $0 \leq a2 \leq 0.9$, $0.1 \leq a1+a2 \leq 0.9$, $0 \leq b \leq 0.8$, $0 \leq c \leq 0.8$, $0 \leq d \leq 0.7$, $0 \leq e \leq 0.7$, $0 \leq f1 \leq 0.25$, $0 \leq f2 \leq 0.25$, $0 \leq f3 \leq 0.25$, and $0 \leq f1+f2+f3 \leq 0.25$; and more preferably $0 \leq a1 \leq 0.8$, $0 \leq a2 \leq 0.8$, $0.1 \leq a1+a2 \leq 0.8$, $0 \leq b \leq 0.75$, $0 \leq c \leq 0.75$, $0 \leq d \leq 0.6$, $0 \leq e \leq 0.6$, $0 \leq f1 \leq 0.2$, $0 \leq f2 \leq 0.2$, $0 \leq f3 \leq 0.2$, and $0 \leq f1+f2+f3 \leq 0.2$. Note $a1+a2+b+c+d+e+f1+f2+f3=1.0$.

For the base polymer for formulating the negative resist composition, an acid labile group is not necessarily essential. The base polymer comprises recurring units (b), (c), (d), (e), (f1), (f2) and (f3) in a copolymerization proportion: $0 < b \leq 1.0$, $0 \leq c \leq 0.9$, $0 \leq d \leq 0.8$, $0 \leq e \leq 0.8$, $0 \leq f1 \leq 0.3$, $0 \leq f2 \leq 0.3$, $0 \leq f3 \leq 0.3$, and $0 \leq f1+f2+f3 \leq 0.3$; preferably $0.2 \leq b \leq 1.0$, $0 \leq c \leq 0.8$, $0 \leq d \leq 0.7$, $0 \leq e \leq 0.7$, $0 \leq f1 \leq 0.25$, $0 \leq f2 \leq 0.25$, $0 \leq f3 \leq 0.25$, and $0 \leq f1+f2+f3 \leq 0.25$; and more preferably $0.3 \leq b \leq 1.0$, $0 \leq c \leq 0.75$, $0 \leq d \leq 0.6$, $0 \leq e \leq 0.6$, $0 \leq f1 \leq 0.2$, $0 \leq f2 \leq 0.2$, $0 \leq f3 \leq 0.2$, and $0 \leq f1+f2+f3 \leq 0.2$. Note $b+c+d+e+f1+f2+f3=1.0$.

These polymers may be synthesized by any desired methods, for example, by dissolving one or more monomers selected from the monomers to form the recurring units (a1), (a2), (b), (c), (d), (e), (f1), (f2) and (f3) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C. preferably 0° C. to 60° C., and the reaction time is 0.2 to 100 hours, preferably 0.5 to 20 hours.

The polymer used in the resist composition should preferably have a weight average molecular weight (Mw) in the range of 1,000 to 500,000, and more preferably 2,000 to 30,000, as measured by GPC versus polystyrene standards using tetrahydrofuran as a solvent. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The basic compound of formula (1) is advantageously used in a chemically amplified positive or negative resist composition having an acid generator added thereto. Specifically, the basic compound is added to the polymer serving as a base resin, which may be further combined with any desired components including an organic solvent, dissolution inhibitor, surfactant, crosslinker and the like to formulate a positive or negative resist composition. This positive or negative resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

Any conventional basic compounds may be added along with the basic compound of formula (1) for further suppressing the diffusion rate of acid in the resist film or correcting the pattern profile. Addition of a surfactant may improve or control the coating characteristics of the resist composition.

Suitable conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146] to [0164], and compounds having a carbamate group as described in JP 3790649.

The positive or negative resist composition may include an acid generator in order for the composition to function as a chemically amplified positive or negative resist composition in the pattern forming process defined herein. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]).

While the resist composition of the invention should comprise the base polymer, the basic compound, and the acid generator, described above, it may further comprise an organic solvent, dissolution inhibitor, crosslinker, surfactant, acetylene alcohol, and conventional basic compound, alone or in combination.

Examples of the organic solvent used herein are described in JP-A 2008-111103, paragraphs [0144] to [0145] (U.S. Pat. No. 7,537,880). Exemplary solvents include ketones such as cyclohexanone, cyclopentanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

Conventional basic compounds are described in JP-A 2008-111103, paragraphs [0146] to [0164]. Exemplary surfactants are described in JP-A 2008-111103, paragraphs [0165] to [0166].

The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a weight average molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in US 2008090172 (JP-A 2008-122932, paragraphs [0155] to [0178]). Suitable acetylene alcohols are described in JP-A 2008-122932, paragraphs [0179] to [0182].

Suitable crosslinkers which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as is an alkenyl ether group. These compounds may be used as an additive or introduced into a polymer side chain as a pendant. Hydroxy-containing compounds may also be used as the crosslinker. Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene to diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film loss of resist pattern or rounding of pattern top.

In preferred embodiments, the respective components are used in the following amounts, provided that all amounts are expressed in parts by weight relative to 100 parts by weight of the base polymer. An amount of the PAG used is 0.1 to 50 parts, and more preferably 1 to 40 parts. An amount of the organic solvent used is 100 to 10,000 parts, and more preferably 200 to 8,000 parts. In positive resist compositions, an amount of the dissolution inhibitor blended is 0 to 50 parts, and more preferably 5 to 40 parts. In negative resist compositions, an amount of the crosslinker blended is 0.1 to 50 parts, and more preferably 1 to 40 parts. An amount of the surfactant blended is 0.0001 to 10 parts. An amount of the acetylene alcohol blended is 0 to 5 parts. An amount of the conventional basic compound other than the basic compound of formula (1) is 0 to 5 parts, and more preferably 0 to 4 parts. An amount of the polymeric quencher is 0 to 5 parts, and more preferably 0 to 4 parts.

Process

The positive resist composition, typically chemically amplified positive resist composition comprising a base polymer, a basic compound of formula (1), and an acid generator in an organic solvent is used in the fabrication of various integrated circuits. Pattern formation using the resist composition may be performed by well-known lithography processes. The process generally involves coating, prebaking, exposure, post-exposure baking (PEB), and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$ more preferably about 10 to 100 $mJ/cm^2$, or about 0.1 to 100 $\mu C/cm^2$, more preferably about 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV (soft x-ray), x-ray, γ-ray and synchrotron radiation.

In an alternative embodiment, a negative pattern may be formed via organic solvent development using a polymer having an acid labile group (for positive resist compositions). The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octane, cyclohexane, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pent 1, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene. Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is at a temperature of 70 to 180° C., preferably 80 to 170° C., for a time of 10 to 300 seconds. The extra shrink agent is stripped and the hole pattern is shrunk.

Where a hole pattern is formed by negative tone development, exposure by double dipole illuminations of X- and Y-direction line patterns provides the highest contrast light. The contrast may be further increased by combining dipole illumination with s-polarized illumination.

When a halftone phase shift mask (PSM) bearing a lattice-like shifter pattern is used, a pattern of holes may be formed at the intersections between gratings of the lattice-like shifter pattern after development, as described in JP-A 2011-170316, paragraph [0097] (US 20110177462). The preferred halftone PSM bearing a lattice-like shifter pattern has a transmittance of 3 to 15%. More preferably, the PSM used is a PSM including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. Also preferably, the PSM used is a PSM including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Exposure by double dipole illuminations of X- and Y-direction lines combined with polarized illumination presents a method of forming light of the highest contrast. This method, however, has the drawback that the throughput is substantially reduced by double exposures and mask exchange therebetween. To continuously carry out two exposures while exchanging a mask, the exposure tool must be equipped with two mask stages although the existing exposure tool includes a single mask stage. Higher throughputs may be obtained by carrying out exposure of X direction lines continuously on 25 wafers in a front-opening unified pod (FOUP), exchanging the mask, and carrying out exposure continuously on the same 25 wafers, rather than exchanging a mask on every exposure of a single wafer. However, a problem arises that as the time duration until the first one of 25 wafers is exposed in the second exposure is prolonged, the environment affects the resist such that the resist after development may change its size and shape. To block the environmental impact on wafers in standby until the second exposure, it is effective that the resist film is overlaid with a protective film.

To proceed with a single mask, it is proposed in Non-Patent Document 1 to carry out two exposures by dipole illuminations in X and Y directions using a mask bearing a lattice-like pattern. When this method is compared with the above method using two masks, the optical contrast is somewhat reduced, but the throughput is improved by the use of a single mask. As described in Non-Patent Document 1, the method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures, giving rise to the problem of an increased alignment error. To minimize the alignment error between two exposures, two exposures must be continuously carried out without removing the wafer from the exposure stage. The addition of s-polarized illumination to dipole illumination provides a further improved contrast and is thus preferably employed. After two exposures for forming X- and Y-direction lines using a lattice-like mask are performed in an overlapping manner, negative tone development is performed whereupon a hole pattern is formed.

When it is desired to form a hole pattern via a single exposure using a lattice-like mask, a quadrupole illumination or cross-pole illumination is used. The contrast may be improved by combining it with X-Y polarized illumination or azimuthally polarized illumination of circular polarization.

In the hole pattern forming process using the resist composition of the invention, when two exposures are involved, these exposures are carried out by changing the illumination and mask for the second exposure from those for the first exposure, whereby a fine size pattern can be formed at the highest contrast and to dimensional uniformity. The masks used in the first and second exposures bear first and second patterns of intersecting lines whereby a pattern of holes at intersections of lines is formed in the resist film after development. The first and second lines are preferably at right angles although an angle of intersection other than 90° may be employed. The first and second lines may have the same or different size and/or pitch. If a single mask bearing first lines in one area and second lines in a different area is used, it is possible to perform first and second exposures continuously. In this case, however, the maximum area available for exposure is one half. Notably, the continuous exposures lead to a minimized alignment error. Of course, the single exposure provides a smaller alignment error than the two continuous exposures.

When two exposures are performed using a single mask without reducing the exposure area, the mask pattern may be a lattice-like pattern, a dot pattern, or a combination of a dot pattern and a lattice-like pattern. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two continuous exposures with the X- and Y-direction contrasts emphasized through a single mask can be performed on a currently commercially available scanner.

The method of combining X and Y polarized illuminations with cross-pole illumination using a mask bearing a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures. Using such a mask and illumination, a hole pattern of the order of 40 nm can be formed at a practically acceptable cost.

On use of a mask bearing a lattice-like pattern, light is fully shielded at intersections between gratings. A fine hole pattern may be formed by performing exposure through a mask bearing such a pattern and organic solvent development entailing positive/negative reversal.

On use of a mask bearing a dot pattern, although the contrast of an optical image is low as compared with the lattice-like pattern mask, the formation of a hole pattern is possible owing to the presence of black or light shielded spots.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol, 5753, p171 (2005), which involves strong super-resolution illumination of a first positive resist to resolve a dense hole pattern, coating the first positive resist negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

To form a random pitch hole pattern by organic solvent development entailing positive/negative reversal, a mask is used in which a lattice-like pattern is arrayed over the is entire surface and the width of gratings is thkened only where holes are to be formed as described in JP-A 2011-170316, paragraph [0102]. Also useful is a mask in which a lattice-like pattern is arrayed over the entire surface and thick dots are disposed only where holes are to be formed. On use of a mask bearing no lattice-like pattern arrayed, holes are difficult to form, or even if holes are formed, a variation of mask size is largely reflected by a variation of hole size because the optical image has a low contrast,

EXAMPLE

Examples of the invention are given below by way of illustration and not by way of limitation. The abbreviation "pbw" is parts by weight. For all polymers. Mw and Mn are determined by GPC versus polystyrene standards using tetrahydrofuran solvent, and Mw/Mn designates molecular weight distribution or dispersity. For measurement of the hole size of a pattern, a scanning electron microscope (SEM) CG-4000 (Hitachi High-Technologies Corp.) was used.

Amines 1 to 43 used herein have the following structure.

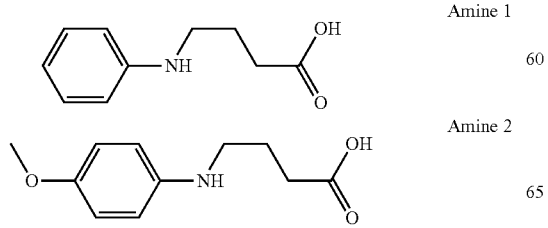

Amine 1

Amine 2

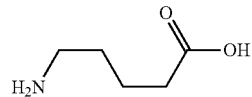

Amine 3

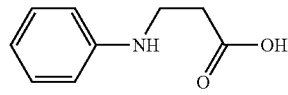

Amine 4

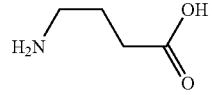

Amine 5

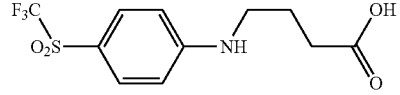

Amine 6

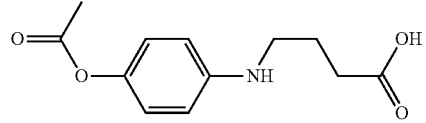

Amine 7

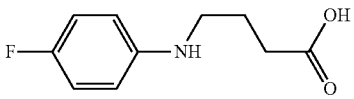

Amine 8

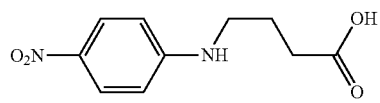

Amine 9

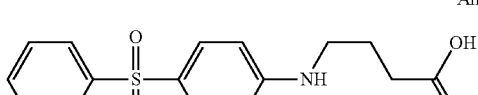

Amine 10

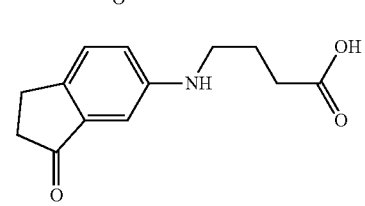

Amine 11

Amine 12

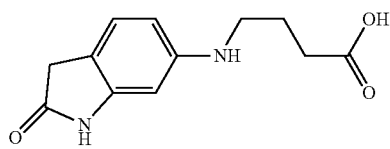

Amine 13

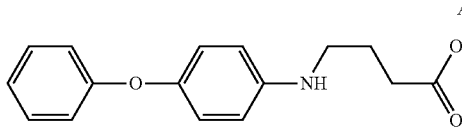

Amine 14

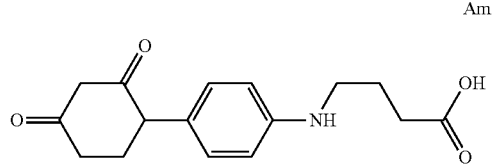

143
-continued
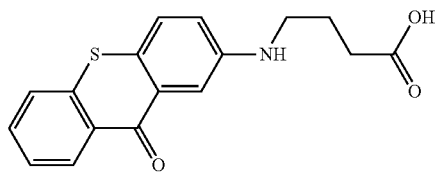
Amine 15
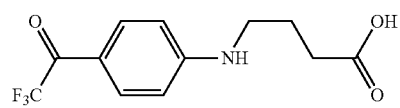
Amine 16
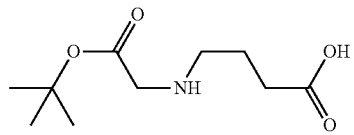
Amine 17
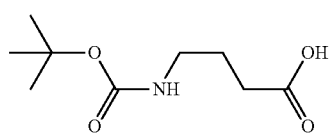
Amine 18
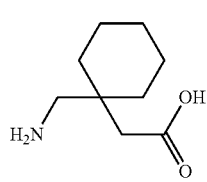
Amine 19
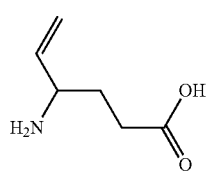
Amine 20
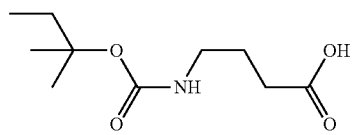
Amine 21
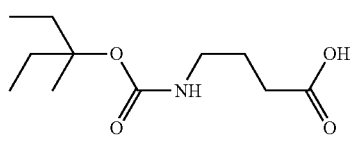
Amine 22
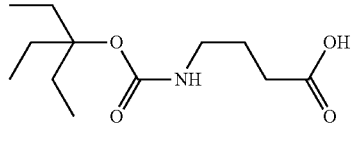
Amine 23
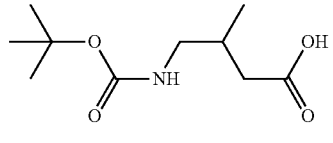
Amine 24
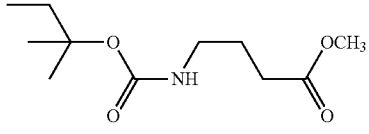
Amine 25
144
-continued
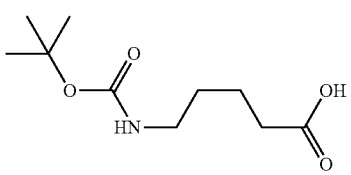
Amine 26
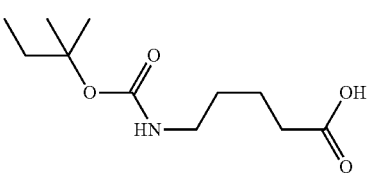
Amine 27
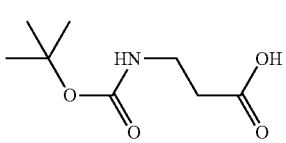
Amine 28
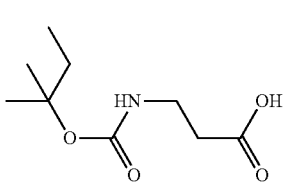
Amine 29
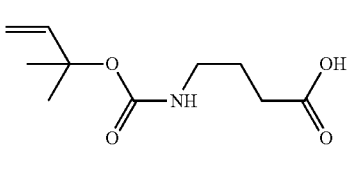
Amine 30
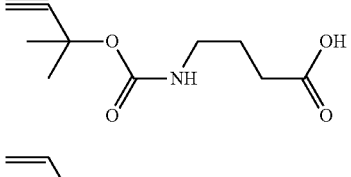
Amine 31
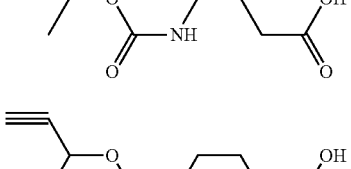
Amine 32
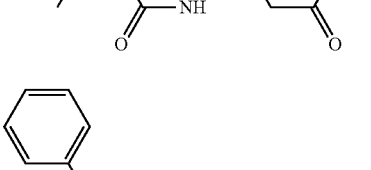
Amine 33
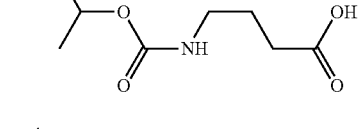
Amine 34
Amine 35

-continued

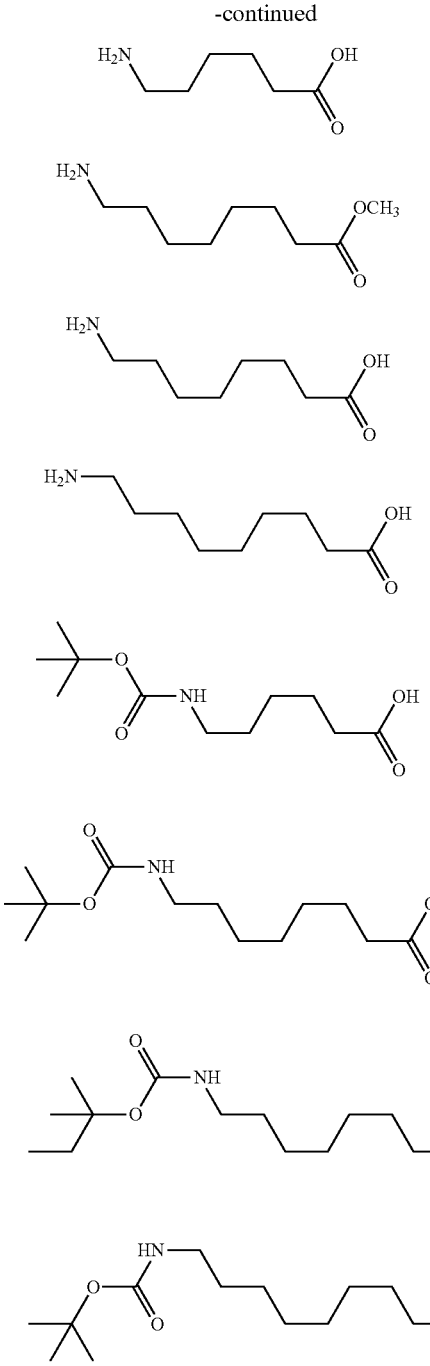

Amine 36
Amine 37
Amine 38
Amine 39
Amine 40
Amine 41
Amine 42
Amine 43

Synthesis Example

Synthesis of Polymers 1 to 11

Polymers to be added to resist compositions were prepared by combining suitable monomers, effecting copolymerization reaction thereof in tetrahydrofuran solvent, pouring the reaction solution into methanol for crystallization, repeatedly washing with hexane, isolation, and drying. The resulting polymers, designated Polymers 1 to 11, were analyzed for composition by $^1$H-NMR, and for Mw and Mw/Mn by GPC.

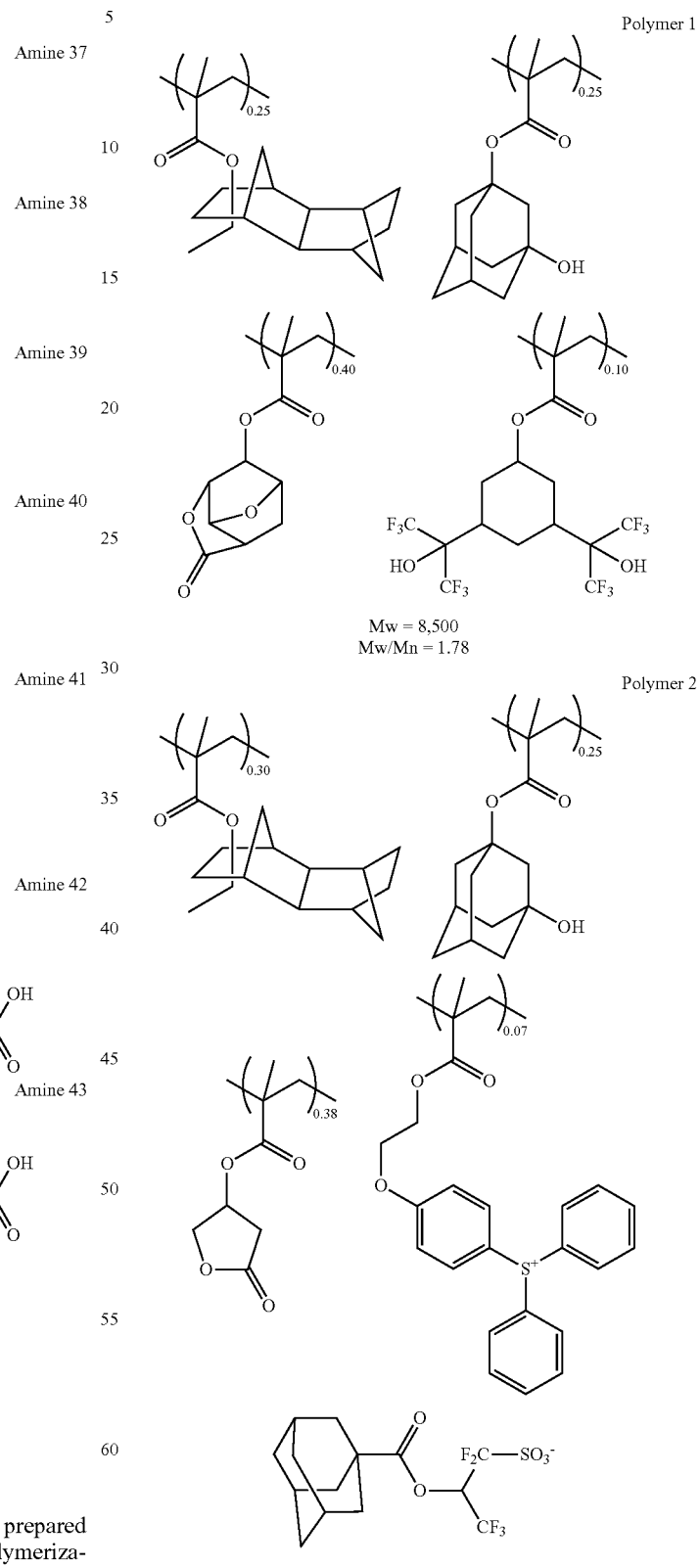

Polymer 3
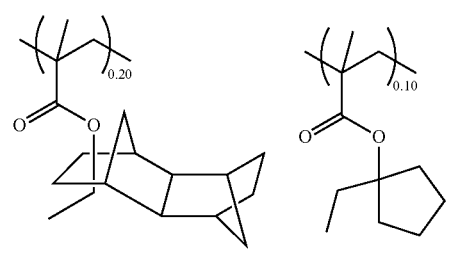
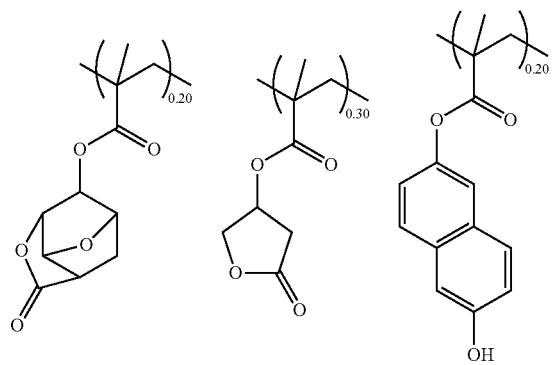
Mw = 7,600
Mw/Mn = 1.69
Polymer 4
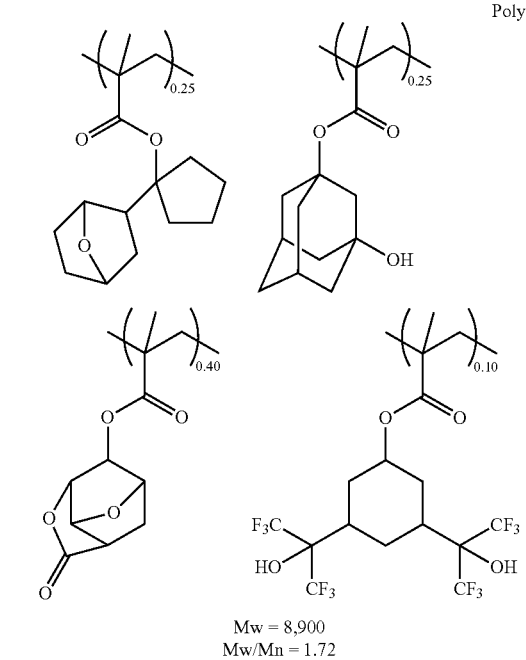
Mw = 8,900
Mw/Mn = 1.72
Polymer 5
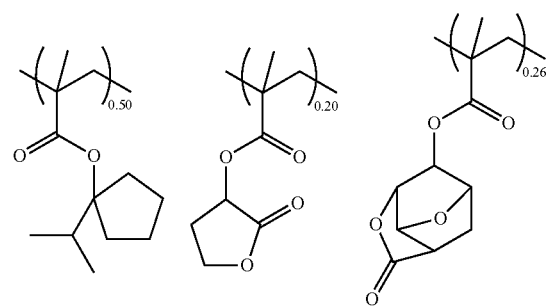
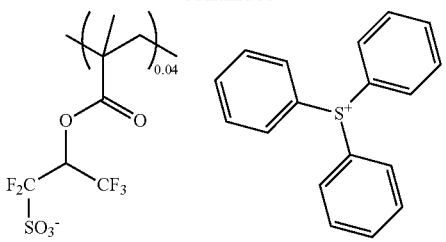
Mw = 7,800
Mw/Mn = 1.98
Polymer 6
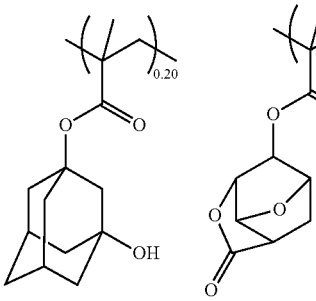
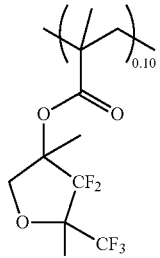
Mw = 8,500
Mw/Mn = 1.78
Polymer 7
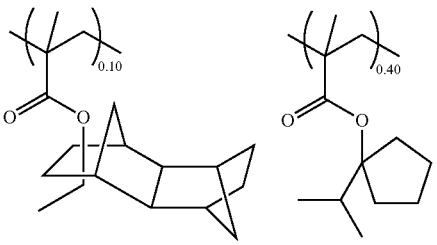
Mw = 7,900
Mw/Mn = 1.69

-continued

Polymer 8

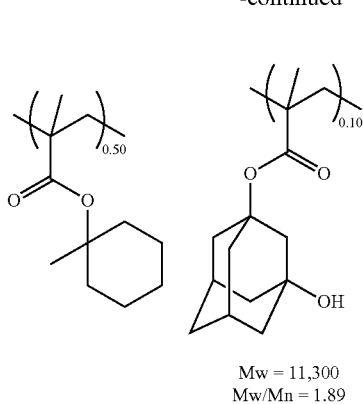

Mw = 11,300
Mw/Mn = 1.89

Polymer 9

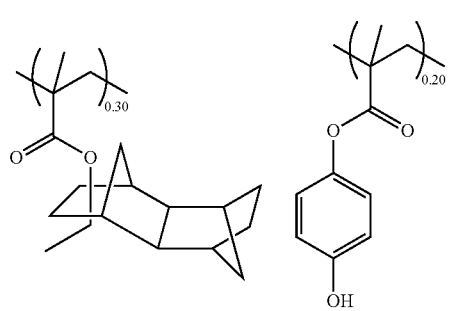

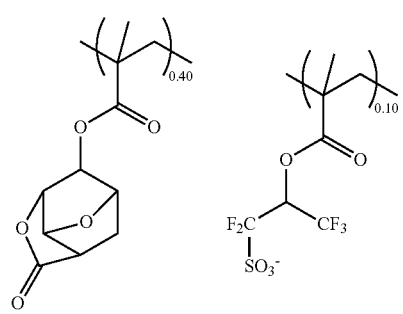

Mw = 7,600
Mw/Mn = 1.73

Polymer 10

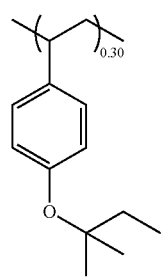

-continued

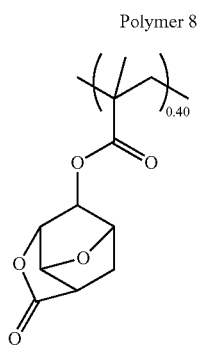

Mw = 5,500
Mw/Mn = 1.76

Polymer 11

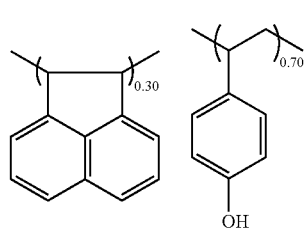

Mw = 4,500
Mw/Mn = 1.61

Examples and Comparative Examples

Positive or negative resist compositions were prepared by dissolving each of the polymers synthesized above and selected components in a solvent in accordance with the recipe shown in Tables 1 to 4, and filtering through a filter having a pore size of 0.2 μl. The solvent contained 100 ppm of a surfactant FC-4430 (3M-Sumitomo Co., Ltd.).

The components in Tables 1 to 4 are as identified below.

Polymers:
  Polymers 1 to 11 as identified above
Organic Solvents:
  propylene glycol monomethyl ether acetate (PGMEA)
  propylene glycol monomethyl ether (PGME)
  propylene glycol monoethyl ether (PGEE)
  cyclohexanone (CyH)
  cyclopentanone (CyH)
Acid Generators:
  PAG1 and PAG2

PAG 1

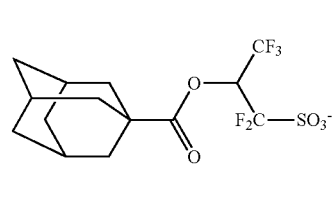

PAG 2

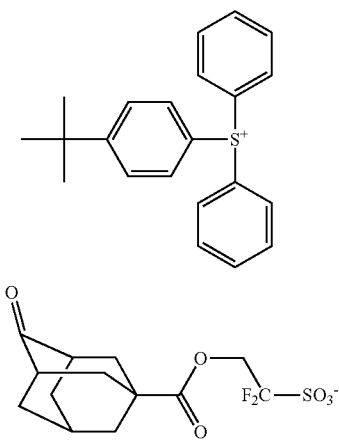

Basic Compounds:
  Amines 1 to 43 as identified above
  Comparative Amines 1 to 6 as identified below
  Sulfonium Salt Quencher as identified below Comparative Amine 1

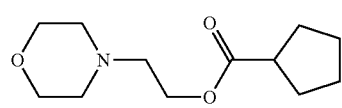

Comparative Amine 2

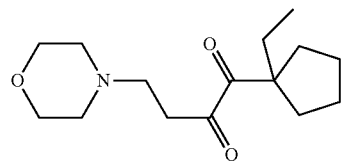

Comparative Amine 3

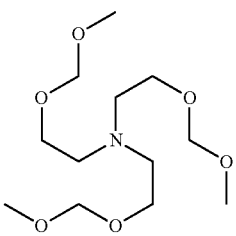

Comparative Amine 4

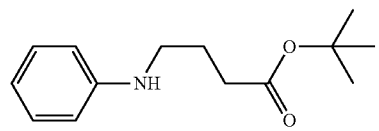

Comparative Amine 5

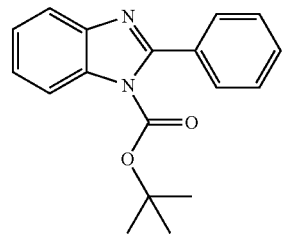

Comparative Amine 6

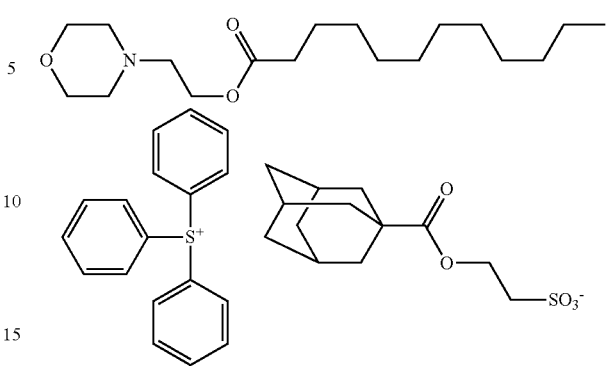

Sulfonium Salt Quencher

Water-Repellent Polymer:

Water-repellent polymer 1

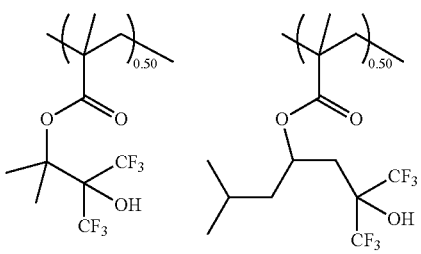

Mw = 8,900
Mw/Mn = 1.96

Crosslinker:

Crosslinker 1

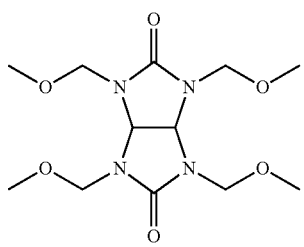

ArF Immersion Lithography Patterning test 1

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, each of the resist compositions in Tables 1 to 4 was spin coated, then baked on a hot plate at 100° C. for 60 seconds to form a resist film of 80 nm thick.

Using an ArF excimer laser immersion lithography scanner NSR-S610C (Nikon Corp., NA 1.30, a 0.98/0.78, 35° cross-pole illumination, azimuthally polarized illumination), the resist film was exposed through a 6% halftone phase shift mask bearing a pattern having a space of 70 nm and a pitch of 200 nm (on-wafer size) while varying the exposure dose and focus. The resist film was baked (PEB) at the temperature shown in Tables 1 to 4 for 60 seconds and then developed for 30 seconds with a 2.38 wt % TMAH aqueous solution, yielding a trench pattern having a space of 60 nm and a pitch of 200 nm.

Pattern size was measured by SEM CG-4000. As exposure was done in a varying dose, a sensitivity was determined as the exposure dose which produced a trench size of 60 nm. As exposure was done at a varying focus, a focus margin was determined as a depth of focus (DOF) where the trench size fell in the range of 55 to 65 nm.

The results are shown in Tables 1 to 4.

TABLE 1

| | | Polymer (pbw) | Acid generator (pbw) | Base (pbw) | Water-repellent polymer (pbw) | Organic solvent (pbw) | PEB temp. (° C.) | Sensitivity (mJ/cm$^2$) | DOF (nm) |
|---|---|---|---|---|---|---|---|---|---|
| Example | 1-1 | Polymer 1 (100) | PAG1 (10.0) | Amine 1 (2.75) | Water-repellent polymer 1 (4.0) | PGMEA(2,000) CyH(500) | 100 | 30 | 165 |
| | 1-2 | Polymer 1 (100) | PAG1 (10.0) | Amine 2 (3.05) | Water-repellent polymer 1 (4.0) | PGMEA(2,000) CyH(500) | 100 | 35 | 150 |
| | 1-3 | Polymer 1 (100) | PAG1 (10.0) | Amine 3 (2.89) | Water-repellent polymer 1 (4.0) | PGMEA(2,000) PGKE(500) | 100 | 37 | 155 |
| | 1-4 | Polymer 1 (100) | PAG1 (10.0) | Amine 4 (2.61) | Water-repellent polymer 1 (4.0) | PGMEA(2,000) CyH(500) | 100 | 38 | 145 |
| | 1-5 | Polymer 1 (100) | PAG1 (10.0) | Amine 5 (3.41) | Water-repellent polymer 1 (4.0) | PGMEA(2,000) PGEE(500) | 100 | 30 | 155 |
| | 1-6 | Polymer 1 (100) | PAG1 (10.0) | Amine 6 (2.89) | Water-repellent polymer 1 (4.0) | PGMEA(2,000) CyH(500) | 100 | 35 | 155 |
| | 1-7 | Polymer 1 (100) | PAG1 (10.0) | Amine 7 (2.42) | Water-repellent polymer 1 (4.0) | PGMEA(2,000) CyH(500) | 100 | 32 | 155 |
| | 1-8 | Polymer 1 (100) | PAG1 (10.0) | Amine 8 (3.31) | Water-repellent polymer 1 (4.0) | PGMEA(2,000) CyH(500) | 100 | 30 | 155 |
| | 1-9 | Polymer 1 (100) | PAG1 (10.0) | Amine 9 (2.23) | Water-repellent polymer 1 (4.0) | PGMEA(2,000) CyH(500) | 100 | 30 | 155 |
| | 1-10 | Polymer 1 (100) | PAG1 (10.0) | Amine 10 (3.69) | Water-repellent polymer 1 (4.0) | PGMEA(2,000) CyH(500) | 100 | 32 | 155 |
| | 1-11 | Polymer 1 (100) | PAG1 (10.0) | Amine 11 (2.93) | Water-repellent polymer 1 (4.0) | PGMEA(2,000) CyH(500) | 100 | 35 | 155 |
| | 1-12 | Polymer 1 (100) | PAG1 (10.0) | Amine 12 (2.53) | Water-repellent polymer 1 (4.0) | PGMEA(2,000) CyH(500) | 100 | 32 | 155 |
| | 1-13 | Polymer 1 (100) | PAG1 (10.0) | Amine 13 (2.80) | Water-repellent polymer 1 (4.0) | PGMEA(2,000) CyH(500) | 100 | 28 | 155 |
| | 1-14 | Polymer 1 (100) | PAG1 (10.0) | Amine 14 (3.75) | Water-repellent polymer 1 (4.0) | PGMEA(2,000) CyH(500) | 100 | 30 | 156 |
| | 1-15 | Polymer 1 (100) | PAG1 (10.0) | Amine 15 (2.89) | Water-repellent polymer 1 (4.0) | PGMEA(2,000) CyH(500) | 100 | 34 | 155 |
| | 1-16 | Polymer 1 (100) | PAG1 (10.0) | Amine 16 (2.90) | Water-repellent polymer 1 (4.0) | PGMEA(2,000) CyH(500) | 100 | 35 | 155 |
| | 1-17 | Polymer 1 (100) | PAG1 (10.0) | Amine 17 (3.27) | Water-repellent polymer 1 (4.0) | PGMEA(2,000) CyH(500) | 100 | 32 | 155 |
| | 1-18 | Polymer 1 (100) | PAG1 (10.0) | Amine 18 (3.45) | Water-repellent polymer 1 (4.0) | PGMEA(2,000) CyH(500) | 100 | 34 | 155 |
| | 1-19 | Polymer 1 (100) | PAG1 (10.0) | Amine 19 (3.41) | Water-repellent polymer 1 (4.0) | PGMEA(2,000) PGKE(500) | 100 | 31 | 155 |
| | 1-20 | Polymer 1 (100) | PAG1 (10.0) | Amine 20 (3.41) | Water-repellent polymer 1 (4.0) | PGMEA(2,000) PGEE(500) | 100 | 28 | 155 |

TABLE 2

|  |  | Polymer (pbw) | Acid generator (pbw) | Base (pbw) | Water-repellent polymer (pbw) | Organic solvent (pbw) | PEB temp. (° C.) | Sensitivity (mJ/cm$^2$) | DOF (nm) |
|---|---|---|---|---|---|---|---|---|---|
| Example | 1-21 | Polymer 2 (100) | — | Amine 2 (3.05) | Water-repellent polymer 1 (4.0) | PGMEA(2,000) CyH(500) | 95 | 33 | 160 |
|  | 1-22 | Polymer 3 (100) | PAG1 (10.0) | Amine 2 (3.05) | Water-repellent polymer 1 (4.0) | PGMEA(2,000) CyH(500) | 95 | 32 | 160 |
|  | 1-23 | Polymer 4 (100) | PAG1 (10.0) | Amine 2 (3.05) | Water-repellent polymer 1 (4.0) | PGMEA(2,000) CyH(500) | 100 | 29 | 145 |
|  | 1-24 | Polymer 5 (100) | — | Amine 2 (3.05) | Water-repellent polymer 1 (4.0) | PGMEA(2,000) CyH(500) | 90 | 34 | 165 |
|  | 1-25 | Polymer 6 (100) | PAG2 (10.0) | Amine 2 (3.05) | Water-repellent polymer 1 (4.0) | CyP(1,500) CyH(1,500) | 105 | 28 | 155 |
|  | 1-26 | Polymer 7 (100) | — | Amine 2 (3.05) | Water-repellent polymer 1 (4.0) | PGMEA(2,000) CyH(500) | 90 | 31 | 160 |
|  | 1-27 | Polymer 8 (100) | PAG2 (10.0) | Amine 11 (2.93) | Water-repellent polymer 1 (4.0) | PGMEA(2,000) CyH(500) | 100 | 33 | 160 |
|  | 1-28 | Polymer 7 (100) | — | Amine 15 (1.75) Sulfonium salt quencher (5.0) | Water-repellent polymer 1 (4.0) | PGMEA(2,000) CyH(500) | 100 | 36 | 150 |
|  | 1-29 | Polymer 7 (100) | — | Amine 15 (1.75) Comparative Amine 4 (1.50) | Water-repellent polymer 1 (4.0) | PGMEA(2,000) CyH(500) | 100 | 32 | 150 |
|  | 1-30 | Polymer 7 (100) | — | Amine 15 (1.75) Comparative Amine 5 (1.56) | Water-repellent polymer 1 (4.0) | PGMEA(2,000) CyH(500) | 100 | 36 | 145 |
|  | 1-31 | Polymer 1 (100) | PAG2 (10.0) | Amine 21 (3.68) | Water-repellent polymer 1 (4.0) | PGMEA(2,000) CyH(500) | 100 | 29 | 155 |
|  | 1-32 | Polymer 1 (100) | PAG2 (10.0) | Amine 22 (3.92) | Water-repellent polymer 1 (4.0) | PGMEA(2,000) CyH(500) | 100 | 31 | 150 |
|  | 1-33 | Polymer 1 (100) | PAG2 (10.0) | Amine 23 (4.16) | Water-repellent polymer 1 (4.0) | PGMEA(2,000) CyH(500) | 100 | 30 | 155 |
|  | 1-34 | Polymer 1 (100) | PAG2 (10.0) | Amine 24 (2.93) | Water-repellent polymer 1 (4.0) | PGMEA(2,000) CyH(500) | 100 | 28 | 160 |
|  | 1-35 | Polymer 1 (100) | PAG2 (10.0) | Amine 25 (3.68) | Water-repellent polymer 1 (4.0) | PGMEA(2,000) CyH(500) | 100 | 27 | 160 |
|  | 1-36 | Polymer 1 (100) | PAG2 (10.0) | Amine 26 (3.68) | Water-repellent polymer 1 (4.0) | PGMEA(2,000) CyH(500) | 100 | 26 | 160 |
|  | 1-37 | Polymer 1 (100) | PAG2 (10.0) | Amine 27 (3.92) | Water-repellent polymer 1 (4.0) | PGMEA(2,000) CyH(500) | 100 | 24 | 155 |
|  | 1-38 | Polymer 1 (100) | PAG2 (10.0) | Amine 28 (3.21) | Water-repellent polymer 1 (4.0) | PGMEA(2,000) CyH(500) | 100 | 29 | 155 |
|  | 1-39 | Polymer 1 (100) | PAG2 (10.0) | Amine 29 (3.45) | Water-repellent polymer 1 (4.0) | PGMEA(2,000) CyH(500) | 100 | 27 | 150 |
|  | 1-40 | Polymer 1 (100) | PAG2 (10.0) | Amine 30 (3.65) | Water-repellent polymer 1 (4.0) | PGMEA(2,000) CyH(500) | 100 | 30 | 155 |

TABLE 3

| | | Polymer (pbw) | Acid generator (pbw) | Base (pbw) | Water-repellent polymer (pbw) | Organic solvent (pbw) | PEB temp. (° C.) | Sensitivity (mJ/cm²) | DOF (nm) |
|---|---|---|---|---|---|---|---|---|---|
| Example | 1-41 | Polymer 1 (100) | PAG2 (10.0) | Amine 31 (3.61) | Water-repellent polymer 1 (4.0) | PGMEA(2,000) CyH(500) | 100 | 31 | 150 |
| | 1-42 | Polymer 1 (100) | PAG2 (10.0) | Amine 32 (3.41) | Water-repellent polymer 1 (4.0) | PGMEA(2,000) CyH(500) | 100 | 30 | 155 |
| | 1-43 | Polymer 1 (100) | PAG2 (10.0) | Amine 33 (3.38) | Water-repellent polymer 1 (4.0) | PGMEA(2,000) CyH(500) | 100 | 31 | 150 |
| | 1-44 | Polymer 1 (100) | PAG3 (10.0) | Amine 34 (4.26) | Water-repellent polymer 1 (4.0) | PGMEA(2,000) CyH(500) | 100 | 35 | 155 |
| | 1-45 | Polymer 1 (100) | PAG2 (10.0) | Amine 35 (2.93) | Water-repellent polymer 1 (4.0) | PGMEA(2,000) CyH(500) | 100 | 32 | 155 |
| | 1-46 | Polymer 1 (100) | PAG2 (10.0) | Amine 36 (3.68) | Water-repellent polymer 1 (4.0) | PGMEA(2,000) CyH(500) | 100 | 35 | 155 |
| | 1-47 | Polymer 1 (100) | PAG2 (10.0) | Amine 37 (3.92) | Water-repellent polymer 1 (4.0) | PGMEA(2,000) CyH(500) | 100 | 33 | 150 |
| | 1-48 | Polymer 1 (100) | PAG2 (10.0) | Amine 38 (4.16) | Water-repellent polymer 1 (4.0) | PGMEA(2,000) CyH(500) | 100 | 33 | 155 |
| | 1-49 | Polymer 1 (100) | PAG2 (10.0) | Amine 39 (2.93) | Water-repellent polymer 1 (4.0) | PGMEA(2,000) CyH(500) | 100 | 29 | 160 |
| | 1-50 | Polymer 1 (100) | PAG2 (10.0) | Amine 40 (3.68) | Water-repellent polymer 1 (4.0) | PGMEA(2,000) CyH(500) | 100 | 29 | 160 |
| | 1-51 | Polymer 1 (100) | PAG2 (10.0) | Amine 41 (3.68) | Water-repellent polymer 1 (4.0) | PGMEA(2,000) CyH(500) | 100 | 30 | 160 |
| | 1-52 | Polymer 1 (100) | PAG2 (10.0) | Amine 42 (3.92) | Water-repellent polymer 1 (4.0) | PGMEA(2,000) CyH(500) | 100 | 32 | 155 |
| | 1-53 | Polymer 1 (100) | PAG2 (10.0) | Amine 43 (3.21) | Water-repellent polymer 1 (4.0) | PGMEA(2,000) CyH(500) | 100 | 30 | 155 |

TABLE 4

| | | Polymer (pbw) | Acid generator (pbw) | Base (pbw) | Water-repellent polymer (pbw) | Organic solvent (pbw) | PEB temp. (° C.) | Sensitivity (mJ/cm²) | DOF (nm) |
|---|---|---|---|---|---|---|---|---|---|
| Comparative Example | 1-1 | Polymer 1 (100) | PAG1 (10.0) | Comparative Amine 1 (2.27) | Water-repellent polymer 1 (4.0) | PGMEA(2,000) CyH(500) | 100 | 48 | 100 |
| | 1-2 | Polymer 1 (100) | PAG1 (10.0) | Comparative Amine 2 (2.55) | Water-repellent polymer 1 (4.0) | PGMEA(2,000) CyH(500) | 100 | 45 | 105 |
| | 1-3 | Polymer 1 (100) | PAG1 (10.0) | Comparative Amine 3 (2.81) | Water-repellent polymer 1 (4.0) | PGMEA(2,000) CyH(500) | 100 | 48 | 100 |
| | 1-4 | Polymer 1 (100) | PAG1 (10.0) | Comparative Amine 4 (2.94) | Water-repellent polymer 1 (4.0) | PGMEA(2,000) CyH(500) | 100 | 38 | 130 |
| | 1-5 | Polymer 1 (100) | PAG1 (10.0) | Comparative Amine 5 (3.13) | Water-repellent polymer 1 (4.0) | PGMEA(2,000) CyH(500) | 100 | 47 | 95 |
| | 1-6 | Polymer 1 (100) | PAG1 (10.0) | Comparative Amine 6 (3.13) | Water-repellent polymer 1 (4.0) | PGMEA(2,000) CyH(500) | 100 | 49 | 90 |

ArF Immersion Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 5 was spin coated, then baked on a hot plate at 100° C. for 60 seconds to form a resist film of 80 nm thick.

Using an ArF excimer laser immersion lithography scanner NSR-610C (Nikon Corp., NA 1.30, a 0.98/0.78, cross-pole opening 20 deg., azimuthally polarized illumination), exposure was performed in a varying dose through a 6% halftone phase shift mask bearing a line-and-space pattern with a pitch of 100 nm and a width of 50 nm (on-wafer size). After the exposure, the wafer was baked (PEE) at the temperature shown in Table 5 for 60 seconds and developed. Specifically, butyl acetate was injected from a development nozzle while the wafer was spun at 30 rpm for 3 seconds, which was followed by stationary puddle development for 27 seconds. The wafer was rinsed with 4-methyl-2-pentanol, spin dried, and baked at 100° C. for 20 seconds to evaporate off the rinse liquid, yielding a negative pattern.

A trench pattern resulted from image reversal by solvent development. The size of trenches was measured under TDSEM CG-4000. A focus margin (DOF) and sensitivity were determined from those spaces having a size of 50±5 nm. The results are shown in Table 5.

at 110° C. for 60 seconds to form a resist film of BO nm thick. Using a system HL-800D (Hitachi Ltd.) at a HV voltage of 50 keV, the resist film was exposed imagewise to EB in a vacuum chamber.

Immediately after the image writing, the resist film was baked (PEB) on a hot plate at 90° C. for 60 seconds and developed in a 2.38 wt % TMAH aqueous solution for 30 seconds is to form a pattern.

In the case of positive resist film, the resolution is a minimum trench size at the exposure dose that provides a resolution as designed of a 120-nm trench pattern. In the case of negative resist film, the resolution is a minimum isolated line size at the exposure dose that provides a resolution as designed of a 120-nm isolated line pattern. It is noted that Examples 3-1 to 3-11 and Comparative Example 3-1 are positive resist compositions, and Example 3-12 and Comparative. Example 3-2 are negative resist compositions.

The results are shown in Table 6.

TABLE 5

|  |  | Polymer (pbw) | Acid generator (pbw) | Base (pbw) | Water-repellent polymer (pbw) | Organic solvent (pbw) | PEB temp. (° C.) | Sensitivity (mJ/cm$^2$) | DOF (nm) |
| --- | --- | --- | --- | --- | --- | --- | --- | --- | --- |
| Example | 2-1 | Polymer 8 (100) | PAG1 (10.0) | Amine 1 (3.05) | Water-repellent polymer 1 (4.0) | PGMEA(2,000) CyH(500) | 90 | 38 | 155 |
|  | 2-2 | Polymer 8 (100) | PAG1 (10.0) | Amine 2 (3.05) | Water-repellent polymer 1 (4.0) | PGMEA(2,000) CyH(500) | 90 | 37 | 155 |
|  | 2-3 | Polymer 8 (100) | PAG1 (10.0) | Amine 6 (3.05) | Water-repellent polymer 1 (4.0) | PGMEA(2,000) CyH(500) | 90 | 33 | 135 |
|  | 2-3 | Polymer 8 (100) | PAG2 (10.0) | Amine 7 (3.05) | Water-repellent polymer 1 (4.0) | PGMEA(2,000) CyH(500) | 90 | 40 | 160 |
|  | 2-4 | Polymer 8 (100) | PAG2 (10.0) | Amine 8 (3.05) | Water-repellent polymer 1 (4.0) | PGMEA(2,000) CyH(500) | 90 | 32 | 145 |
| Comparative Example | 2-1 | Polymer 8 (100) | PAG1 (10.0) | Comparative Amine 1 (2.27) | Water-repellent polymer 1 (4.0) | PGMEA(2,000) CyH(500) | 90 | 48 | 100 |

EB Writing Test

Each of the resist compositions in Table 6 was spin coated onto a silicon substrate, which had been vapor primed with hexamethyldisilazane (HMDS), and pre-baked on a hot plate

TABLE 6

|  |  | Polymer (pbw) | Acid generator/ crosslinker (pbw) | Base (pbw) | Organic solvent (pbw) | Sensitivity (μC/cm$^2$) | Resolution (nm) |
| --- | --- | --- | --- | --- | --- | --- | --- |
| Example | 3-1 | Polymer 9 (100) | — | Amine 1 (0.91) | PGMEA(400) CyH(2,000) PGME(100) | 28 | 80 |
|  | 3-2 | Polymer 9 (100) | — | Amine 2 (1.01) | PGMEA(400) CyH(2,000) PGME(100) | 30 | 80 |
|  | 3-3 | Polymer 9 (100) | — | Amine 3 (0.96) | PGMEA(400) CyH(2,000) PGME(100) | 30 | 80 |
|  | 3-4 | Polymer 9 (100) | — | Amine 4 (0.87) | PGMEA(400) CyH(2,000) PGME(100) | 28 | 85 |
|  | 3-5 | Polymer 9 (100) | — | Amine 5 (1.13) | PGMEA(400) CyH(2,000) PGME(100) | 27 | 80 |

TABLE 6-continued

|  |  | Polymer (pbw) | Acid generator/ crosslinker (pbw) | Base (pbw) | Organic solvent (pbw) | Sensitivity (μC/cm²) | Resolution (nm) |
|---|---|---|---|---|---|---|---|
|  | 3-6 | Polymer 9 (100) | — | Amine 6 (0.96) | PGMEA(400) CyH(2,000) PGME(100) | 29 | 80 |
|  | 3-7 | Polymer 9 (100) | — | Amine 7 (0.81) | PGMEA(400) CyH(2,000) PGME(100) | 30 | 80 |
|  | 3-8 | Polymer 9 (100) | — | Amine 8 (1.10) | PGMEA(400) CyH(2,000) PGME(100) | 33 | 75 |
|  | 3-9 | Polymer 9 (100) | — | Amine 11 (0.98) | PGMEA(400) CyH(2,000) PGME(100) | 27 | 75 |
|  | 3-10 | Polymer 9 (100) | — | Amine 16 (0.97) | PGMEA(400) CyH(2,000) PGME(100) | 26 | 80 |
|  | 3-11 | Polymer 10 (100) | — | Amine 11 (0.98) | PGMEA(400) CyH(1,600) CyP(500) | 32 | 80 |
|  | 3-12 | Polymer 11 (100) | PAG1(10.0) Crosslinker 1(8.0) | Amine 11 (0.98) | PGMEA(2,000) CyH(500) | 32 | 75 |
| Comparative Example | 3-1 | Polymer 9 (100) | — | Comparative Amine 1 (0.68) | PGMEA(400) CyH(2,000) PGME(100) | 38 | 90 |
|  | 3-2 | Polymer 11 (100) | PAG1(10.0) Crosslinker 1(6.0) | Comparative Amine 1 (0.68) | PGMEA(2,000) CyH(500) | 37 | 100 |

EUV Lithography Test

The resist composition shown in Table 7 was spin coated on a silicon substrate, which had been vapor primed with hexamethyldisilazane (HMDS), and prebaked on a hot plate at 110° C. for 60 seconds to form a resist film of 60 nm thick. EUV exposure to a hole pattern having a pitch of 60 nm and a hole size of 33 nm was performed by quadrupole illumination at NA 0.3 and σ 0.93/0.36. Immediately after the exposure, the resist film was baked (PEB) on a hot plate at the temperature shown in Table 7 for 60 seconds and developed with a 2.38 wt % TMAH aqueous solution for 30 seconds to form a pattern.

The size of 20 holes was measured, from which 3σ of size variation was calculated as CDU. The results are shown in Table 7.

TABLE 7

|  |  | Polymer (pbw) | Base (pbw) | Organic solvent (pbw) | PEB temperature (° C.) | Sensitivity (mJ/cm²) | CDU (nm) |
|---|---|---|---|---|---|---|---|
| Example | 4-1 | Polymer 9 (100) | Amine 1 (0.41) | PGMEA(400) CyH(2,000) PGME(100) | 90 | 36 | 7.2 |
|  | 4-2 | Polymer 9 (100) | Amine 18 (0.42) | PGMEA(400) CyH(2,000) PGME(100) | 90 | 38 | 7.2 |
|  | 4-3 | Polymer 9 (100) | Amine 40 (0.52) | PGMEA(400) CyH(2,000) PGME(100) | 90 | 40 | 7.0 |
|  | 4-4 | Polymer 9 (100) | Amine 41 (0.66) | PGMEA(400) CyH(2,000) PGME(100) | 90 | 41 | 6.0 |
|  | 4-5 | Polymer 9 (100) | Amine 42 (0.72) | PGMEA(400) CyH(2,000) PGME(100) | 90 | 43 | 6.5 |
| Comparative Example | 4-1 | Polymer 9 (100) | Comparative Amine 1 (0.68) | PGMEA(400) CyH(2,000) PGME(100) | 90 | 40 | 8.9 |
|  | 4-2 | Polymer 9 (100) | Sulfonium salt quencher (2.22) | PGMEA(400) CyH(2,000) PGME(100) | 90 | 40 | 9.3 |

It is demonstrated in Tables 1 to 7 that resist compositions comprising a specific amine compound form patterns of satisfactory profile having an improved resolution and focus margin (DOF), and especially holes of improved CD uniformity.

Japanese Patent Application No. 2012-202328 is incorporated herein by reference

Although some preferred embodiments have been described, many modifications and variations may be made thereto in light of the above teachings. It is therefore to be understood that the invention may be practiced otherwise

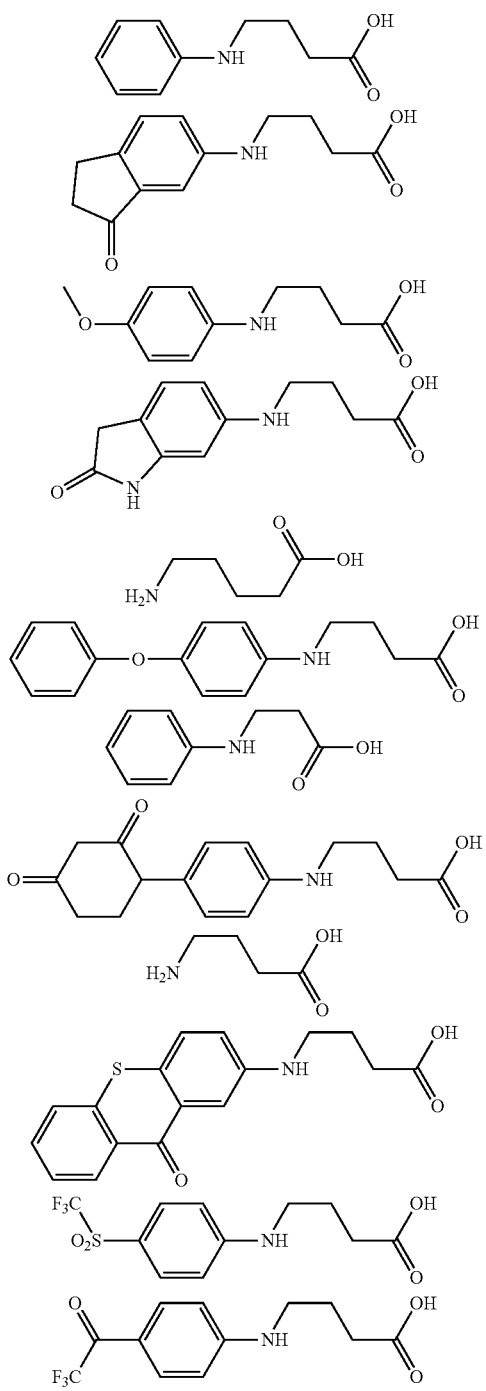

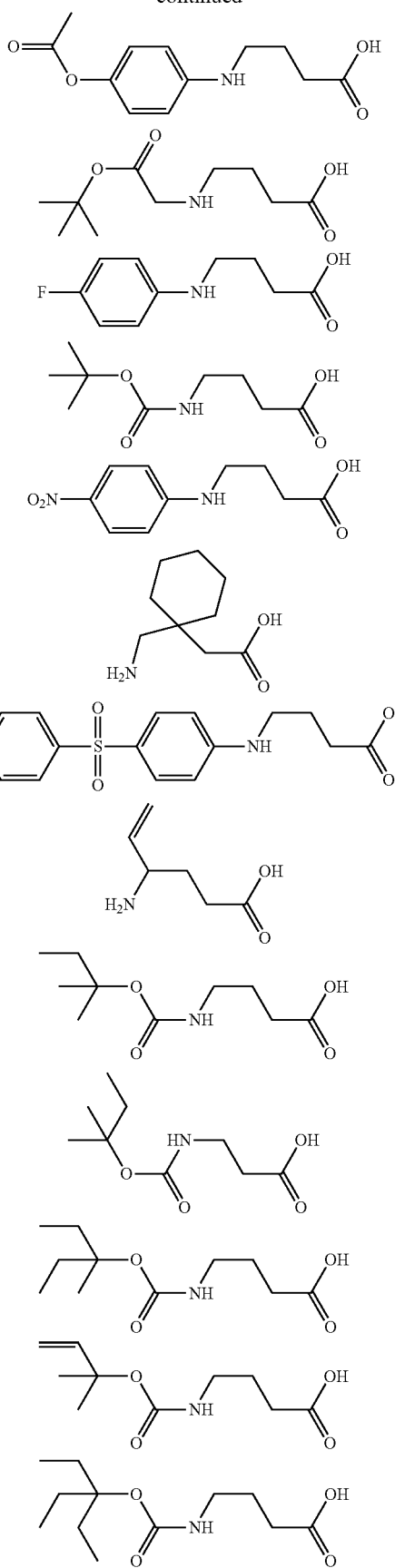

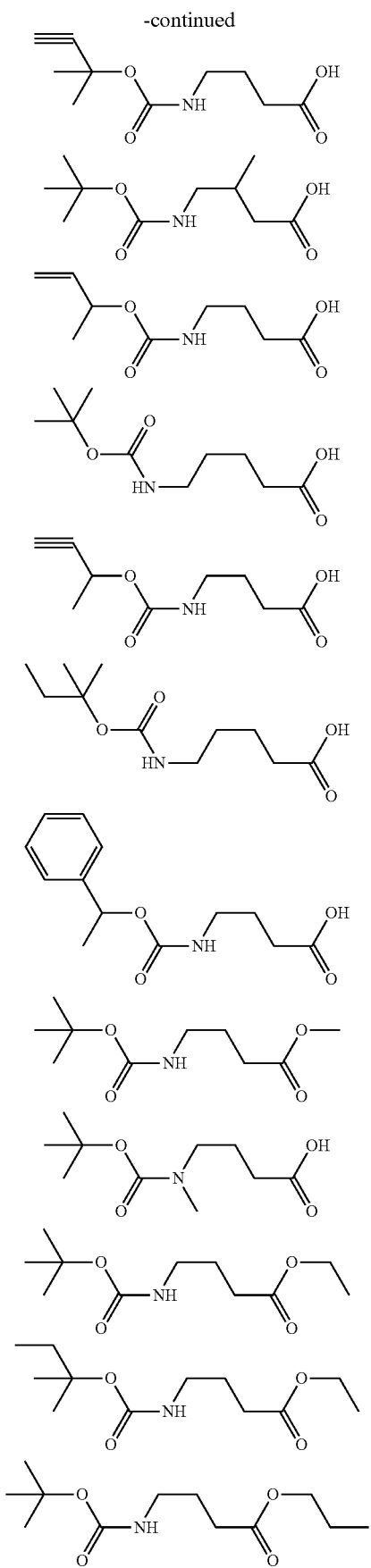
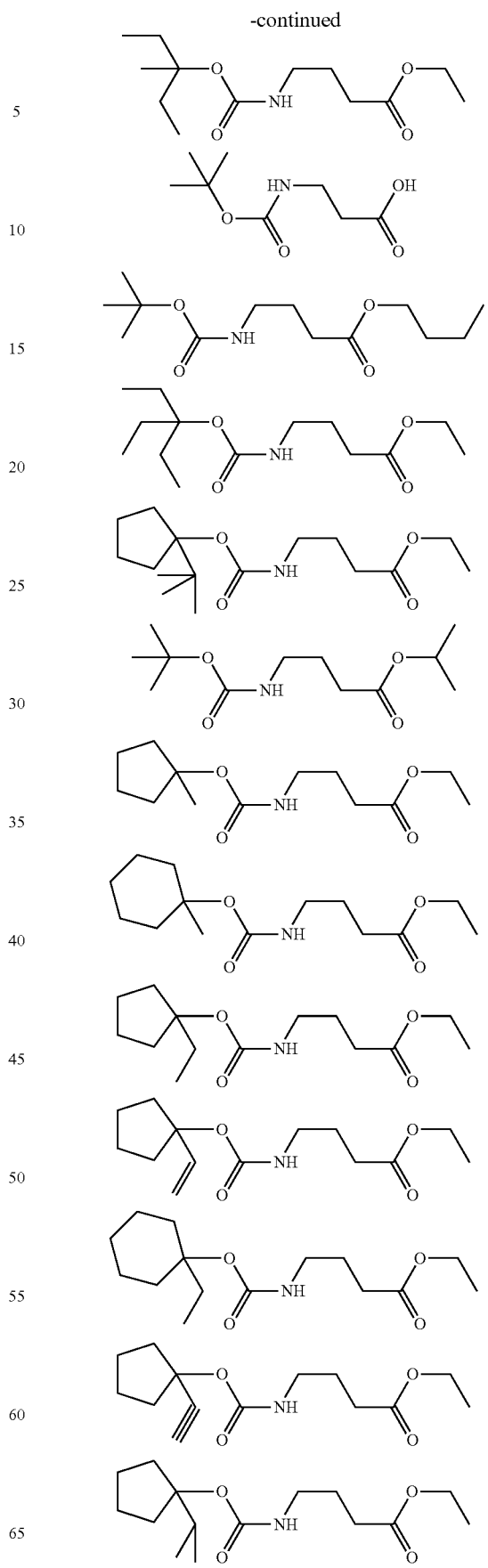

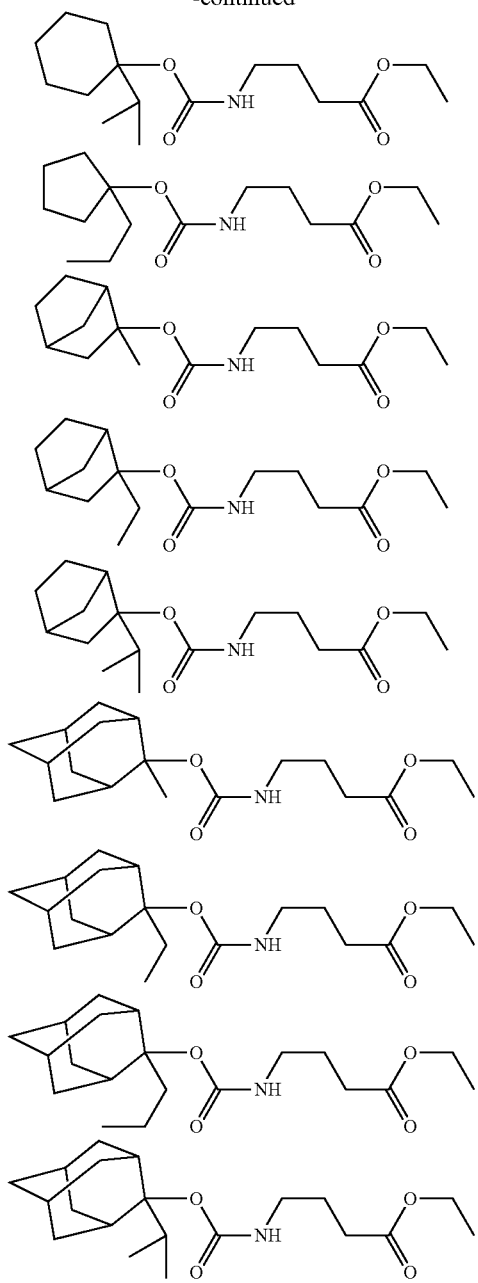
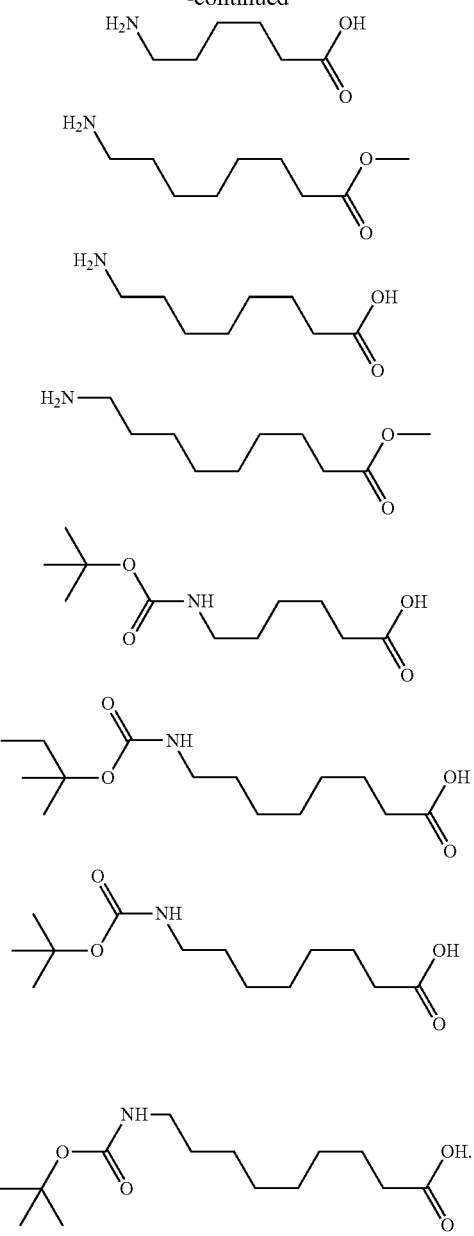

The invention claimed is:

1. A chemically amplified resist composition comprising a base polymer and a basic compound of the general formula (1):

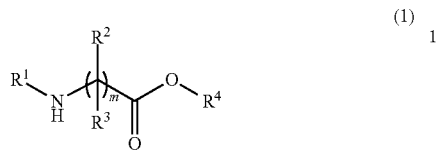

wherein $R^1$ is hydrogen, or a straight, branched or cyclic $C_1$-$C_{30}$ alkyl, $C_6$-$C_{30}$ aryl, $C_7$-$C_{30}$ aralkyl, $C_2$-$C_{30}$ alkenyl, $C_2$-$C_{10}$ alkynyl, or $C_4$-$C_{12}$ heterocyclic-bearing group, or a combination of such groups, which group may contain a hydroxyl, mercapto, carboxyl, ether, thio ether, ester, sulfonic acid ester, sulfonyl, lactone ring, carbonyl, cyano, nitro, halogen, trifluoromethyl, amide, imide, sulfonamide, carbonate, sulfide, —N=CR—O—, —N=CR—S—, or =N—O—N= moiety, or $R^1$ may be an acid labile group; R is hydrogen, mercapto, hydroxyl or $C_1$-$C_3$ alkyl, or may bond with the nitrogen atom in formula (1) to form a ring; $R^2$ and $R^3$ each are hydrogen, a straight or branched $C_1$-$C_4$ alkyl group or $C_2$-$C_4$ alkenyl group, or $R^2$ and $R^3$ may bond together to form a ring; $R^4$ is hydrogen or a straight, branched or cyclic $C_4$-$C_{10}$ alkyl group to form a primary or secondary ester group, the alkyl group being optionally substituted with fluorine; and m is an integer of 2 to 8.

2. The resist composition of claim 1 wherein the base polymer comprises recurring units (a1) derived from (meth) acrylate, styrenecarboxylic acid or vinylnaphthalenecarboxylic acid having an acid labile group substituted thereon, or recurring units (a2) derived from hydroxystyrene having an acid labile group substituted thereon, as represented by the general formula (2):

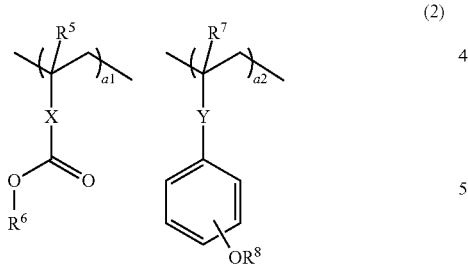

wherein $R^5$ and $R^7$ are each independently hydrogen or methyl, X is a single bond, a $C_1$-$C_{12}$ linking group having an ester moiety and/or lactone ring, phenylene group or naphthylene group, Y is a single bond or ester group, and $R^6$ and $R^8$ are each independently an acid labile group, the resist composition further comprising an organic solvent and being a chemically amplified positive resist composition.

3. The resist composition of claim 2, further comprising a dissolution inhibitor.

4. The resist composition of claim 1, further comprising an organic solvent, the composition being a chemically amplified negative resist composition.

5. The resist composition of claim 4, further comprising a crosslinker.

6. The resist composition of claim 1, further comprising an acid generator.

7. The resist composition of claim 2 wherein the base polymer has further copolymerized therein recurring units of at least one type selected from sulfonium salt units (f1) to (f3), as represented by the general formula (3):

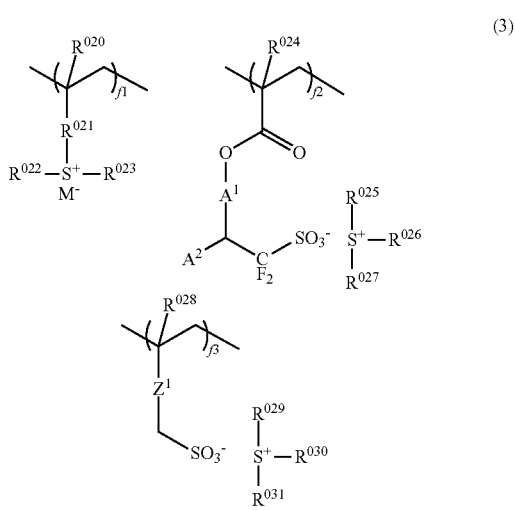

wherein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$-C(=O)—O—, -$A^0$-O— or -$A^0$-O—C(=O)—, $A^0$ is a straight, branched or cyclic $C_1$-$C_{12}$ alkylene group which may contain a carbonyl, ester or ether moiety, $A^2$ is hydrogen, $CF_3$ or carbonyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, $M^-$ is a non-nucleophilic counter ion, subscripts f1, f2 and f3 are numbers in the range: $0 \leq f1 \leq 0.3$, $0 \leq f2 \leq 0.3$, $0 \leq f3 \leq 0.3$, and $0 < f1+f2+f3 \leq 0.3$.

8. The resist composition of claim 1, further comprising a surfactant.

9. A process for forming a pattern comprising the steps of applying the resist composition of claim 1 onto a substrate, baking to form a resist film, exposing the resist film to high-energy radiation, and developing the exposed film with a developer.

10. The process of claim 9 wherein the high-energy radiation is ArF excimer laser radiation of 193 nm wavelength or KrF excimer laser radiation of 248 nm wavelength.

11. The process of claim 9 wherein the high-energy radiation is electron beam or extreme ultraviolet radiation of 3 to 15 nm wavelength.

12. The resist composition of claim 1 wherein $R^4$ in formula (1) is hydrogen, methyl, ethyl, n-propyl, isopropyl, n-butyl, isobutyl, sec-butyl, n-pentyl, cyclopentyl, or cyclohexyl.

13. The resist composition of claim 1 wherein the basic compound of formula (1) is at least one selected from the group consisting of compounds having the following formulae: